US011234023B2

(12) United States Patent
Gladding et al.

(10) Patent No.: US 11,234,023 B2
(45) Date of Patent: Jan. 25, 2022

(54) FEATURES OF RANGE ASYMMETRIC NUMBER SYSTEM ENCODING AND DECODING

(71) Applicant: Microsoft Technology Licensing, LLC, Redmond, WA (US)

(72) Inventors: Derek E. Gladding, Poughquag, NY (US); Sudharsan Gopalakrishnan, Milpitas, CA (US); Shaileshkumar D. Kumbhani, Milpitas, CA (US); Hsu-Kuei Lin, Mountain View, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/456,602

(22) Filed: Jun. 28, 2019

(65) Prior Publication Data
US 2020/0413106 A1 Dec. 31, 2020

(51) Int. Cl.
*H04N 19/91* (2014.01)
*H04N 19/124* (2014.01)
(Continued)

(52) U.S. Cl.
CPC .......... *H04N 19/91* (2014.11); *H04N 19/124* (2014.11); *H04N 19/176* (2014.11); *H04N 19/68* (2014.11); *H04N 19/98* (2014.11)

(58) Field of Classification Search
CPC ........ H04N 19/91; H04N 19/98; H04N 19/68; H04N 19/124; H04N 19/176
(Continued)

(56) References Cited

U.S. PATENT DOCUMENTS 7,095,343 B2 * 8/2006 Xie .................. H03M 7/30
341/106
9,941,900 B1 * 4/2018 Horn .................... G06N 3/0445
(Continued)

OTHER PUBLICATIONS

Duda, "Asymmetric Numeral Systems: Entropy Coding Combining Speed of Huffman Coding with Compression Rate of Arithmetic Coding," 24 pp. (2014).
(Continued)

*Primary Examiner* — Susan E. Hodges
(74) *Attorney, Agent, or Firm* — Klarquist Sparkman, LLP

(57) ABSTRACT

Innovations in range asymmetric number system ("RANS") coding and decoding are described herein. Some of the innovations relate to hardware implementations of RANS decoding that organize operations in two phases, which can improve the computational efficiency of RANS decoding. Other innovations relate to adapting RANS encoding/decoding for different distributions or patterns of values for symbols. For example, RANS encoding/decoding can adapt by switching a default symbol width (the number of bits per symbol), adjusting symbol width on a fragment-by-fragment basis for different fragments of symbols, switching between different static probability models on a fragment-by-fragment basis for different fragments of symbols, and/or selectively flushing (or retaining) the state of a RANS decoder on a fragment-by-fragment basis for different fragments of symbols. In many cases, such innovations can improve compression efficiency while also providing computationally efficient performance.

28 Claims, 24 Drawing Sheets

(51) Int. Cl.
*H04N 19/176* (2014.01)
*H04N 19/68* (2014.01)
*H04N 19/98* (2014.01)

(58) Field of Classification Search
USPC ........................................................ 375/240
See application file for complete search history.

(56) References Cited

U.S. PATENT DOCUMENTS

| | | | | |
|---|---|---|---|---|
| 10,681,388 B2* | 6/2020 | Covell | ................ | H04N 19/176 |
| 2014/0105282 A1* | 4/2014 | Chono | ................ | H04N 19/463 |
| | | | | 375/240.03 |
| 2015/0103902 A1* | 4/2015 | Li | ................ | H04N 19/42 |
| | | | | 375/240.12 |
| 2015/0349807 A1* | 12/2015 | Vernon | ............. | H03M 13/6577 |
| | | | | 714/774 |
| 2016/0248440 A1* | 8/2016 | Greenfield | ............. | H03M 7/30 |
| 2017/0164007 A1 | 6/2017 | Converse | | |

OTHER PUBLICATIONS

Duda et al., "The Use of Asymmetric Numeral Systems as an Accurate Replacement for Huffman Coding," *IEEE*, pp. 65-69 (2015).
Giesen, "rANS in practice," downloaded from the World Wide Web, 10 pp. (Dec. 2015).
Wikipedia, "Asymmetric Numeral Systems," downloaded from the World Wide Web, 8 pp., (May 29, 2019).
International Search Report and Written Opinion dated Aug. 3, 2020, from International Patent Application No. PCT/US2020/032397, 12 pp.

* cited by examiner

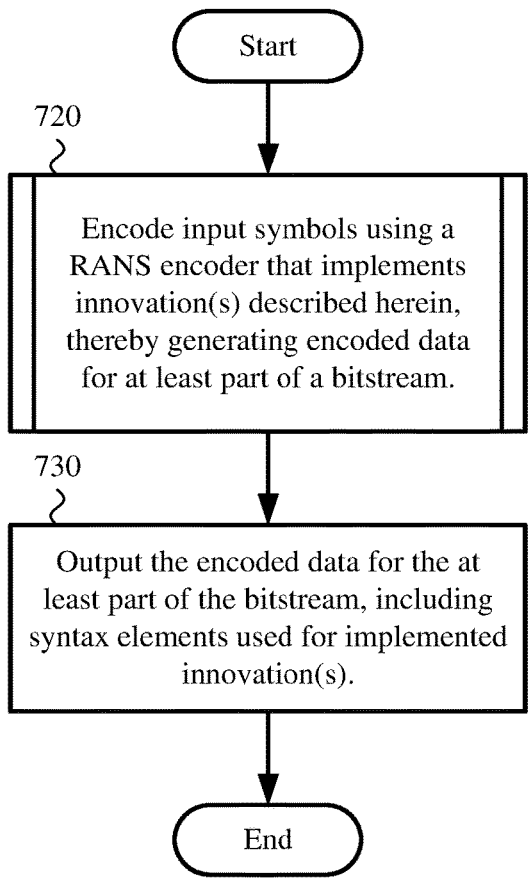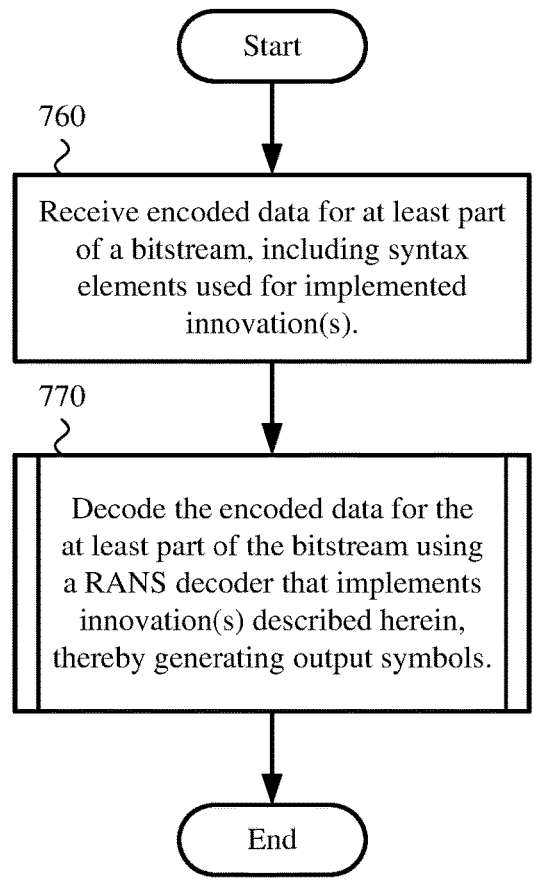

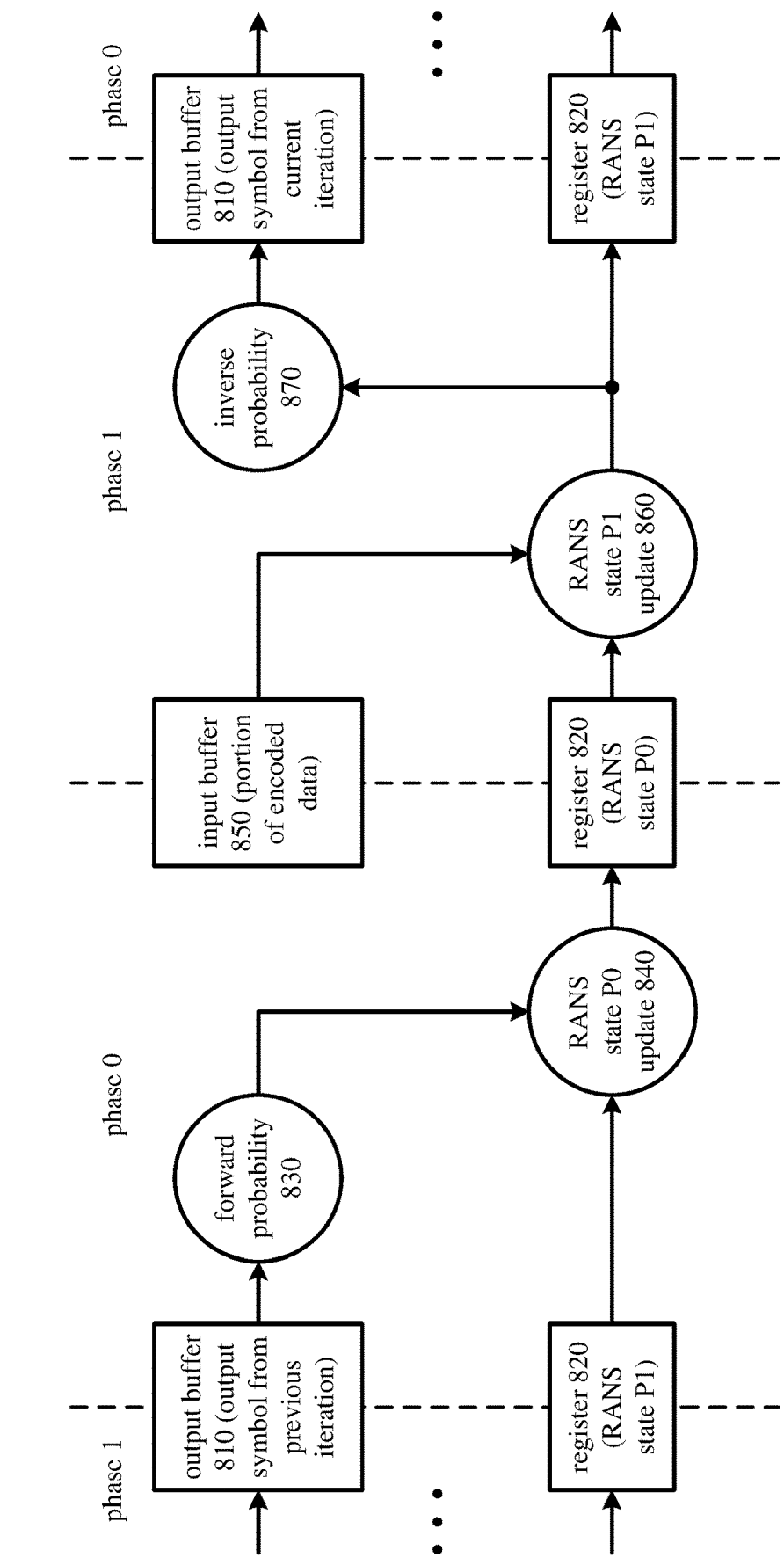

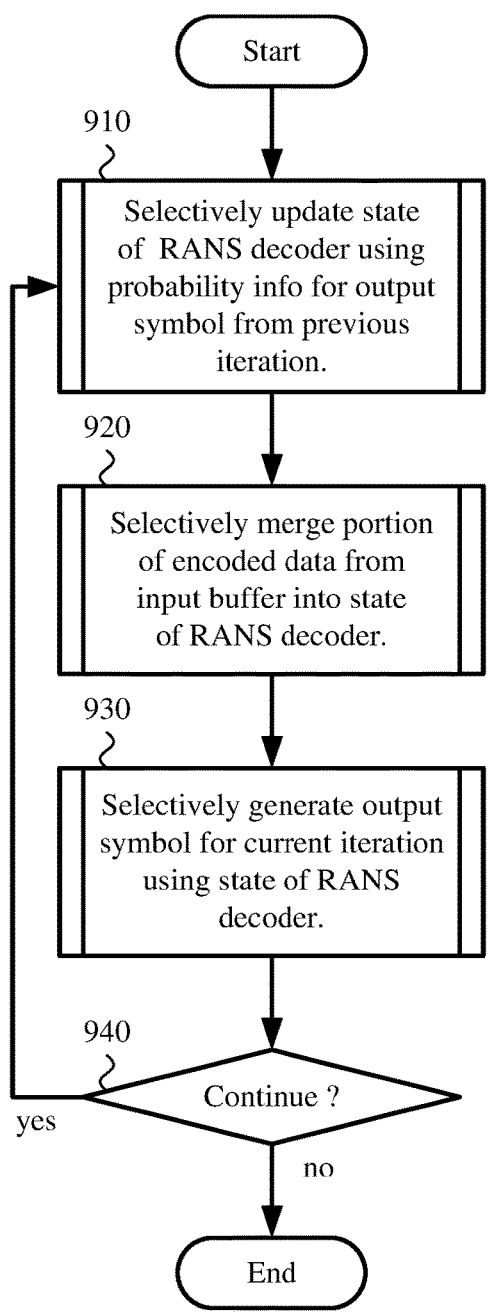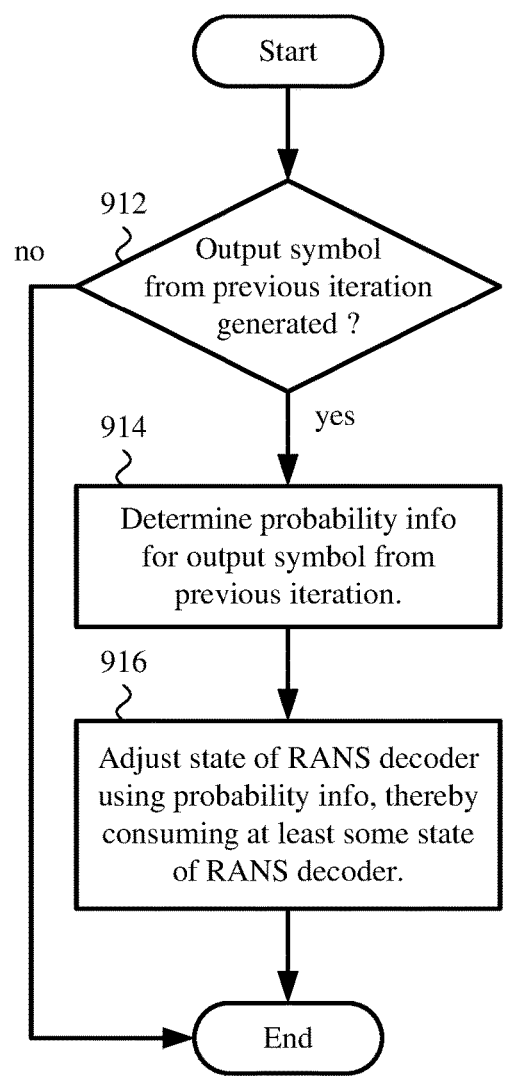

FIG. 9c  921 (example of operations in decoding stage 920)
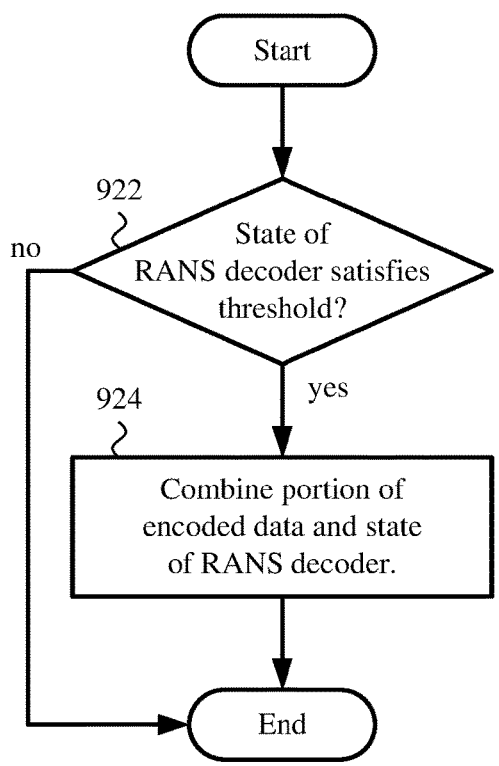
FIG. 9d  931 (example of operations in decoding stage 930)
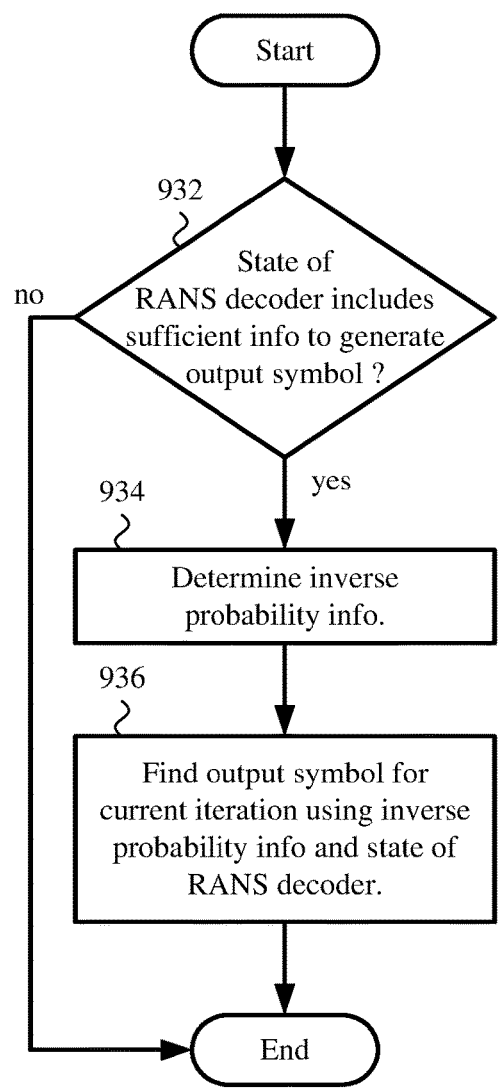

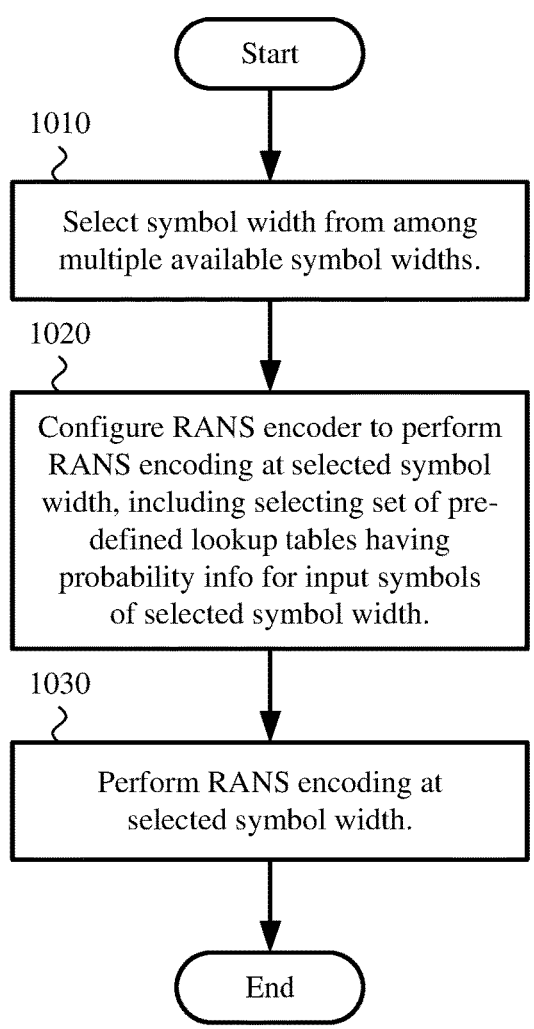
FIG. 10a  1000 (example of operations in encoding stage 720)
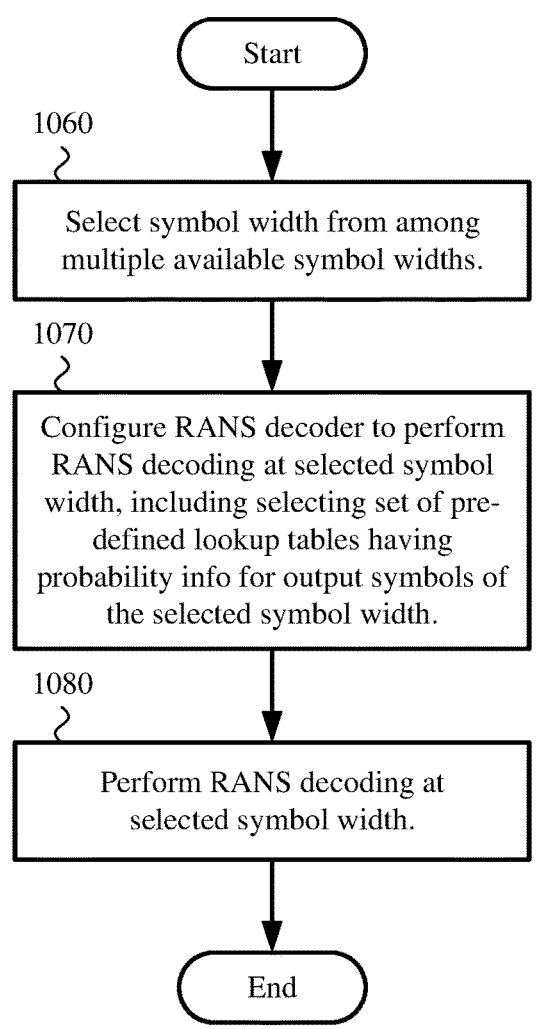
FIG. 10b  1050 (example of operations in decoding stage 770)

FIG. 11a — 1100 (example of operations in encoding stage 720)
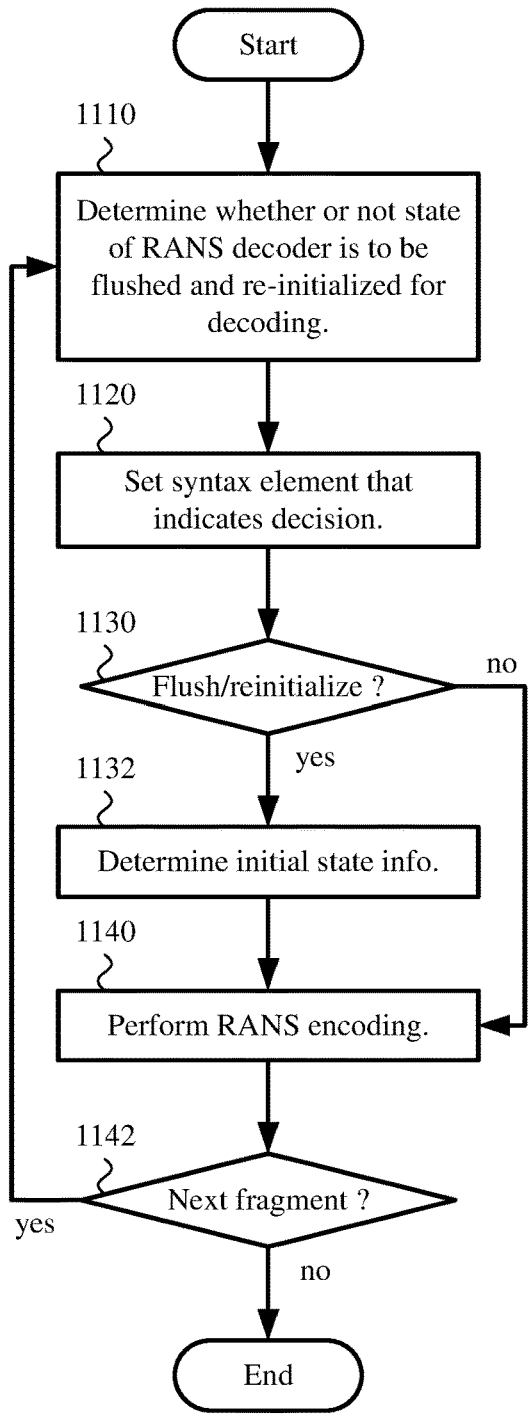
FIG. 11b — 1150 (example of operations in decoding stage 770)
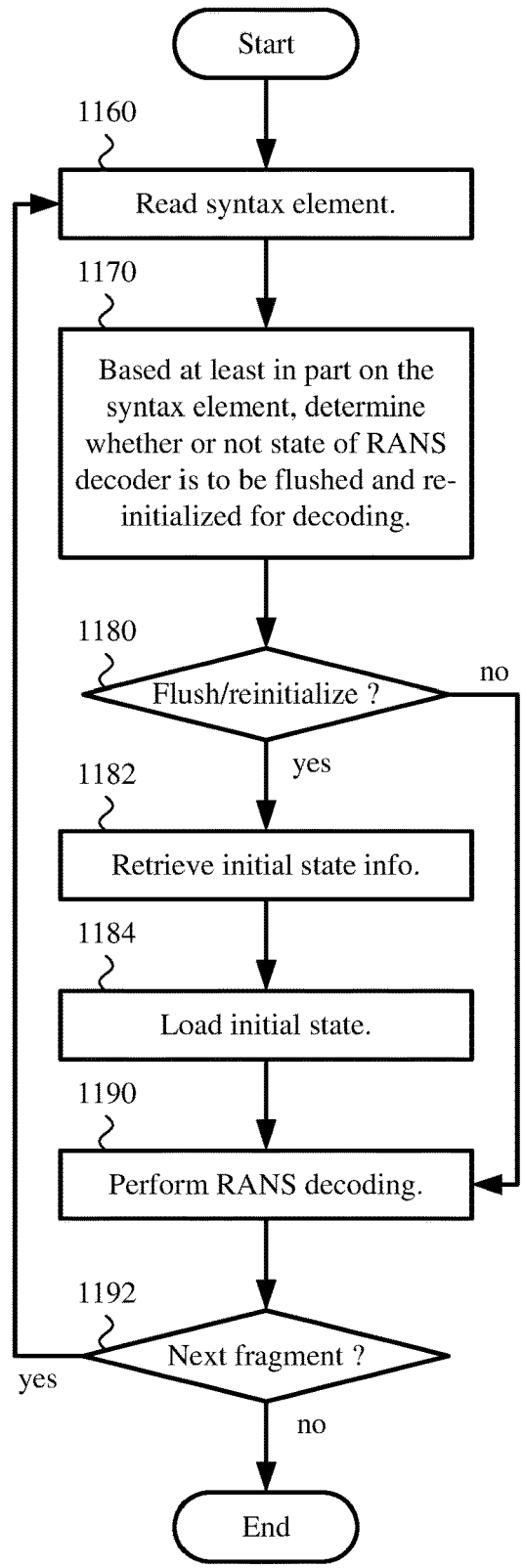

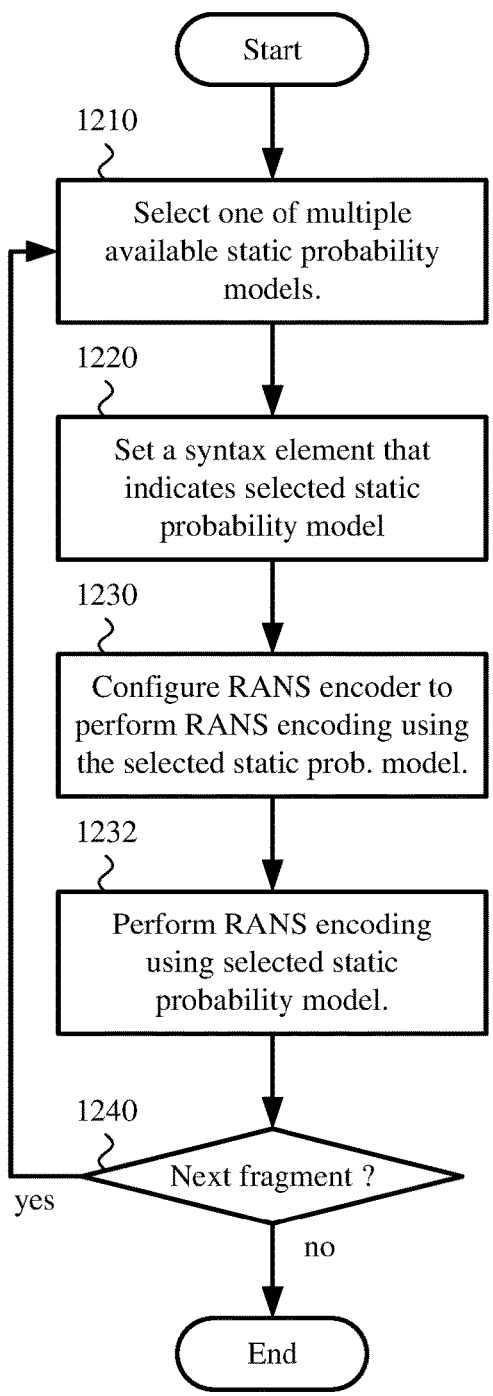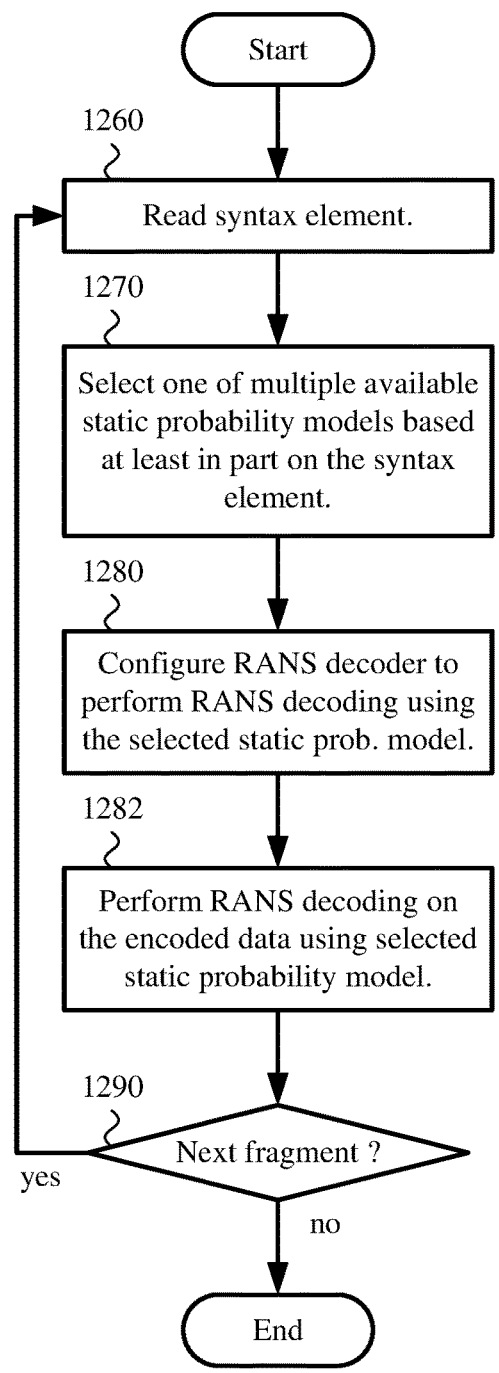
FIG. 12a — 1200 (example of operations in encoding stage 720)
FIG. 12b — 1250 (example of operations in decoding stage 770)

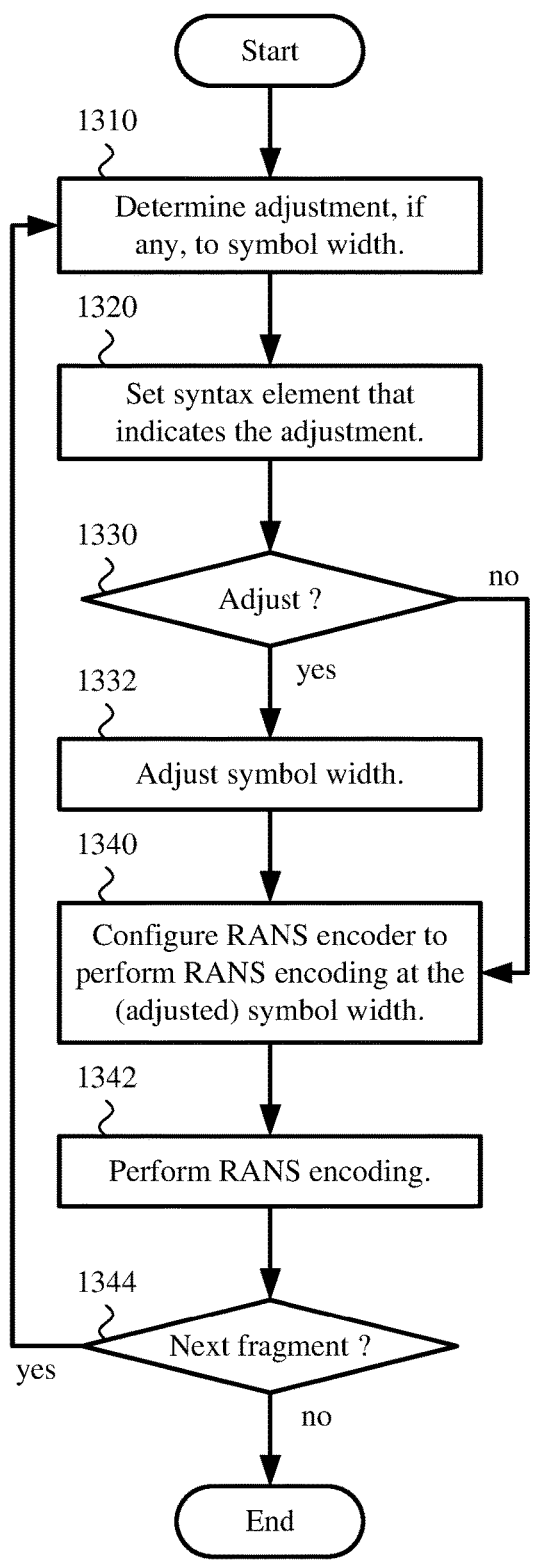
FIG. 13a  1300 (example of operations in encoding stage 720)
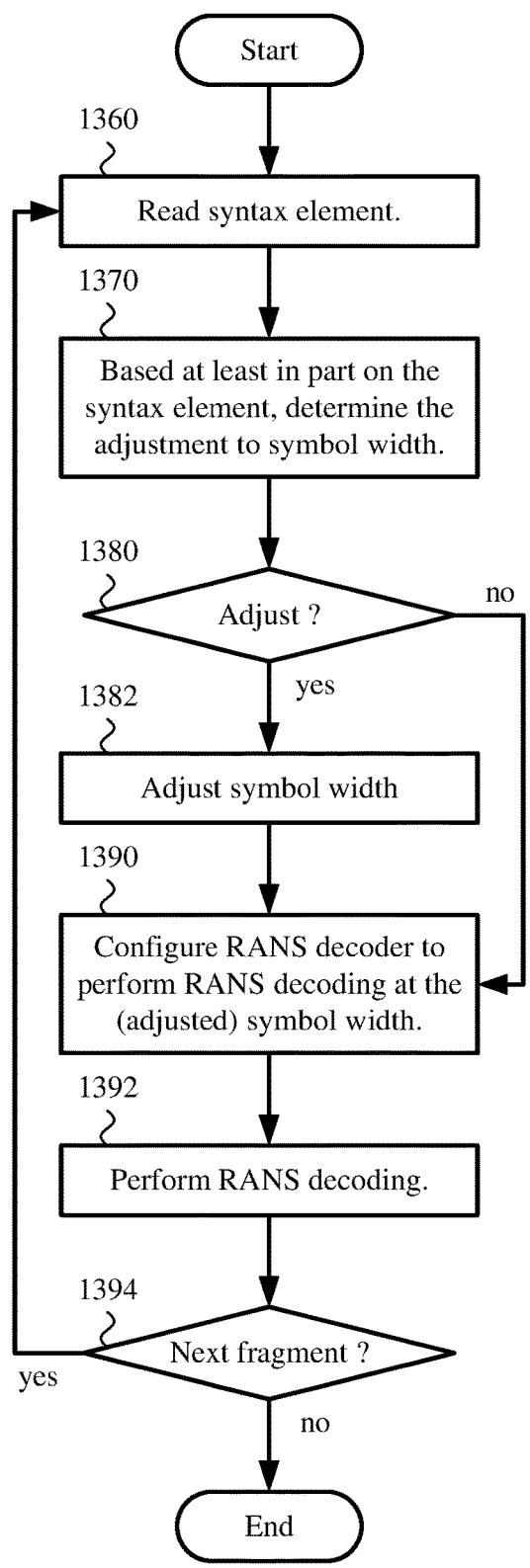
FIG. 13b  1350 (example of operations in decoding stage 770)

FIG. 15a   1501

```
`timescale 1ns / 1ps

// PHASE 1                                              PHASE 0
//
// decoder                                              decoder
//  - read from input buffer                             - compute forward distribution
//  - compute inverse distribution                       - update rANS state
//  - write symbol to output buffer if valid
//
// feeder                                               feeder
//                                                       - write to input buffer
//
// symbol vector assembly                               symbol vector assembly
//  - output complete symvec                             - transfer symbol from decoder output buffer to symvec buffer
//
// STALLING
//
// stall (P0 then P1) if:
//  - feeder input starved
//  - symvec buffer full and downstream not ready `include "mdu_defines.vh"

module decoder(

// control / config
    input                                       clk,
    input                                       nrst,
    input  [3:0]                                alphabet_bits,
    input                                       go,
    input  [31:0]                               out_target,
    input                                       array_stall,
    output reg                                  done,
    output reg                                  error_overrun, // interface to feeder
    input                                       din_valid,
    input  [`MDU_COMPRESSED_ITEM_WIDTH-1:0]     din,
    output                                      din_ready,
    output                                      din_req,
```

FIG. 15b  1502

```verilog
    // interface to downstream
    output                              sym_valid,
    output reg [`MDU_RANS_SYMOUT_W-1:0] sym,
    input                               sym_ready
);

reg [3:0]  eab; // effective alphabet bits (i.e. # of bits in alphabet - # of msbs
                // guaranteed to be zero)
reg [3:0]  current_q;

wire [`MDU_RANS_PROB_BITS-1:0] base_table[9][16][10];
[assignment of values to base_table omitted for brevity]
wire [(`MDU_RANS_PROB_BITS)-1:0] base_table_sel1[16][10];
assign base_table_sel1 = base_table[eab];
reg [(`MDU_RANS_PROB_BITS)-1:0]  base_table_sel2[10];

wire [`MDU_RANS_PROB_BITS-1:0] freq_table[9][16][10];
[assignment of values to base_table omitted for brevity]
wire [(`MDU_RANS_PROB_BITS)-1:0] freq_table_sel1[16][10];
assign freq_table_sel1 = freq_table[eab];
reg [(`MDU_RANS_PROB_BITS)-1:0]  freq_table_sel2[10];

wire [`MDU_RANS_PROB_BITS-1:0] rf_table[9][16][10];
[assignment of values to rf_table omitted for brevity]
wire [`MDU_RANS_PROB_BITS-1:0]   rf_table_sel1[16][10];
assign rf_table_sel1 = rf_table[eab];
reg [`MDU_RANS_PROB_BITS-1:0]    rf_table_sel2[10];

wire [4:0] rs_table[9][16][10];
[assignment of values to rs_table omitted for brevity]
wire [4:0]                       rs_table_sel1[16][10];
assign rs_table_sel1 = rs_table[eab];
reg  [4:0]                       rs_table_sel2[10];

wire rn_table[9][16][10];
[assignment of values to rn_table omitted for brevity]
wire                             rn_table_sel1[16][10];
assign rn_table_sel1 = rn_table[eab];
reg                              rn_table_sel2[10];
```

FIG. 15c  1503

```
// state
localparam [2:0] /* synopsys enum ctrl_state */
                 DSTATE_IDLE       = 3'd0,   // idle state, needs kickoff
                 DSTATE_HDR0       = 3'd1,   // waiting for header byte 0
                 DSTATE_HDR1       = 3'd2,   // waiting for header byte 1
                 DSTATE_HDR2       = 3'd3,   // waiting for header byte 2
                 DSTATE_PROCESSING = 3'd4,   // main processing state, reading input and generating output
                 DSTATE_DRAINING   = 3'd5;   // done with input, still generating output
reg [2:0] /* synopsys enum ctrl_state */ ctrl_state;

reg phase;
reg [7:0] input_buf;
reg input_buf_full;
reg sym_buf_full;
reg [`MDU_MAX_INPUT_LOG2-1:0] input_remaining;
reg [31:0] output_remaining;
reg [31:0] rans_state_p0;
reg [31:0] rans_state_p1;
reg hdr3; // 3 byte header if set
reg flush_per_frag;

// Phase 1: rans state modified by input
wire want_to_feed_rans = (rans_state_p0 < `MDU_RANS_LOWER_LIMIT) && (input_remaining > 0); // we want to read input
                                            from the input buffer into the rans decoder
wire will_feed_rans = want_to_feed_rans && input_buf_full;
wire [31:0] rans_state_with_input = will_feed_rans ? {rans_state_p0[23:0], input_buf} : rans_state_p0;
wire [`MDU_MAX_INPUT_LOG2-1:0] new_input_remaining = will_feed_rans ? input_remaining - 1 : input_remaining;

wire need_ib_load = !input_buf_full && ((ctrl_state == DSTATE_HDR0) || (ctrl_state == DSTATE_HDR1) || (ctrl_state ==
DSTATE_HDR2) || ((ctrl_state == DSTATE_PROCESSING) && (input_remaining > {18'b0,input_buf_full})));

// Stall detect
wire blocked_on_output = (sym_buf_full && !sym_ready);
wire blocked_on_input = (need_ib_load && !din_valid);
wire stall_p0 = array_stall || blocked_on_input || blocked_on_output;
reg stall_p1;
always @(posedge clk or negedge nrst) begin
    if(!nrst)   stall_p1 <= 0;
    else        stall_p1 <= stall_p0;
end
```

```verilog
// Input buffer
assign din_req = need_ib_load && (phase == 0) && !blocked_on_output;
assign din_ready = din_req && !array_stall;

wire [1:0] hdr0_z_field = input_buf[7:6];
wire [3:0] hdr0_q_field = input_buf[3:0];
wire [3:0] eab_unclamped = alphabet_bits - {2'b0,hdr0_z_field};
wire [3:0] eab_clamped = eab_unclamped < 10 ? eab_unclamped : 9;

// Phase 1: inverse distribution
wire [`MDU_RANS_PROB_BITS-1:0] cf_in = rans_state_with_input[`MDU_RANS_PROB_BITS-1:0];

genvar n;
reg [3:0] inv_seg;
reg [`MDU_RANS_SYMOUT_W-1:0] inv_base_x;
reg [15:0] dist_x;

always_comb begin
    if((cf_in >= base_table_sel2[09]) & (eab >= 8)) begin
        inv_seg    = 'd09;
        inv_base_x = (1 << ('d09 - 'd1));
        dist_x     = (cf_in - base_table_sel2[09]) + rn_table_sel2[09];
    end else if((cf_in >= base_table_sel2[08]) & (eab >= 7)) begin
        inv_seg    = 'd08;
        inv_base_x = (1 << ('d08 - 'd1));
        dist_x     = (cf_in - base_table_sel2[08]) + rn_table_sel2[08];
    end else if((cf_in >= base_table_sel2[07]) & (eab >= 6)) begin
        inv_seg    = 'd07;
        inv_base_x = (1 << ('d07 - 'd1));
        dist_x     = (cf_in - base_table_sel2[07]) + rn_table_sel2[07];
    end else if((cf_in >= base_table_sel2[06]) & (eab >= 5)) begin
        inv_seg    = 'd06;
        inv_base_x = (1 << ('d06 - 'd1));
        dist_x     = (cf_in - base_table_sel2[06]) + rn_table_sel2[06];
    end else if((cf_in >= base_table_sel2[05]) & (eab >= 4)) begin
        inv_seg    = 'd05;
        inv_base_x = (1 << ('d05 - 'd1));
        dist_x     = (cf_in - base_table_sel2[05]) + rn_table_sel2[05];
```

FIG. 15e    1505

```
      end else if((cf_in >= base_table_sel2[04]) & (eab >= 3)) begin
         inv_seg    = 'd04;
         inv_base_x = (1 << ('d04 - 'd1));
         dist_x     = (cf_in - base_table_sel2[04]) + rn_table_sel2[04];
      end else if((cf_in >= base_table_sel2[03]) & (eab >= 2)) begin
         inv_seg    = 'd03;
         inv_base_x = (1 << ('d03 - 'd1));
         dist_x     = (cf_in - base_table_sel2[03]) + rn_table_sel2[03];
      end else if((cf_in >= base_table_sel2[02]) & (eab >= 1)) begin
         inv_seg    = 'd02;
         inv_base_x = (1 << ('d02 - 'd1));
         dist_x     = (cf_in - base_table_sel2[02]) + rn_table_sel2[02];
      end else if(cf_in >= base_table_sel2[01]) begin
         inv_seg    = 'd01;
         inv_base_x = (1 << ('d01 - 'd1));
         dist_x     = (cf_in - base_table_sel2[01]) + rn_table_sel2[01];
      end else begin
         inv_seg    = 'd00;
         inv_base_x = 'd00;
         dist_x     = (cf_in - base_table_sel2[00]) + rn_table_sel2[00];
      end
   end wire [15:0] rf          = rf_table_sel2[inv_seg];             // inverse reciprocal
   wire [4:0]  rs          = rs_table_sel2[inv_seg];             // shift
   wire        rn          = rn_table_sel2[inv_seg];             // input offset
   wire [31:0] add_mul     = dist_x * rf;
   wire [`MDU_RANS_SYMOUT_W-1:0] inv_steps = (add_mul[31:15] >> rs);
   wire [`MDU_RANS_SYMOUT_W-1:0] new_sym   = inv_base_x + inv_steps;

// Compute output and new rans state
   assign sym_valid = sym_buf_full && (phase == 0) && !stall_p0;
   wire next_sym_buf_full = (rans_state_with_input > `MDU_RANS_LOWER_LIMIT) && (output_remaining > 0);
   wire [31:0] new_rans_state_p1 = rans_state_with_input;
   wire [31:0] new_output_remaining = (next_sym_buf_full && (output_remaining > 0)) ? output_remaining - 1 : output_remaining;
```

FIG. 15f  1506

```
// Phase 0: forward distribution
reg [3:0] fwd_seg;
reg [`MDU_RANS_SYMOUT_W-1:0] fwd_segstart;

always_comb begin
    if(sym[8]) begin
        fwd_seg = 'd09;
        fwd_segstart = (1 << ('d09 - 1));
    end else if(sym[7]) begin
        fwd_seg = 'd08;
        fwd_segstart = (1 << ('d08 - 1));
    end else if(sym[6]) begin
        fwd_seg = 'd07;
        fwd_segstart = (1 << ('d07 - 1));
    end else if(sym[5]) begin
        fwd_seg = 'd06;
        fwd_segstart = (1 << ('d06 - 1));
    end else if(sym[4]) begin
        fwd_seg = 'd05;
        fwd_segstart = (1 << ('d05 - 1));
    end else if(sym[3]) begin
        fwd_seg = 'd04;
        fwd_segstart = (1 << ('d04 - 1));
    end else if(sym[2]) begin
        fwd_seg = 'd03;
        fwd_segstart = (1 << ('d03 - 1));
    end else if(sym[1]) begin
        fwd_seg = 'd02;
        fwd_segstart = (1 << ('d02 - 1));
    end else if(sym[0]) begin
        fwd_seg = 'd01;
        fwd_segstart = (1 << ('d01 - 1));
    end else begin
        fwd_seg = 'd00;
        fwd_segstart = 'd00;
    end
end wire [15:0] fwd_base   = base_table_sel2[fwd_seg];
wire [15:0] fwd_fa     = freq_table_sel2[fwd_seg];
```

FIG. 15g  1507

```
wire [`MDU_RANS_SYMOUT_W-1:0]   fwd_steps = sym - fwd_segstart;
wire [`MDU_RANS_PROB_BITS-1:0]  fwd_cfa   = fwd_base + (fwd_fa * fwd_steps);
wire [`MDU_RANS_PROB_BITS-1:0]  fwd_f     = (fwd_cfa == 0) ? fwd_fa-1 : fwd_fa;
wire [`MDU_RANS_PROB_BITS-1:0]  fwd_cf    = (fwd_cfa == 0) ? 1 : fwd_cfa;
wire [`MDU_RANS_PROB_BITS-1:0]  fwd_p     = rans_state_p1[`MDU_RANS_PROB_BITS-1:0];
wire [31:0] new_rans_state_p0             = (fwd_f * rans_state_p1[31:16]) + fwd_p - fwd_cf;

// we can terminate slightly early due to trimming in the compressor
wire legal_end_state = ((new_rans_state_p0 == `MDU_RANS_LOWER_LIMIT) || (new_rans_state_p0 == (`MDU_RANS_LOWER_LIMIT
>> 8)) || (new_rans_state_p0 == (`MDU_RANS_LOWER_LIMIT >> 16)));

// update
always @(posedge clk or negedge nrst) begin
   if (!nrst) begin
      ctrl_state <= DSTATE_IDLE;
      phase <= 0;
      rans_state_p0 <= 0;
      rans_state_p1 <= 0;
      input_remaining <= 0;
      output_remaining <= 0;
      sym <= 0;
      sym_buf_full <= 0;
      input_buf_full <= 0;
      input_buf <= 0;
      done <= 0;
      error_overrun <= 0;
      eab <= 0;
      current_q <= 0;
      base_table_sel2 <= '{10{`MDU_RANS_PROB_BITS'h0}};
      freq_table_sel2 <= '{10{`MDU_RANS_PROB_BITS'h0}};
      rf_table_sel2   <= '{10{`MDU_RANS_PROB_BITS'h0}};
      rs_table_sel2   <= '{10{5'd0}};
      rn_table_sel2   <= '{10{1'd0}};
      hdr3 <= 0;
      flush_per_frag <= 0;
   end else begin if (!phase) begin error_overrun <= sym_valid & (output_remaining == 0) & !legal_end_state;
```

FIG. 15h    1508

```
// PHASE 0
if (!stall_p0) begin

// propagate new rANS state
    case (ctrl_state)
        DSTATE_PROCESSING, DSTATE_DRAINING: begin
            if (sym_buf_full) begin
                rans_state_p0 <= new_rans_state_p0;
            end else begin
                rans_state_p0 <= rans_state_p1;
            end
        end
        default: begin end // nop
    endcase // handle input
    if (din_ready && din_valid) begin
        input_buf <= din;
        input_buf_full <= 1;
    end // handle output
    if (sym_valid && sym_ready) begin
        // sym <= 'hXX; // enable for sim
        sym_buf_full <= 0;
    end
end
end else if (!stall_p1) begin
    // PHASE 1
    case (ctrl_state)
        DSTATE_IDLE: begin                              // waiting for launch
            if (go) begin
                ctrl_state <= DSTATE_HDR0;
                output_remaining <= out_target;
                done <= 0;
                rans_state_p0 <= 0;
                rans_state_p1 <= 0;
            end
        end
    end
end
```

```
DSTATE_HDR0: begin // waiting for first byte of a fragment header
    if (input_buf_full) begin
        input_remaining <= 0;
        ctrl_state <= DSTATE_HDR1;
        current_q <= hdr0_q_field;
        hdr3 <= input_buf[5];
        flush_per_frag <= input_buf[4];
        eab <= eab_clamped;
        input_buf_full <= 0;
    end
end
DSTATE_HDR1: begin // waiting for second byte of a fragment header
    if (input_buf_full) begin
        input_buf_full <= 0;
        base_table_sel2 <= base_table_sel1[current_q];
        freq_table_sel2 <= freq_table_sel1[current_q];
        rf_table_sel2   <= rf_table_sel1[current_q];
        rs_table_sel2   <= rs_table_sel1[current_q];
        rn_table_sel2   <= rn_table_sel1[current_q];
        if (hdr3) begin
            input_remaining <= {9'b0, input_buf};
            ctrl_state <= DSTATE_HDR2;
        end else begin
            input_remaining <= {9'b0, input_buf} + 1;
            ctrl_state <= DSTATE_PROCESSING;
        end
    end
end
DSTATE_HDR2: begin // waiting for third byte of a fragment header
    if (input_buf_full) begin
        input_remaining <= {input_buf, input_remaining[7:0]} + 257;
        ctrl_state <= DSTATE_PROCESSING;
        input_buf_full <= 0;
    end
end
```

```
DSTATE_PROCESSING: begin
    rans_state_p1 <= new_rans_state_p1;
    input_remaining <= new_input_remaining;
    output_remaining <= new_output_remaining;
    input_buf_full <= input_buf_full & !will_feed_rans;
    sym <= new_sym;
    sym_buf_full <= next_sym_buf_full;
    if (new_input_remaining == 0) begin
        if (new_output_remaining > 0) begin
            if (new_rans_state_p1 == `MDU_RANS_LOWER_LIMIT) begin
                ctrl_state <= DSTATE_HDR0;
                if (flush_per_frag) begin
                    rans_state_p1 <= 0;
                end
            end else begin
                ctrl_state <= DSTATE_DRAINING;
            end
        end else begin
            done <= 1;
            ctrl_state <= DSTATE_IDLE;
        end
    end
end
DSTATE_DRAINING: begin
    rans_state_p1 <= new_rans_state_p1;
    output_remaining <= new_output_remaining;
    sym <= new_sym;
    sym_buf_full <= next_sym_buf_full;
    if (new_rans_state_p1 <= `MDU_RANS_LOWER_LIMIT) begin
        if (new_output_remaining > 0) begin
            ctrl_state <= DSTATE_HDR0;
            if (flush_per_frag) begin
                rans_state_p0 <= 0;
                rans_state_p1 <= 0;
            end
        end else begin
            ctrl_state <= DSTATE_IDLE;
            done <= 1;
        end
    end
end
```

FIG. 15k  1511

```
        default:
            ctrl_state <= DSTATE_IDLE;
        endcase // case (ctrl_state)
    end
    phase <= ~phase;
  end
end
endmodule
```

FEATURES OF RANGE ASYMMETRIC NUMBER SYSTEM ENCODING AND DECODING

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

With the emergence of media streaming over the Internet and other digital networks, digital processing of media has become commonplace. Engineers use compression to process media efficiently while still maintaining quality. One goal of media compression is to represent a media signal in a way that provides maximum signal quality for a given amount of bits. Stated differently, this goal is to represent the media signal with the least bits for a given level of quality. Other goals such as limiting computational complexity, improving resiliency to transmission errors, and limiting overall delay due to encoding/transmission/decoding apply in some scenarios.

Media compression typically includes one or more stages of prediction, frequency transformation, and quantization, followed by entropy coding. Corresponding media decompression typically includes entropy decoding followed by one or more stages of inverse quantization, inverse frequency transformation, and prediction. In general, entropy coding converts input symbols to encoded data having a lower bitrate, by exploiting redundancy in the input symbols (e.g., exploiting a pattern of many input symbols having common values, and few input symbols having rare values). Entropy decoding converts encoded data to output symbols, which correspond to the input symbols. There are many variations of entropy coding/decoding, which offer different tradeoffs in terms of compression efficiency (reduction in bitrate) and computational complexity. For example, Huffman coding/decoding is computationally simple but has poor compression efficiency for some distributions of values of input symbols. On the other hand, arithmetic coding/decoding usually has much better compression efficiency, at the cost of much higher computational complexity.

Asymmetric number system ("ANS") coding/decoding potentially offers high compression efficiency (comparable to arithmetic coding/decoding) and low computational complexity (comparable to Huffman coding/decoding). In particular, range ANS ("RANS") coding/decoding can work well when symbols have many possible values (large alphabet) but certain values (such as zero) are very common. RANS encoding/decoding also permits interleaving of output from multiple RANS encoders into a single output bitstream of encoded data, with multiple RANS decoders being usable to decode symbols from the bitstream concurrently, which can speed up the RANS encoding/decoding process.

Considering the importance of entropy coding/decoding to the overall efficiency of media compression and decompression, entropy coding/decoding has attracted significant attention in research and development. Although previous RANS encoding/decoding approaches provide good performance for many scenarios, there is room for improvement in terms of the computational efficiency and adaptiveness of RANS encoding/decoding.

SUMMARY

In summary, the detailed description presents innovations in range asymmetric number system ("RANS") coding and decoding. Some of the innovations relate to hardware implementations of RANS decoding that organize operations in two phases, which can improve the computational efficiency of RANS decoding. Other innovations relate to adapting RANS encoding/decoding for different distributions or patterns of values for symbols. For example, RANS encoding/decoding can adapt by switching a default symbol width (the number of bits per symbol), adjusting symbol width on a fragment-by-fragment basis for different fragments of symbols (where a fragment can include a variable number of symbols and variable amount of encoded data), switching between different static probability models on a fragment-by-fragment basis for different fragments of symbols, and/or selectively flushing (or retaining) the state of a RANS decoder on a fragment-by-fragment basis for different fragments of symbols. In many cases, such innovations can improve compression efficiency while also providing computationally efficient performance.

According to a first set of innovations described herein, a computer system includes an encoded data buffer and a RANS decoder. The encoded data buffer is configured to store encoded data for at least part of a bitstream. The RANS decoder is configured to perform operations in multiple phases using special-purpose hardware. In particular, the RANS decoder is configured to perform operations in a first phase and second phase. The operations include, as part of a first phase, selectively updating state of the RANS decoder using probability information for an output symbol from a previous iteration. The operations further include, as part of a second phase, selectively merging a portion of the encoded data from an input buffer into the state of the RANS decoder, and selectively generating an output symbol for a current iteration using the state of the RANS decoder. In this way, the RANS decoder can decode the encoded data in a computationally efficient manner using the special-purpose hardware.

According to a second set of innovations described herein, a computer system includes a RANS encoder and an encoded data buffer. The RANS encoder is configured to encode input symbols, thereby generating encoded data for at least part of a bitstream. In particular, for the encoding, the RANS encoder is configured to perform operations that include selecting a symbol width from among multiple available symbol widths, configuring the RANS encoder to perform RANS encoding at the selected symbol width, and performing the RANS encoding at the selected symbol width. As part of the configuration of the RANS encoder, the RANS encoder is configured to select a set of pre-defined lookup tables having probability information for the selected symbol width. In this way, the RANS encoder can adapt to different symbol widths for input symbols of different streams (or adapt to different probability distributions for input symbols of different streams), potentially improving compression efficiency. The encoded data buffer is configured to store, for output, the encoded data for the at least part of the bitstream.

For corresponding decoding, a computer system includes an encoded data buffer and a RANS decoder. The encoded data buffer is configured to receive and store encoded data for at least part of a bitstream. The RANS decoder is configured to decode the encoded data for the at least part of the bitstream, thereby generating output symbols. In particular, for the decoding, the RANS decoder is configured to perform operations that include selecting a symbol width from among multiple available symbol widths, configuring the RANS decoder to perform RANS decoding at the selected symbol width, and performing the RANS decoding at the selected symbol width. As part of the configuration of the RANS decoder, the RANS decoder is configured to select a set of pre-defined lookup tables having probability information for output symbols of the selected symbol width. In this way, the RANS decoder can adapt to different symbol widths for output symbols of different streams (or adapt to different probability distributions for output symbols of different streams), which can allow the RANS decoder to benefit from improved compression efficiency.

According to a third set of innovations described herein, a computer system includes a RANS encoder and an encoded data buffer. The RANS encoder is configured to encode input symbols, thereby generating encoded data for at least part of a bitstream. In particular, for the encoding, the RANS encoder is configured to perform operations that include determining whether or not state of a RANS decoder is to be flushed and re-initialized for decoding of the encoded data for the at least part of the bitstream, setting a syntax element that indicates that decision, and performing RANS encoding. In this way, the RANS encoder can decide, on a fragment-by-fragment basis, whether a RANS decoder will (a) flush and re-initialize its state for decoding of a given fragment, or (b) continue to use the state from decoding of the previous fragment, which can improve compression efficiency. The encoded data buffer is configured to store, for output, the encoded data for the at least part of the bitstream. A header in the at least part of the bitstream includes the syntax element that indicates whether or not the state of the RANS decoder is to be flushed and re-initialized for decoding of the encoded data for the at least part of the bitstream.

For corresponding decoding, a computer system includes an encoded data buffer and a RANS decoder. The encoded data buffer is configured to receive and store encoded data for at least part of a bitstream. A header in the at least part of the bitstream includes a syntax element that indicates whether or not state of the RANS decoder is to be flushed and re-initialized for decoding of the encoded data for the at least part of the bitstream. The RANS decoder is configured to decode the encoded data for the at least part of the bitstream, thereby generating output symbols. In particular, for the decoding, the RANS decoder is configured to perform operations that include reading the syntax element, determining (based at least in part on the syntax element) whether or not the state of the RANS decoder is to be flushed and re-initialized for decoding of the encoded data for the at least part of the bitstream, and performing RANS decoding of the encoded data. In this way, the RANS decoder can decide, on a fragment-by-fragment basis, whether the RANS decoder will (a) flush and re-initialize its state for decoding of a given fragment, or (b) continue to use the state from decoding of the previous fragment, which can allow the RANS decoder to benefit from improved compression efficiency.

According to a fourth set of innovations described herein, a computer system includes a RANS encoder and an encoded data buffer. The RANS encoder is configured to encode input symbols, thereby generating encoded data for at least part of a bitstream. In particular, for the encoding, the RANS encoder is configured to perform operations that include selecting, for the encoded data for the at least part of the bitstream, one of multiple available static probability models, setting a syntax element that indicates the selected static probability model, configuring the RANS encoder to perform RANS encoding using the selected static probability model, and performing RANS encoding using the selected static probability model. In this way, the RANS encoder can quickly and efficiently adapt to different probability distributions for input symbols on a fragment-by-fragment basis, potentially improving compression efficiency. The encoded data buffer is configured to store, for output, the encoded data for the at least part of the bitstream. A header in the at least part of the bitstream includes the syntax element that indicates the selected static probability model for the encoded data for the at least part of the bitstream.

For corresponding decoding, a computer system includes an encoded data buffer and a RANS decoder. The encoded data buffer is configured to receive and store encoded data for at least part of a bitstream. A header in the at least part of the bitstream includes a syntax element that indicates a selection of a static probability model, for the encoded data for the at least part of the bitstream, from among multiple available static probability models. The RANS decoder is configured to decode the encoded data for the at least part of the bitstream, thereby generating output symbols. In particular, for the decoding, the RANS decoder is configured to perform operations that include reading the syntax element, selecting (based at least in part on the syntax element) one of the multiple available static probability models, configuring the RANS decoder to perform RANS decoding using the selected static probability model, and performing RANS decoding of the encoded data using the selected static probability model. In this way, the RANS decoder can quickly and efficiently adapt to different probability distributions for output symbols on a fragment-by-fragment basis, which can allow the RANS decoder to benefit from improved compression efficiency.

According to a fifth set of innovations described herein, a computer system includes a RANS encoder and an encoded data buffer. The RANS encoder is configured to encode input symbols, thereby generating encoded data for at least part of a bitstream. In particular, for the encoding, the RANS encoder is configured to perform operations that include determining an adjustment to symbol width for the encoded data for the at least part of the bitstream, setting a syntax element that indicates the adjustment to symbol width, configuring the RANS encoder to perform RANS encoding at the adjusted symbol width, and performing the RANS encoding at the adjusted symbol width. In this way, the RANS encoder can quickly and efficiently adapt to different symbol widths for input symbols on a fragment-by-fragment basis, potentially improving compression efficiency. The encoded data buffer is configured to store, for output, the encoded data for the at least part of the bitstream. A header in the at least part of the bitstream includes the syntax element that indicates the adjustment to symbol width for the encoded data for the at least part of the bitstream.

For corresponding decoding, a computer system includes an encoded data buffer and a RANS decoder. The encoded data buffer is configured to receive and store encoded data for at least part of a bitstream. A header in the at least part of the bitstream includes a syntax element that indicates an adjustment to symbol width for the encoded data for the at least part of the bitstream. The RANS decoder is configured to decode the encoded data for the at least part of the bitstream, thereby generating output symbols. In particular, for the decoding, the RANS decoder is configured to perform operations that include reading the syntax element, determining (based at least in part on the syntax element) the adjustment to symbol width, configuring the RANS decoder to perform RANS decoding at the adjusted symbol width, and performing the RANS decoding at the adjusted symbol width. In this way, the RANS decoder can quickly and efficiently adapt to different symbol widths for output symbols on a fragment-by-fragment basis, which can allow the RANS decoder to benefit from improved compression efficiency.

The innovations described herein include, but are not limited to, the innovations covered by the claims and table of features at the end of the application. The respective innovations can be implemented as part of a method, as part of a computer system configured to perform the method, or as part of computer-readable media storing computer-executable instructions for causing one or more processors in a computer system to perform the method. The various innovations can be used in combination or separately. This summary is provided to introduce a selection of concepts in a simplified form that are further described below in the detailed description. This summary is not intended to identify key features or essential features of the claimed subject matter, nor is it intended to be used to limit the scope of the claimed subject matter. The foregoing and other objects, features, and advantages of the invention will become more apparent from the following detailed description, which proceeds with reference to the accompanying figures and illustrates a number of examples. Examples may also be capable of other and different applications, and some details may be modified in various respects all without departing from the spirit and scope of the disclosed innovations.

BRIEF DESCRIPTION OF THE DRAWINGS

The following drawings illustrate some features of the disclosed innovations.

FIGS. 7a and 7b are flowcharts illustrating example techniques for RANS encoding and RANS decoding, respectively, according to some examples described herein.

FIG. 8 is a diagram illustrating phases of example two-phase RANS decoding according to some examples described herein.

FIGS. 9a-9d are flowcharts illustrating example techniques for two-phase RANS decoding according to some examples described herein.

FIGS. 10a and 10b are flowcharts illustrating example techniques for switching symbol width during RANS encoding and RANS decoding, respectively, according to some examples described herein.

FIGS. 11a and 11b are flowcharts illustrating example techniques for controlling selective flushing/re-initialization of RANS decoder state on a fragment-by-fragment basis during RANS encoding and RANS decoding, respectively, according to some examples described herein.

FIGS. 12a and 12b are flowcharts illustrating example techniques for switching static probability models on a fragment-by-fragment basis during RANS encoding and RANS decoding, respectively, according to some examples described herein.

FIGS. 13a and 13b are flowcharts illustrating example techniques for adjusting symbol width on a fragment-by-fragment basis during RANS encoding and RANS decoding, respectively, according to some examples described herein.

FIGS. 15a-15k are code listings illustrating an example decoder module according to some examples described herein.

DETAILED DESCRIPTION

The detailed description presents innovations in range asymmetric number system ("RANS") coding and decoding. Some of the innovations relate to hardware implementations of RANS decoding that organize operations in two phases, which can improve the computational efficiency of RANS decoding. Other innovations relate to adapting RANS encoding/decoding for different distributions or patterns of values for symbols. For example, RANS encoding/decoding can adapt by switching a default symbol width (the number of bits per symbol). Or, for different fragments of symbols, RANS encoding/decoding can adapt by adjusting symbol width on a fragment-by-fragment basis, switching between different static probability models on a fragment-by-fragment basis, and/or selectively flushing (or retaining) the state of a RANS decoder on a fragment-by-fragment basis. In many cases, such innovations can improve compression efficiency while also providing computationally efficient performance.

In the examples described herein, identical reference numbers in different figures indicate an identical component, module, or operation. More generally, various alternatives to the examples described herein are possible. For example, some of the methods described herein can be altered by changing the ordering of the method acts described, by splitting, repeating, or omitting certain method acts, etc. The various aspects of the disclosed technology can be used in combination or separately. Some of the innovations described herein address one or more of the problems noted in the background. Typically, a given technique/tool does not solve all such problems. It is to be understood that other examples may be utilized and that structural, logical, software, hardware, and electrical changes may be made without departing from the scope of the disclosure. The following description is, therefore, not to be taken in a limited sense. Rather, the scope of the present invention is defined by the appended claims and table of features.

I. Example Computer Systems.

Figure 1:
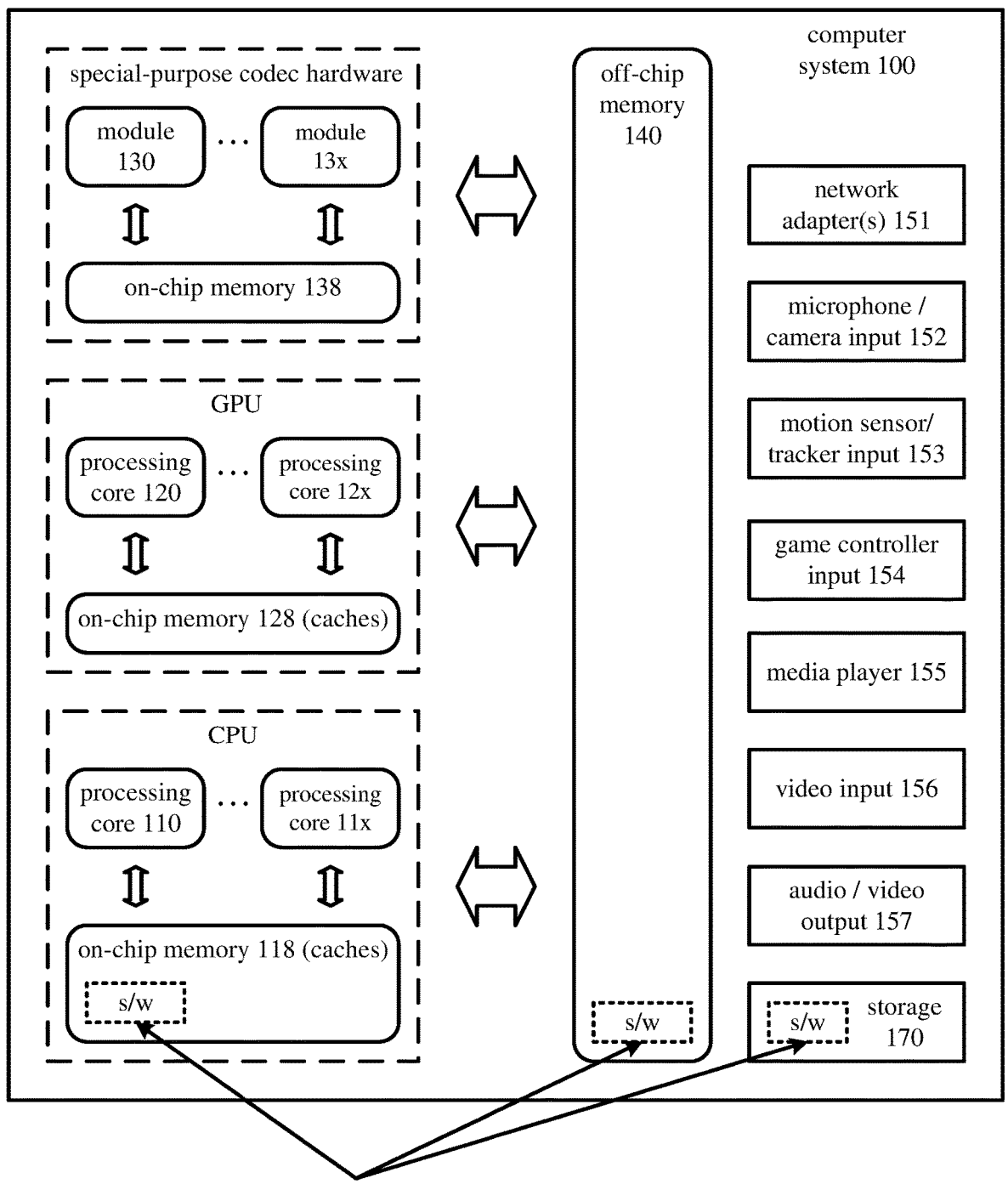
FIG. 1 is a diagram illustrating an example computer system in which some described examples can be implemented.

FIG. 1 illustrates a generalized example of a suitable computer system (100) in which several of the described innovations may be implemented. The innovations described herein relate to RANS encoding and/or RANS decoding. Aside from its use in RANS encoding and/or RANS decoding, the computer system (100) is not intended to suggest any limitation as to scope of use or functionality, as the innovations may be implemented in diverse computer systems, including special-purpose computer systems adapted for operations in RANS encoding and/or RANS decoding.

With reference to FIG. 1, the computer system (100) includes one or more processing cores (110 . . . 11x) of a central processing unit ("CPU") and local, on-chip memory (118). The processing core(s) (110 . . . 11x) of the CPU execute computer-executable instructions. The number of processing core(s) (110 . . . 11x) depends on implementation and can be, for example, 4 or 8. The local memory (118) may be volatile memory (e.g., registers, cache, RAM), non-volatile memory (e.g., ROM, EEPROM, flash memory, etc.), or some combination of the two, accessible by the respective processing core(s) (110 . . . 11x). For software-based implementations of RANS encoding/decoding, the local memory (118) can store software (180), in the form of computer-executable instructions for operations performed by the respective processing core(s) (110 . . . 11x), implementing tools for one or more innovations for RANS encoding and/or RANS decoding. Alternatively, for GPU-accelerated implementations of RANS encoding/decoding or hardware-accelerated implementations of RANS encoding/decoding, the local memory (118) can store software (180), in the form of computer-executable instructions for operations performed by the respective processing core(s) (110 . . . 11x) for one or more drivers or other software layers, to implement tools for one or more innovations for RANS encoding and/or RANS decoding.

The computer system (100) further includes one or more processing cores (120 . . . 12x) of a graphics processing unit ("GPU") and local, on-chip memory (128). The processing cores (120 . . . 12x) of the GPU execute computer-executable instructions (e.g., for shader routines for media coding/decoding operations). The number of processing core(s) (120 . . . 12x) depends on implementation and can be, for example, 64 or 128. The local memory (128) may be volatile memory (e.g., registers, cache, RAM), non-volatile memory (e.g., ROM, EEPROM, flash memory, etc.), or some combination of the two, accessible by the respective processing core(s) (120 . . . 12x). For GPU-accelerated implementations of RANS encoding/decoding, the local memory (128) can store software, in the form of computer-executable instructions for operations performed by the respective processing core(s) (120 . . . 12x), implementing tools for one or more innovations for RANS encoding and/or RANS decoding.

Figure 5:
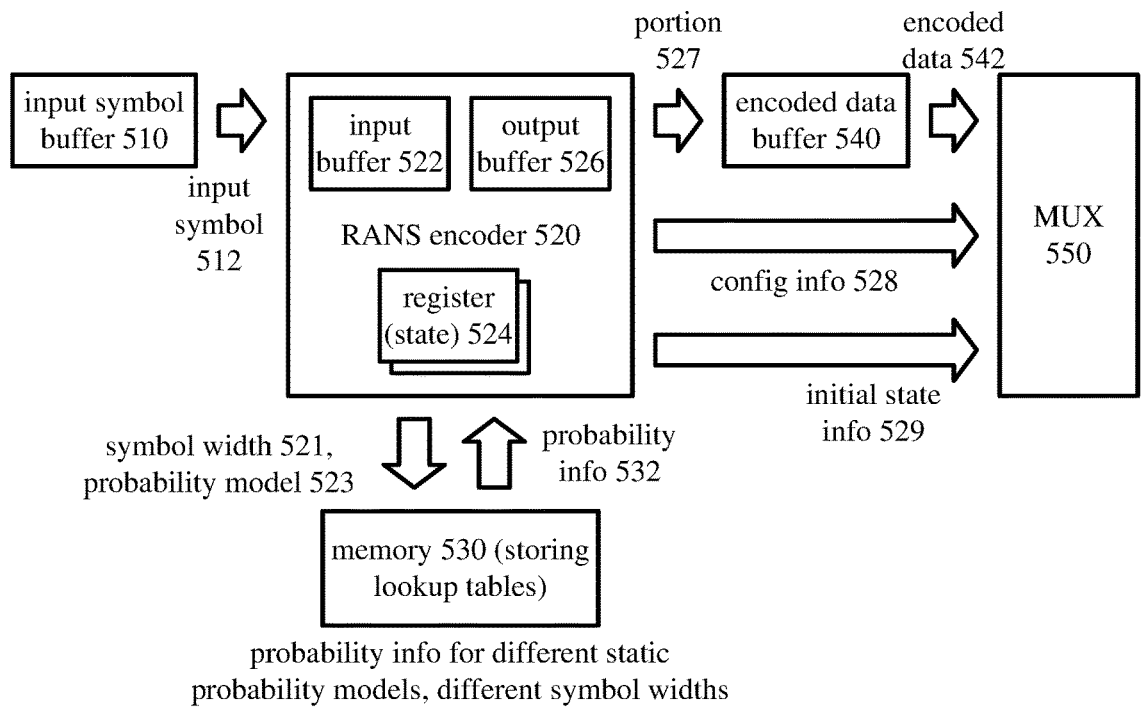
FIGS. 5 and 6 are diagrams illustrating an example RANS encoder system and an example RANS decoder system, respectively, in which some described examples can be implemented.
Figure 6:
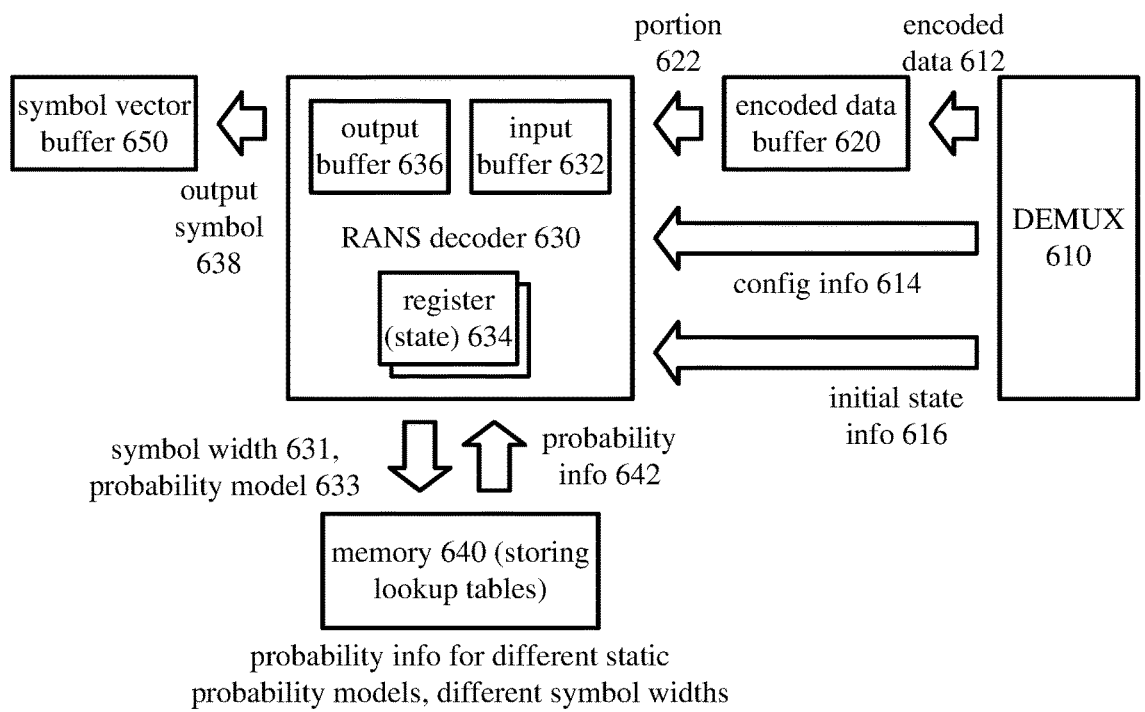

The computer system (100) also includes one or more modules (130 . . . 13x) of special-purpose codec hardware (e.g., an application-specific integrated circuit ("ASIC") or other integrated circuit) along with local, on-chip memory (138). In some example implementations, the module(s) (130 . . . 13x) include one or more RANS decoder modules, a feeder module (configured to provide encoded data to input buffers for the respective RANS decoder modules), and a decoder array module configured to manage the RANS decoder module(s). FIG. 6 shows an example RANS decoder (630) and associated buffers, which are part of a RANS decoder system (600). FIGS. 15a-15k show code listings (1501-1511) for an example RANS decoder module. The module(s) (130 . . . 13x) can instead, or additionally, include one or more RANS encoder modules, an output module (configured to interleave output from the respective RANS encoder modules), and an encoder array module configured to manage the RANS encoder module(s). FIG. 5 shows an example RANS encoder (520) and associated buffers, which are part of a RANS decoder system (500). The local memory (138) may be volatile memory (e.g., registers, cache, RAM), non-volatile memory (e.g., ROM, EEPROM, flash memory, etc.), or some combination of the two, accessible by the respective module(s) (130 . . . 13x).

More generally, the term "processor" may refer generically to any device that can process computer-executable instructions and may include a microprocessor, microcontroller, programmable logic device, digital signal processor, and/or other computational device. A processor may be a processing core of a CPU, other general-purpose unit, or GPU. A processor may also be a specific-purpose processor implemented using, for example, an ASIC or a field-programmable gate array ("FPGA").

The term "control logic" may refer to a controller or, more generally, one or more processors, operable to process computer-executable instructions, determine outcomes, and generate outputs. Depending on implementation, control logic can be implemented by software executable on a CPU, by software controlling special-purpose hardware (e.g., a GPU or other graphics hardware), or by special-purpose hardware (e.g., in an ASIC).

With reference to FIG. 1, the computer system (100) includes shared memory (140), which may be volatile memory (e.g., RAM), non-volatile memory (e.g., ROM, EEPROM, flash memory, etc.), or some combination of the two, accessible by the processing core(s). The memory (140) stores software (180) implementing tools for one or more innovations for RANS encoding and/or RANS decoding.

The computer system (100) includes one or more network adapters (151). As used herein, the term network adapter indicates any network interface card ("NIC"), network interface, network interface controller, or network interface device. The network adapter(s) (151) enable communication over a network to another computing entity (e.g., server, other computer system). The network can be a telephone network, wide area network, local area network, storage area network, or other network. The network adapter(s) (151) can support wired connections and/or wireless connections, for a wide-area network, local-area network, personal-area network or other network. The network adapter(s) (151) convey information such as computer-executable instructions, encoded media, or other data in a modulated data signal over network connection(s). A modulated data signal is a signal that has one or more of its characteristics set or changed in such a manner as to encode information in the signal. By way of example, and not limitation, the network connections can use an electrical, optical, RF, or other carrier.

A camera input (152) accepts video input in analog or digital form from a video camera, which captures natural video. An audio input accepts audio input in analog or digital form from a microphone (152), which captures audio.

The computer system (100) optionally includes a motion sensor/tracker input (153) for a motion sensor/tracker, which can track the movements of a user and objects around the user. For example, the motion sensor/tracker allows a user (e.g., player of a game) to interact with the computer system (100) through a natural user interface using gestures and spoken commands. The motion sensor/tracker can incorporate gesture recognition, facial recognition and/or voice recognition.

A game controller input (154) accepts control signals from one or more game controllers, over a wired connection or wireless connection. The control signals can indicate user inputs from one or more directional pads, buttons, triggers and/or one or more joysticks of a game controller. The control signals can also indicate user inputs from a touchpad or touchscreen, gyroscope, accelerometer, angular rate sensor, magnetometer and/or other control or meter of a game controller.

The computer system (100) optionally includes a media player (155) and video input (156). The media player (155) can play DVDs, Blu-ray disks, other disk media and/or other formats of media. The video input (156) can accept input video in analog or digital form (e.g., from a cable input, HDMI input or other input). A graphics engine (not shown) can provide texture data for graphics in a computer-represented environment.

A video output (157) provides video output to a display device. The video output (157) can be an HDMI output or other type of output. An audio output (157) provides audio output to one or more speakers.

The storage (170) may be removable or non-removable, and includes magnetic media (such as magnetic disks, magnetic tapes or cassettes), optical disk media and/or any other media which can be used to store information and which can be accessed within the computer system (100). The storage (170) stores instructions for the software (180) implementing one or more innovations for RANS encoding and/or RANS decoding.

The computer system (100) may have additional features. For example, the computer system (100) includes one or more other input devices and/or one or more other output devices. The other input device(s) may be a touch input device such as a keyboard, mouse, pen, or trackball, a scanning device, or another device that provides input to the computer system (100). The other output device(s) may be a printer, CD-writer, or another device that provides output from the computer system (100).

An interconnection mechanism (not shown) such as a bus, controller, or network interconnects the components of the computer system (100). Typically, operating system software (not shown) provides an operating environment for other software executing in the computer system (100), and coordinates activities of the components of the computer system (100).

The computer system (100) of FIG. 1 is a physical computer system. A virtual machine can include components organized as shown in FIG. 1.

The term "application" or "program" may refer to software such as any user-mode instructions to provide functionality. The software of the application (or program) can further include instructions for an operating system and/or device drivers. The software can be stored in associated memory. The software may be, for example, firmware. While it is contemplated that an appropriately programmed general-purpose computer or computing device may be used to execute such software, it is also contemplated that hard-wired circuitry or custom hardware (e.g., an ASIC) may be used in place of, or in combination with, software instructions. Thus, examples described herein are not limited to any specific combination of hardware and software.

The term "computer-readable medium" refers to any medium that participates in providing data (e.g., instructions) that may be read by a processor and accessed within a computing environment. A computer-readable medium may take many forms, including but not limited to non-volatile media and volatile media. Non-volatile media include, for example, optical or magnetic disks and other persistent memory. Volatile media include dynamic random access memory ("DRAM"). Common forms of computer-readable media include, for example, a solid state drive, a flash drive, a hard disk, any other magnetic medium, a CD-ROM, Digital Versatile Disc ("DVD"), any other optical medium, RAM, programmable read-only memory ("PROM"), erasable programmable read-only memory ("EPROM"), a USB memory stick, any other memory chip or cartridge, or any other medium from which a computer can read. The term "computer-readable memory" specifically excludes transitory propagating signals, carrier waves, and wave forms or other intangible or transitory media that may nevertheless be readable by a computer. The term "carrier wave" may refer to an electromagnetic wave modulated in amplitude or frequency to convey a signal.

The innovations can be described in the general context of computer-executable instructions being executed in a computer system on a target real or virtual processor. The computer-executable instructions can include instructions executable on processing cores of a general-purpose processor to provide functionality described herein, instructions executable to control a GPU or special-purpose hardware to provide functionality described herein, instructions executable on processing cores of a GPU to provide functionality described herein, and/or instructions executable on processing cores of a special-purpose processor to provide functionality described herein. In some implementations, computer-executable instructions can be organized in program modules. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computer system.

Numerous examples are described in this disclosure, and are presented for illustrative purposes only. The described examples are not, and are not intended to be, limiting in any sense. The presently disclosed innovations are widely applicable to numerous contexts, as is readily apparent from the disclosure. One of ordinary skill in the art will recognize that the disclosed innovations may be practiced with various modifications and alterations, such as structural, logical, software, and electrical modifications. Although particular features of the disclosed innovations may be described with reference to one or more particular examples, it should be understood that such features are not limited to usage in the one or more particular examples with reference to which they are described, unless expressly specified otherwise. The present disclosure is neither a literal description of all examples nor a listing of features of the invention that must be present in all examples.

When an ordinal number (such as "first," "second," "third" and so on) is used as an adjective before a term, that ordinal number is used (unless expressly specified otherwise) merely to indicate a particular feature, such as to distinguish that particular feature from another feature that is described by the same term or by a similar term. The mere usage of the ordinal numbers "first," "second," "third," and so on does not indicate any physical order or location, any ordering in time, or any ranking in importance, quality, or otherwise. In addition, the mere usage of ordinal numbers does not define a numerical limit to the features identified with the ordinal numbers.

When introducing elements, the articles "a," "an," "the," and "said" are intended to mean that there are one or more of the elements. The terms "comprising," including," and "having" are intended to be inclusive and mean that there may be additional elements other than the listed elements.

When a single device, component, module, or structure is described, multiple devices, components, modules, or structures (whether or not they cooperate) may instead be used in place of the single device, component, module, or structure. Functionality that is described as being possessed by a single device may instead be possessed by multiple devices, whether or not they cooperate. Similarly, where multiple devices, components, modules, or structures are described herein, whether or not they cooperate, a single device, component, module, or structure may instead be used in place of the multiple devices, components, modules, or structures. Functionality that is described as being possessed by multiple devices may instead be possessed by a single device. In general, a computer system or device can be local or distributed, and can include any combination of special-purpose hardware and/or hardware with software implementing the functionality described herein.

Further, the techniques and tools described herein are not limited to the specific examples described herein. Rather, the respective techniques and tools may be utilized independently and separately from other techniques and tools described herein.

Device, components, modules, or structures that are in communication with each other need not be in continuous communication with each other, unless expressly specified otherwise. On the contrary, such devices, components, modules, or structures need only transmit to each other as necessary or desirable, and may actually refrain from exchanging data most of the time. For example, a device in communication with another device via the Internet might not transmit data to the other device for weeks at a time. In addition, devices, components, modules, or structures that are in communication with each other may communicate directly or indirectly through one or more intermediaries.

As used herein, the term "send" denotes any way of conveying information from one device, component, module, or structure to another device, component, module, or structure. The term "receive" denotes any way of getting information at one device, component, module, or structure from another device, component, module, or structure. The devices, components, modules, or structures can be part of the same computer system or different computer systems. Information can be passed by value (e.g., as a parameter of a message or function call) or passed by reference (e.g., in a buffer). Depending on context, information can be communicated directly or be conveyed through one or more intermediate devices, components, modules, or structures. As used herein, the term "connected" denotes an operable communication link between devices, components, modules, or structures, which can be part of the same computer system or different computer systems. The operable communication link can be a wired or wireless network connection, which can be direct or pass through one or more intermediaries (e.g., of a network).

A description of an example with several features does not imply that all or even any of such features are required. On the contrary, a variety of optional features are described to illustrate the wide variety of possible examples of the innovations described herein. Unless otherwise specified explicitly, no feature is essential or required.

Further, although process steps and stages may be described in a sequential order, such processes may be configured to work in different orders. Description of a specific sequence or order does not necessarily indicate a requirement that the steps/stages be performed in that order. Steps or stages may be performed in any order practical. Further, some steps or stages may be performed simultaneously despite being described or implied as occurring non-simultaneously. Description of a process as including multiple steps or stages does not imply that all, or even any, of the steps or stages are essential or required. Various other examples may omit some or all of the described steps or stages. Unless otherwise specified explicitly, no step or stage is essential or required. Similarly, although a product may be described as including multiple aspects, qualities, or characteristics, that does not mean that all of them are essential or required. Various other examples may omit some or all of the aspects, qualities, or characteristics.

Many of the techniques and tools described herein are illustrated with reference to a media coder/decoder system such as a video coder/decoder system, audio coder/decoder system, or texture coder/decoder system. Alternatively, the techniques and tools described herein can be implemented in a data coder/decoder system for use in coding/decoding text data or other data, generally.

An enumerated list of items does not imply that any or all of the items are mutually exclusive, unless expressly specified otherwise. Likewise, an enumerated list of items does not imply that any or all of the items are comprehensive of any category, unless expressly specified otherwise.

For the sake of presentation, the detailed description uses terms like "determine" and "select" to describe computer operations in a computer system. These terms denote operations performed by one or more processors or other components in the computer system, and should not be confused with acts performed by a human being. The actual computer operations corresponding to these terms vary depending on implementation.

II. Example Network Environments.

Figure 2A:
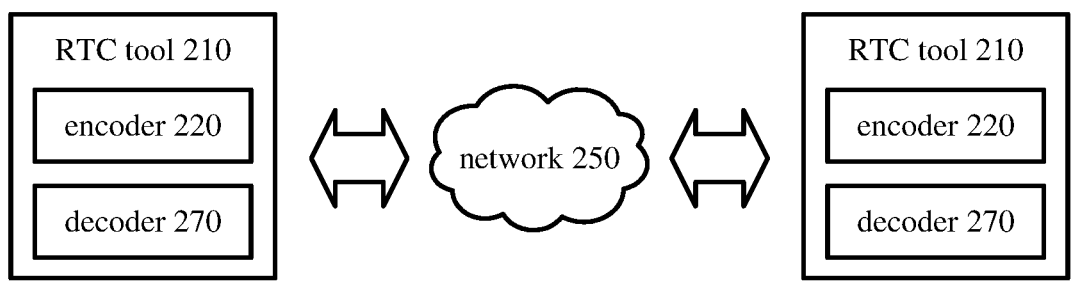
FIGS. 2a and 2b are diagrams illustrating example network environments in which some described examples can be implemented.
Figure 2B:
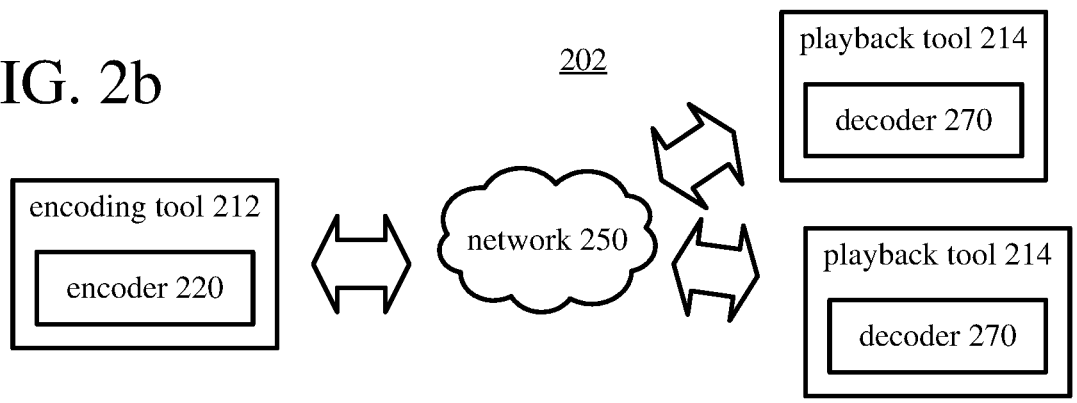

FIGS. 2a and 2b show example network environments (201, 202) that include media encoders (220) and media decoders (270). The encoders (220) and decoders (270) are connected over a network (250) using an appropriate communication protocol. The network (250) can include the Internet and/or another computer network.

In the network environment (201) shown in FIG. 2a, each real-time communication ("RTC") tool (210) includes both an encoder (220) and a decoder (270) for bidirectional communication. A given encoder (220) can produce output compliant with a media codec format or extension of a media codec format, with a corresponding decoder (270) accepting encoded data from the encoder (220). The bidirectional communication can be part of a conference call or other two-party or multi-party communication scenario. Although the network environment (201) in FIG. 2a includes two real-time communication tools (210), the network environment (201) can instead include three or more real-time communication tools (210) that participate in multi-party communication.

Figure 3:
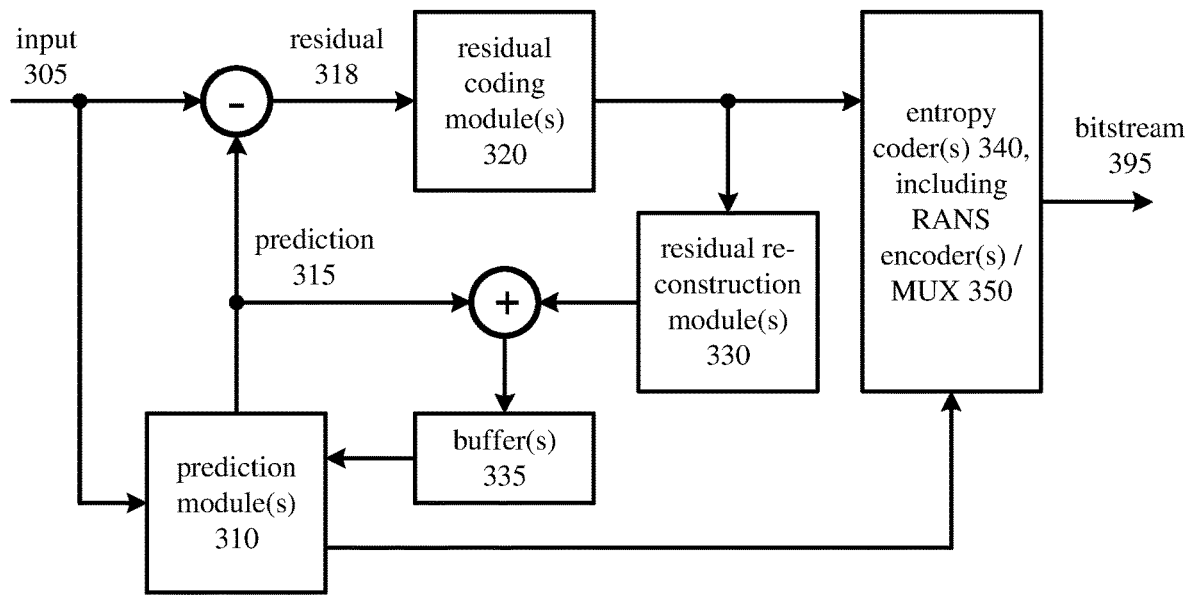
FIGS. 3 and 4 are diagrams illustrating an example media encoder system and an example media decoder system, respectively, in which some described examples can be implemented.
Figure 4:
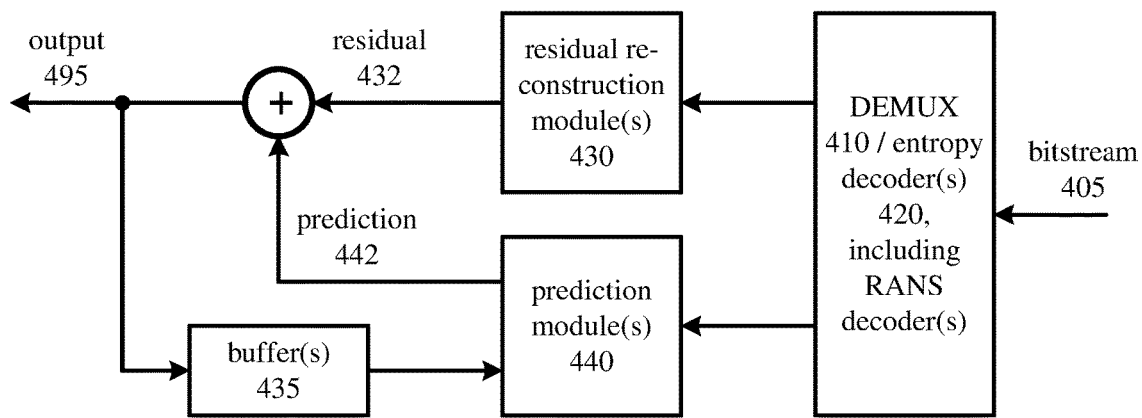

A real-time communication tool (210) is configured to manage encoding by an encoder (220). FIG. 3 shows an example encoder system (300) that can be included in the real-time communication tool (210). Alternatively, the real-time communication tool (210) uses another encoder system. A real-time communication tool (210) is also configured to manage decoding by a decoder (270). FIG. 4 shows an example decoder system (400), which can be included in the real-time communication tool (210). Alternatively, the real-time communication tool (210) uses another decoder system.

In the network environment (202) shown in FIG. 2b, an encoding tool (212) includes an encoder (220) that is configured to encode media for delivery to multiple playback tools (214), which include decoders (270). The unidirectional communication can be provided for a surveillance system, web monitoring system, remote desktop conferencing presentation, gameplay broadcast, or other scenario in which media is encoded and sent from one location to one or more other locations for playback. Although the network environment (202) in FIG. 2b includes two playback tools (214), the network environment (202) can include more or fewer playback tools (214). In general, a playback tool (214) is configured to communicate with the encoding tool (212) to determine a stream of encoded media for the playback tool (214) to receive. The playback tool (214) is configured to receive the stream, buffer the received encoded data for an appropriate period, and begin decoding and playback.

FIG. 3 shows an example encoder system (300) that can be included in the encoding tool (212). Alternatively, the encoding tool (212) uses another encoder system. The encoding tool (212) can also include server-side controller logic for managing connections with one or more playback tools (214). FIG. 4 shows an example decoder system (400), which can be included in the playback tool (214). Alternatively, the playback tool (214) uses another decoder system. A playback tool (214) can also include client-side controller logic for managing connections with the encoding tool (212).

III. Example Media Encoder Systems.

FIG. 3 is a block diagram of an example encoder system (300) in conjunction with which some described examples may be implemented. The encoder system (300) can be a general-purpose encoding tool capable of operating in any of multiple encoding modes such as a low-latency encoding mode for real-time communication, a transcoding mode, and a higher-latency encoding mode for producing media for playback from a file or stream, or it can be a special-purpose encoding tool adapted for one such encoding mode. The encoder system (300) can be adapted for encoding of a particular type of content (e.g., camera video content, screen content, texture content for graphics). The encoder system (300) can be implemented as part of an operating system module, as part of an application library, as part of a standalone application, using GPU hardware, and/or using special-purpose hardware. Overall, the encoder system (300) is configured to receive input (305) from a source and produce encoded data in a bitstream (395) as output to a channel. For example, the source can be a video camera (for natural video), screen capture module (for screen content), graphics engine (for texture), or microphone (for audio).

The encoder system (300) includes one or more prediction modules (310), one or more residual coding modules (320), one or more residual reconstruction modules (330), one or more buffers (335), one or more entropy coders (340), and a multiplexer (350). The encoder system (300) can include other modules (not shown) that are configured to perform pre-processing operations (e.g., for color space conversion, sub-sampling, etc.), control operations (e.g., receiving feedback from modules, providing control signals to modules to set and change coding parameters during encoding, setting syntax elements that indicate decisions made during encoding, so that a corresponding decoder can make consistent decisions), filtering operations, or other operations.

The prediction module(s) (310) are configured to predict a current unit of media (e.g., frame, block, object, set) using previously reconstructed media content, which is stored in the buffer(s) (335). In general, for video or image content, a block is an m×n arrangement of sample values, and a frame is an arrangement of blocks in one or more color planes. For audio content, a block or frame is a series of sample values. For texture content, a set of sample values may represent texture values for points of a graphics object. For example, for video content, the prediction module(s) (310) can be configured to perform operations for motion compensation relative to previously encoded/reconstructed pictures (inter-picture prediction). Or, as another example, for video content or image content, the prediction module(s) (310) can be configured to perform operations for intra spatial prediction or intra block copy prediction within a picture (intra-picture prediction). In some types of encoder system (300), the prediction module(s) (310) are arranged differently. For example, for audio content, the prediction module(s) (310) can be configured to perform operations for linear prediction. In other types of encoder system (300), there are no prediction module(s).

In FIG. 3, the prediction module(s) (310) are configured to produce a prediction (315) for the current unit of media. The encoder system (300) is configured to determine differences between the current unit of media from the input (305) and its prediction (315). This provides values of the residual (318). For lossy coding, the values of the residual (318) are processed by the residual coding module(s) (320) and residual reconstruction module(s) (330). For lossless coding, the residual coding module(s) (320) and residual reconstruction module(s) (330) can be bypassed.

The residual coding module(s) (320) are configured to encode the values of the residual (318). Typically, the residual coding module(s) (320) include a frequency transformer and scaler/quantizer. A frequency transformer is configured to convert input-domain values into frequency-domain (i.e., spectral, transform) values. For block-based coding, the frequency transformer can apply a discrete cosine transform ("DCT"), an integer approximation thereof, or another type of forward block transform to blocks of residual values (or sample values if the prediction (315) is null), producing blocks of frequency transform coefficients. The scaler/quantizer is configured to scale and quantize the transform coefficients. Alternatively, the residual coding module(s) (320) can include a scaler/quantizer but not a frequency transformer, in which case values of the residual (318) are directly scaled/quantized.

The residual reconstruction module(s) (330) are configured to reconstruct values of the residual (318), which typically produces an approximation of the values of the residual (318). Typically, the residual reconstruction module(s) (320) include a scaler/inverse quantizer and an inverse frequency transformer. The scaler/inverse quantizer is configured to perform inverse scaling and inverse quantization on the quantized transform coefficients. When the transform stage has not been skipped, an inverse frequency transformer is configured to perform an inverse frequency transform, producing reconstructed residual values or sample values. If the transform stage has been skipped, the inverse frequency transform is also skipped. In this case, the scaler/inverse quantizer can be configured to perform inverse scaling and inverse quantization on residual values (or sample value data), producing reconstructed values.

The encoder system (300) is configured to combine the reconstructed values of the residual (318) and the prediction (315) to produce an approximate or exact reconstruction of the original content from the input (305). The reconstruction is stored in the buffer(s) (335) for use in subsequent prediction operations. (In lossy compression, some information is lost from the input (305).) If the residual coding module(s) (320) and residual reconstruction module(s) (330) are bypassed (for lossless compression), the values of the residual (318) can be combined with the prediction (315). If residual values have not been encoded/signaled, the encoder system (300) can be configured to use the values of the prediction (315) as the reconstruction.

The entropy coder(s) (340) are configured to entropy code the output from the residual coding module(s) (320) (e.g., quantized transform coefficients) as well as side information from the prediction module(s) (310) (e.g., parameters indicating how prediction has been performed) and other side information (e.g., parameters indicating decisions made during encoding). The entropy coder(s) (340) can be configured to determine parameters that represent quantized transform coefficients, side information, etc. The entropy coder(s) (340) can be configured to predict values of parameters based on contextual information, then encode differences between the actual values and predicted values. For input symbols that represent the values to be encoded, the entropy coder(s) (340) can be configured to perform entropy coding in various ways. Typical entropy coding techniques include Exponential-Golomb coding, Golomb-Rice coding, context-adaptive binary arithmetic coding ("CABAC"), differential coding, Huffman coding, run length coding, Lempel-Ziv ("LZ") coding, dictionary coding, RANS encoding and other variations of ANS coding, and combinations of the above. The entropy coder(s) (340) can be configured to use different coding techniques for different kinds of data and to apply multiple techniques in combination. In particular, the entropy coder(s) (340) include one or more RANS encoders. Examples of RANS encoders are described below with reference to FIG. 5. The multiplexer (350) is configured to format the encoded data for output as part of the bitstream (395).

Depending on implementation and the type of compression desired, modules of an encoder system (300) can be added, omitted, split into multiple modules, combined with other modules, and/or replaced with like modules. In alternative embodiments, encoder systems with different modules and/or other configurations of modules perform one or more of the techniques described herein. Specific embodiments of encoder systems typically use a variation or supplemented version of the encoder system (300). The relationships shown between modules within the encoder system (300) indicate general flows of information in the encoder system; other relationships are not shown for the sake of simplicity.

An encoded data buffer (not shown) is configured to store the encoded data for the bitstream (395) for output. In general, the encoded data contains, according to the syntax of an elementary coded media bitstream, syntax elements for various layers of bitstream syntax. Media metadata can also be stored in the encoded data buffer. A channel encoder (not shown) can be configured to implement one or more media system multiplexing protocols or transport protocols, in which case the channel encoder can be configured to add syntax elements as part of the syntax of the protocol(s). The channel encoder can be configured to provide output to a channel, which represents storage, a communications connection, or another channel for the output.

IV. Example Media Decoder Systems.

FIG. 4 is a block diagram of an example decoder system (400) in conjunction with which some described examples may be implemented. The decoder system (400) can be a general-purpose decoding tool capable of operating in any of multiple decoding modes such as a low-latency decoding mode for real-time communication and a higher-latency decoding mode for media playback from a file or stream, or it can be a special-purpose decoding tool adapted for one such decoding mode. The decoder system (400) can be implemented as part of an operating system module, as part of an application library, as part of a standalone application, using GPU hardware, and/or using special-purpose hardware.

Coded data is received from a channel, which can represent storage, a communications connection, or another channel for coded data as input. A channel decoder (not shown) can process the coded data from the channel. For example, the channel decoder can be configured to implement one or more media system demultiplexing protocols or transport protocols, in which case the channel decoder can be configured to parse syntax elements added as part of the syntax of the protocol(s).

An encoded data buffer (not shown) is configured to store encoded data that is output from the channel decoder. The encoded data contains, according to the syntax of an elementary coded media bitstream, syntax elements at various levels of bitstream syntax. The encoded data buffer can also be configured to store media metadata. In general, the encoded data buffer is configured to temporarily store encoded data until such encoded data is used by the decoder system (400). At that point, encoded data is transferred from the encoded data buffer to the decoder system (400). As decoding continues, new coded data is added to the encoded data buffer, and the oldest coded data remaining in the encoded data buffer is transferred to the decoder system (400).

The decoder system (400) is configured to receive encoded data in a bitstream (405) and produce reconstructed media as output (495). The decoder system (400) includes a demultiplexer (410), one or more entropy decoders (420), one or more residual reconstruction modules (430), one or more prediction modules (440), and one or more buffers (435). The decoder system (400) can include other modules (not shown) that are configured to perform control operations (e.g., receiving feedback from modules, providing control signals to modules to set and change decoding parameters during decoding), filtering operations, post-processing operations (e.g., for color space conversion, up-sampling, etc.), or other operations.

The encoded data buffer is configured to receive and store encoded data in the bitstream (405), and make the received encoded data available to the demultiplexer (410). The demultiplexer (410) is configured to parse encoded data from the bitstream (405) and provide it to the appropriate entropy decoder(s) (420). The entropy decoder(s) (420) are configured to entropy decode the encoded data, producing output symbols for parameters. The parameters can represent data to be provided to the residual reconstruction module(s) (430) (e.g., quantized transform coefficients), side information to be provided to the prediction module(s) (440) (e.g., parameters indicating how prediction has been performed), or other side information (e.g., parameters indicating decisions were made during encoding). The entropy decoder(s) (420) can be configured to predict values of parameters based on contextual information, decode differences between the actual values and predicted values, and combine the differences and predicted values. Thus, the entropy decoder(s) (420) can be configured to reconstruct parameters that represent quantized transform coefficients and side information. The entropy decoder(s) (420) can be configured to perform entropy decoding in various ways. Typical entropy decoding techniques include Exponential-Golomb decoding, Golomb-Rice decoding, context-adaptive binary arithmetic decoding, Huffman decoding, run length decoding, Lempel-Ziv ("LZ") decoding, dictionary decoding, RANS decoding and other variations of ANS decoding, and combinations of the above. The entropy decoder(s) (420) can be configured to use different decoding techniques for different kinds of data and to apply multiple techniques in combination. In particular, the entropy decoder(s) (340) include one or more RANS decoders. Examples of RANS decoders are described below with reference to FIG. 6.

The residual reconstruction module(s) (430) are configured to reconstruct values of the residual (432), which typically produces an approximation of the original values of the residual (432). For example, the residual reconstruction module(s) (430) include a scaler/inverse quantizer and an inverse frequency transformer. The scaler/inverse quantizer is configured to perform inverse scaling and inverse quantization on quantized transform coefficients. When the transform stage has not been skipped, an inverse frequency transformer is configured to perform an inverse frequency transform, producing reconstructed residual values or sample values. The inverse frequency transform can be an inverse DCT, an integer approximation thereof, or another type of inverse frequency transform. If the transform stage has been skipped, the inverse frequency transform is also skipped. In this case, the scaler/inverse quantizer can be configured to perform inverse scaling and inverse quantization on residual values (or sample value data), producing reconstructed values. For lossless decompression, the residual reconstruction module(s) (330) can be bypassed.

The prediction module(s) (440) are configured to predict a current unit of media (e.g., frame, block, object, set) using previously reconstructed media content, which is stored in the buffer(s) (435). For example, for video content, the prediction module(s) (440) can be configured to perform operations for motion compensation relative to previously encoded/reconstructed pictures (inter-picture prediction). Or, as another example, for video content or image content, the prediction module(s) (440) can be configured to perform operations for intra spatial prediction or intra block copy prediction within a picture (intra-picture prediction). In some types of decoder system (400), the prediction module(s) (440) are arranged differently. For example, for audio content, the prediction module(s) (440) can be configured to perform operations for linear prediction. In other types of decoder system (440), there are no prediction module(s).

In FIG. 4, the prediction module(s) (440) are configured to produce a prediction (442) for the current unit of media. The decoder system (400) is configured to combine the reconstructed values of the residual (432) and the prediction (442) to produce an approximate or exact reconstruction of the media content. The reconstruction is stored in the buffer(s) (435) for use in subsequent prediction operations. If residual values have not been encoded/signaled, the decoder system (400) can be configured to use the values of the prediction (442) as the reconstruction.

Depending on implementation and the type of decompression desired, modules of the decoder system (400) can be added, omitted, split into multiple modules, combined with other modules, and/or replaced with like modules. In alternative embodiments, decoder systems with different modules and/or other configurations of modules perform one or more of the techniques described herein. Specific embodiments of decoder systems typically use a variation or supplemented version of the decoder system (400). The relationships shown between modules within the decoder system (400) indicate general flows of information in the decoder system; other relationships are not shown for the sake of simplicity.

V. RANS Encoding/Decoding, in General.

Asymmetric number system ("ANS") coding/decoding potentially offers high compression efficiency and low computational complexity. In particular, range ANS ("RANS") coding/decoding can work well when symbols have many possible values (large alphabet) but certain values are very common. RANS encoding/decoding also permits interleaving of output from multiple RANS encoders into a single output bitstream of encoded data, with multiple RANS decoders being usable to decode symbols from the bitstream concurrently, which can speed up the RANS encoding/decoding process.

A RANS encoder encodes a symbol s by modifying an input state x, producing an updated state x. The state x can be expressed as a single natural number. The main coding function for RANS encoding can be expressed as:

$$C(s,x)=\text{floor}(x/f_s)<<n+\text{mod}(x,f_s)+c_s,$$

where floor(input) is a function that accepts a real number as input and returns the greatest integer less than or equal to the input, mod(a, b) is a function that gives the remainder of a divided by b, and <<n indicates a left shift by n bits. The value n indicates a number of bits used to represent probabilities of values for the symbols in the range $0 \ldots 2^n-1$. The value n depends on implementation. For example, n is 16. The value $f_s$ represents a factor for the symbol s according to a spread function. In general, the spread function tracks the frequency of the respective values possible for the symbol s, as sub-ranges within the range $0 \ldots 2^n-1$. A more probable value for the symbol s has a larger sub-range and larger value of $f_s$, and a less probable value for the symbol s has a smaller sub-range and smaller value of $f_s$. For example, if the range is $0 \ldots 65535$, $f_s$ can be 16384 for a value occurring 25% of the time, 4096 for a value occurring 6.25% of the time, 655 for a value occurring 1% of the time, and so on. The sum of the probabilities is 100%. Similarly, for a range represented with n bits, the sum of the values of $f_s$ is $2^n$. The value $c_s$ represents an offset for the symbol s, where the offset $c_s$ is the sum of sub-ranges from $f_0$ up to $f_{s-1}$, not including $f_s$.

A RANS decoder decodes a symbol s from an input state x, producing the symbol s and an updated state x. The state x can be expressed as a single natural number. The main decoding function for RANS decoding can be expressed as:

$$D(x)=(s,f_s*(x>>n)+(x\ \&\ \text{mask})-c_s),$$

where >>n indicates a right shift by n bits, for a value n as defined above, and & indicates a bitwise AND operation. The value mask is an n-bit value $2^n-1$. Thus, mask includes n 1-bits. In the decoding function, the updated value of the state x is given by $f_s*(x>>n)+(x\ \&\ \text{mask})-c_s$. The value of the symbol s is found such that $c_s<=\text{mod}(x, 2^n)<c_{s+1}$.

The coding function C(s, x) increases the value of the state x. If $f_s$ is large, the value of floor($x/f_s$) tends to be smaller, and the resulting increase in the value of the state x tends to be smaller. On the other hand, if $f_s$ is small, the value of floor($x/f_s$) tends to be larger, and the resulting increase in the value of the state x tends to be larger. Thus, for more common values of symbols, the increase in state x is smaller. In any case, to prevent the state x from overflowing whatever buffer holds it, bits are selectively shifted out of the state x as output encoded data.

Conversely, the decoding function D(x) decreases the value of the state x. If $f_s$ is large, the value of $f_s*(x>>n)$ tends to be larger, and the resulting decrease in the value of the state x tends to be smaller. On the other hand, if $f_s$ is small, the value of $f_s*(x>>n)$ tends to be smaller, and the resulting decrease in the value of the state x tends to be larger. Thus, for more common values of symbols, the decrease in state x is smaller. In any case, to prevent the state x from underflowing (since a RANS decoder typically does not include state for all encoded symbols at the start of decoding), bits are selectively shifted into the state x as input encoded data.

For implementations in which encoded data is streamed from an encoder system (including one or more RANS encoders) to a decoder system (including one or more RANS decoders), the coding function C(s, x) can be embedded in logic that selectively shifts encoded data out of the state x as output. Similarly, the decoding function D(x) can be embedded in logic that selectively shifts encoded data into the state x as input.

For example, the coding function C(s, x) and logic that selectively shifts encoded data out of the state x can be represented as follows.

```
while more_symbols do
    while x > upper_threshold[s] do
        write_to_output ( mod(x, b) )
        x = floor(x, b)
    end while
    x = C(s, x)
end while
```

The outer while loop continues so long as there are more symbols to encode (i.e., more_symbols is true). For a given symbol s to be encoded, the RANS encoder performs operations that include operations of an inner while loop and coding function C(s, x). The RANS encoder selectively outputs encoded data from the state x in chunks of $\log_2(b)$ bits so long as the state x is greater than upper_threshold[s]. The value $\log_2(b)$ indicates a number of bits of encoded data (state) to be output. For example, $\log_2(b)$ is 8 to output a byte at a time, and b is 256. The value of upper_threshold[s] is the upper limit of an interval within which the state x of the RANS encoder should fall in order to encode the symbol s. If the state x is higher than the upper limit of the interval, bits are shifted out of the state x until the state x falls within the interval. The function write_to_output (mod(x, b)) outputs $\log_2(b)$ bits produced by mod(x, b), which are the $\log_2(b)$ least-significant bits of the state x. The state x is then adjusted by shifting $\log_2(b)$ bits out of the state x, according to floor(x, b). When the state x is less than or equal to the upper limit of the interval (that is, x<=upper_threshold[s]), the symbol s is encoded using the coding function C(s, x), producing an updated state x.

For corresponding decoding, the decoding function D(x) and logic that selectively shifts encoded data into the state x can be represented as follows.

```
while more_encoded_data do
    (s, x) = D(x)
    use(s)
    while x < lower_threshold do
        x = b × x + new_input
    end while
end while
```

The outer while loop continues so long as there is more encoded data to decode (i.e., more_encoded_data is true). For a given symbol s to be decoded, the RANS decoder performs operations that include the decoding function D(s, x), a function to use the symbol s, and operations of an inner while loop. The symbol s is decoded using the coding function D(x), which also produces an updated state x. The symbol s is used (as indicated by the use(s) function). Then, the RANS decoder selectively inputs encoded data in chunks of $\log_2(b)$ bits into the state x, so long as the state x is less than lower_threshold. The value $\log_2(b)$ indicates a number of bits of encoded data (state) to be input. For example, $\log_2(b)$ is 8 to input a byte at a time, and b is 256. The value of lower_threshold is the lower limit of an interval within which the state of the RANS decoder should fall in order to decode the next symbol s. If the state x is lower than the lower limit of the interval, bits are shifted into the state until the state x falls within the interval. Specifically, the state x is shifted by $\log_2(b)$ bits and a value new_input is added in, according to b×x+new_input. The value new_input has $\log_2(b)$ bits.

For additional explanation of RANS encoding and RANS decoding, see, e.g., Duda, "Asymmetric Numeral Systems: Entropy Coding Combining Speed of Huffman Coding with Compression Rate of Arithmetic Coding," 24 pp. (2014) and Duda et al., "The Use of Asymmetric Numeral Systems as an Accurate Replacement for Huffman Coding," IEEE, pp. 65-69 (2015).

VI. Example RANS Encoders and RANS Decoders.

Previous RANS encoding/decoding approaches provide good performance in many scenarios, but there is room for improvement in terms of computational efficiency for hardware implementations of RANS decoding and adaptiveness of RANS encoding/decoding. This section describes innovative features of RANS encoders and RANS decoders. The features include, but are not limited to, the following.

Two-phase implementation of RANS decoding. A RANS decoder can be implemented in hardware using a two-phase structure. In one phase (phase 0), RANS decoder state is selectively updated, potentially consuming encoded data. In the other phase (phase 1), new encoded data is selectively merged into the RANS decoder state, and an output symbol is selectively generated. The two-phase structure offers high throughput for a given amount of area and power. Also, compared to other RANS decoding implementations, the two-phase structure can permit higher clock rates. Also, the two-phase structure permits simultaneous (concurrent) decoding of multiple data streams (e.g., two data streams).

Configurable symbol width. A RANS encoder and RANS decoder can have a default symbol width that is configurable. For example, the default symbol width for symbols of a stream can be set to d bits, where d is between 2 and 9. This allows the same RANS encoder and RANS decoder to be used for various types of symbols.

Switchable static probability models. A RANS encoder and RANS decoder can switch between multiple static probability models. This can allow the RANS encoder/decoder to adapt quickly to changes in probability distributions of symbols. The static probability models can be represented in lookup tables or other "pluggable" structures. A selected static probability model can be signaled with a syntax element in a bitstream, which consumes few bits. A moderate number of probability models (e.g., 8, 16, or 32) can provide good compression efficiency without consuming too much storage or memory resources.

Selectively flushing RANS decoder state. A RANS decoder can selectively flush state between fragments during decoding. If compression efficiency is helped, the final state after decoding of one fragment can be used as the initial state for decoding of the next fragment. On the other hand, if compression efficiency is better when decoding for the next fragment starts with a new initial state, the state of the RANS decoder can be flushed and reinitialized. The decision about whether to flush RANS decoder state can be signaled with a syntax element in a bitstream, which consumes few bits.

Adjusting symbol width between fragments. A RANS encoder and RANS decoder can selectively adjust the symbol width of symbols for a fragment. Even if the symbols of a stream all have the same default symbol width, symbols in one fragment of the stream may have only low values (less than a threshold). In this case, the RANS encoder/decoder can adjust (narrow) the symbol width for the symbols in that fragment, thereby improving compression efficiency. The adjustment to symbol width can be signaled using a syntax element in the bitstream, which consumes few bits.

The foregoing innovative features can be used in combination or separately.

A. Example Configurations of RANS Encoders/Decoders.

FIG. 5 shows an example RANS encoder system (500) in which some described examples can be implemented. The RANS encoder system (500) includes a single RANS encoder (520), but in practice a RANS encoder system (500) can include multiple instances of RANS encoder (520). The modules shown in FIG. 5 are implemented with dedicated, special-purpose computing hardware (encoder logic, buffers, etc.) but can alternatively be implemented in software with general-purpose computing hardware.

In general, the RANS encoder (520) is configured to accept a stream of input symbols, encode the input symbols, and output encoded data as part of a bitstream. In some example implementations, the input symbols have an indicated symbol width, and the encoded data is arranged as bytes. Typically, the total number of bits output is less than the total number of bits input, providing compression.

The input symbol buffer (510) is configured to store input symbols for encoding. The input symbols have a symbol width (number of bits per symbol). The input symbols can represent parameters for quantized transform coefficients from media (e.g., video, images, audio, texture for graphics), parameters for other residual data from media, or other data. In general, RANS encoding/decoding tends to provide good compression efficiency for prediction residual values, for which symbols having a value of zero are most common, symbols having values close to zero are less common, and symbols having values further from zero are even more rare.

The input buffer (522) in the RANS encoder (520) is configured to store an input symbol (512), which is provided from the input symbol buffer (510). One or more registers (524) in the RANS encoder (520) are configured to store state information. The RANS encoder (520) is configured to encode the input symbol (512) using state information stored in the register(s) (524). As needed, the RANS encoder (520) writes encoded data to the output buffer (526), shifting the encoded data out of state information in the register(s) (524). The output buffer (526) is configured to store a portion (527) of encoded data. For example, the output buffer (526) is configured to store a byte of encoded data.

The encoded data buffer (540) is configured to store the portion (527) of encoded data, which is provided by the output buffer (526). The encoded data buffer (540) can store multiple portions of encoded data, until the encoded data (542) is provided to the multiplexer (550). The multiplexer (550) is configured to multiplex the encoded data (542) from the encoded data buffer (540) with other information (e.g., configuration information (528), initial state information (529), and data from other instances of RANS encoders).

In some example implementations, the RANS encoder (520) has a variable symbol width. For example, the RANS encoder (520) has an input parameter that indicates a default symbol width for input symbols provided from the input symbol buffer (510). Typically, the input parameter is set when the RANS encoder (520) is initialized. This allows the RANS encoder (520) to switch between different default symbol widths for different encoding sessions. For example, the default symbol width can be a value in the range of 2 bits to 9 bits. Alternatively, the default symbol width can have some other value (e.g., 1 bit, 10 bits, 12 bits, or more bits). In alternative example implementations, the input parameter that indicates the default symbol width can be changed during encoding. In other alternative example implementations, the RANS encoder (520) always encodes input symbols having a single, pre-defined symbol width.

In some example implementations, the RANS encoder (520) can change configuration parameters between fragments of input symbols/encoded data. A fragment can include a variable number of input symbols and variable amount of encoded data. The RANS encoder (520) is configured to set boundaries between fragments based on various factors. Primarily, the RANS encoder (520) is configured to change configuration parameters when doing so improves compression efficiency. The RANS encoder (520) can also be configured to set a boundary between fragments at an existing boundary in media content (e.g., picture, frame, coding unit, object) or to improve resilience to data loss (by allowing faster recovery from a known initial state).

In some example implementations, as shown in FIG. 5, the RANS encoder (520) is configured to access lookup tables that store probability information for different static probability models, for different symbol widths, during RANS encoding. Memory (530) is configured to store the lookup tables. In some example implementations, memory (530) is configured to store lookup tables for 16 different static probability models, for each symbol width possible. The RANS encoder (520) is configured to use a symbol width (521) and static probability model selector (523) as indices to the lookup tables, and is configured to receive probability information (532) in return. Alternatively, memory (530) can be configured to store lookup tables for more or fewer static probability models (e.g., a single static probability model), or the RANS encoder (520) can be configured to use a dynamic probability model. Instead of using lookup tables, a probability model can be represented in some other way (e.g., a formula or equation, which may use less storage but be slower than lookup operations). In the examples shown in FIG. 5 (with multiple static probability models), the RANS encoder (520) is configured to signal, as part of configuration information (528), a syntax element that indicates which static probability model is used during encoding and decoding. When the RANS encoder (520) switches configuration parameters between fragments, the RANS encoder (520) can switch static probability models from fragment to fragment. This allows the RANS encoder (520) to switch, in mid-stream, to a static probability model that provides more efficient compression given the local probability distribution of values of input symbols.

In some example implementations, the RANS encoder (520) is configured to adjust symbol width, relative to the default symbol width, for RANS encoding. This allows the RANS encoder (520) to decrease symbol width used for RANS encoding/decoding if the input symbols being encoded all have values below certain threshold values. For example, if the default symbol width is 8 bits for input symbols having values in the range of 0 . . . 255, but all of the input symbols have values less than 64, the symbol width used for compression can be 6 bits (because $2^6=64$, for a range of 0 . . . 63). In general, for a default symbol width d, values can be checked against thresholds $2^{d-1}$, $2^{d-2}$, $2^{d-3}$, and so on to determine whether symbol width can be decreased. In some example implementations, the adjustment to symbol width can be 0, −1, −2, or −3. Alternatively, other values for the adjustment to symbol width can be used. The RANS encoder (520) is configured to signal, as part of configuration information (528), a syntax element that indicates an adjustment to symbol width used during encoding and decoding. When the RANS encoder (520) switches configuration parameters between fragments, the RANS encoder (520) can switch the adjustment to symbol width from fragment to fragment. This allows the RANS encoder (520) to switch, in mid-stream, to a symbol width that provides more efficient compression given the local values of input symbols. In alternative example implementations, the RANS encoder (520) does not switch between different symbol widths.

In some example implementations, the RANS encoder (520) is configured to decide whether a corresponding RANS decoder will flush its state for a new fragment or use the final state from decoding the previous fragment as the initial state for the new fragment. The RANS encoder (520) is further configured to, when the RANS decoder state is flushed, determine and signal initial state information (529) for the new fragment. In practice, the initial state information (529) can be signaled as the first portions of the encoded data (542) for the new fragment. For example, the initial state information (529) includes four bytes of encoded data (542) or some other amount of encoded data (542). The RANS encoder (520) is configured to signal, as part of configuration information (528), a syntax element that indicates whether RANS decoder state should be flushed for a new fragment. The RANS encoder (520) can signal the syntax element per fragment. This allows the RANS encoder (520) to selectively retain RANS decoder state or flush decoder state, depending on which option provides more efficient compression. Even if the retained RANS decoder state is not ideal, using it saves signaling of initial state information (529) for the new fragment. In alternative example implementations, the RANS encoder (520) always flushes RANS decoder state between fragments. In other alternative example implementations, the RANS encoder (520) always retains RANS decoder state between fragments.

FIG. 6 shows an example RANS decoder system (600) in which some described examples can be implemented. The RANS decoder system (600) includes a single RANS decoder (630), but in practice a RANS decoder system (600) can include multiple instances of RANS decoder (630). The modules shown in FIG. 6 are implemented with dedicated, special-purpose computing hardware (decoder logic, buffers, etc.) but can alternatively be implemented in software with general-purpose computing hardware.

In general, the RANS decoder (630) is configured to receive encoded data as part of a bitstream, decode output symbols, and generate a stream of output symbols. In some example implementations, the encoded data is arranged as bytes, and the output symbols have an indicated symbol width. Typically, the total number of bits output is greater than the total number of bits input, providing decompression.

The demultiplexer (610) is configured to demultiplex the encoded data (612) from the input bitstream, along with demultiplexing other information (e.g., configuration information (614), initial state information (616), and data for other instances of RANS decoders). The demultiplexer (610) is configured to provide the encoded data (612) to the encoded data buffer (620), which is configured to store the encoded data (612) and provide it, as needed, to the RANS decoder (630). The encoded data buffer (620) can store multiple portions (e.g., bytes) of encoded data, until the respective portions (622) are provided to the RANS decoder (630).

The input buffer (632) is configured to store a portion of encoded data provided by the encoded data buffer (620). For example, the input buffer (632) is configured to store a byte of encoded data. The RANS decoder (630) is configured to read a portion of encoded data from the input buffer (632), as needed, shifting the portion of encoded data into state information. One or more registers (634) in the RANS decoder (630) are configured to store the state information. The RANS decoder (630) is configured to decode an output symbol using state information stored in the register(s) (634). The RANS decoder (630) can perform decoding using a two-phase structure, as described in the next section, or some other approach. The output buffer (636) in the RANS decoder (630) is configured to store an output symbol (638), which is subsequently provided to the symbol vector buffer (650).

The symbol vector buffer (650) is configured to store output symbols generated in the decoding. The output symbols have a symbol width (number of bits per symbol). The output symbols can represent parameters for quantized transform coefficients from media (e.g., video, images, audio, texture for graphics), parameters for other residual data from media, or other data.

In some example implementations, the RANS decoder (630) has a variable symbol width. For example, the RANS decoder (630) has an input parameter that indicates a default symbol width for output symbols generated by the RANS decoder (630). Typically, the input parameter is set when the RANS decoder (630) is initialized. This allows the RANS decoder (630) to switch between different default symbol widths for different decoding sessions. For example, the default symbol width can be a value in the range of 2 bits to 9 bits. Alternatively, the default symbol width can have some other value (e.g., 1 bit, 10 bits, 12 bits, or more bits). In alternative example implementations, the input parameter that indicates the default symbol width can be changed during decoding. In other alternative example implementations, the RANS decoder (6300) always decodes output symbols having a single, pre-defined symbol width.

In some example implementations, the RANS decoder (630) can change configuration parameters between fragments of output symbols/encoded data. A fragment can include a variable number of output symbols and variable amount of encoded data. The RANS decoder (630) is configured to determine boundaries between fragments based on information signaled in the bitstream (e.g., counts of bytes of encoded data in the respective fragments, presence of start codes or other markers in the bitstream).

In some example implementations, as shown in FIG. 6, the RANS decoder (630) is configured to access lookup tables that store probability information for different static probability models, for different symbol widths, during RANS decoding. Memory (640) is configured to store the lookup tables. In some example implementations, memory (640) is configured to store lookup tables for 16 different static probability models, for each symbol width possible. The RANS decoder (640) is configured to use a symbol width (631) and static probability model selector (633) as indices to the lookup tables, and is configured to receive probability information (642) in return. Alternatively, memory (640) can be configured to store lookup tables for more or fewer static probability models (e.g., a single static probability model), or the RANS decoder (630) can be configured to use a dynamic probability model. Instead of using lookup tables, a probability model can be represented in some other way (e.g., a formula or equation, which may use less storage but be slower than lookup operations). In the examples shown in FIG. 6 (with multiple static probability models), the RANS decoder (630) is configured to receive, as part of configuration information (614), a syntax element that indicates which static probability model is used during decoding. When the RANS decoder (630) switches configuration parameters between fragments, the RANS decoder (630) can switch static probability models from fragment to fragment. This allows the RANS decoder (630) to switch, in mid-stream, to a static probability model that provides more efficient compression given the local probability distribution of values of input symbols.

In some example implementations, the RANS decoder (630) is configured to adjust symbol width, relative to a default symbol width, for RANS decoding. This allows the RANS decoder (520) to decrease symbol width used for RANS decoding if the output symbols being decoded all have values below certain threshold values, as explained above. In some example implementations, the adjustment to symbol width can be 0, −1, −2, or −3. Alternatively, other values for the adjustment to symbol width can be used. The RANS decoder (630) is configured to receive, as part of configuration information (614), a syntax element that indicates an adjustment to symbol width used during decoding. When the RANS decoder (630) switches configuration parameters between fragments, the RANS decoder (630) can switch the adjustment to symbol width from fragment to fragment. This allows the RANS decoder (630) to switch, in mid-stream, to a symbol width that provides more efficient compression given the local values of input symbols. In alternative example implementations, the RANS decoder (630) does not switch between different symbol widths.

In some example implementations, the RANS decoder (630) is configured to decide whether to flush its state for a new fragment or use the final state from decoding the previous fragment as the initial state for the new fragment. The RANS decoder (630) is further configured to, when the RANS decoder state is flushed, receive initial state information (616) for the new fragment. In practice, the initial state information (616) can be signaled as the first portions of the encoded data (612) for the new fragment. For example, the initial state information (616) includes four bytes of encoded data (612) or some other amount of encoded data (612). The RANS decoder (630) is configured to receive, as part of configuration information (614), a syntax element that whether RANS decoder state should be flushed for a new fragment. The RANS decoder (630) can receive the syntax element per fragment. This allows the RANS decoder (630) to selectively retain RANS decoder state or flush decoder state. In alternative example implementations, the RANS decoder (630) always flushes RANS decoder state between fragments. In other alternative example implementations, the RANS decoder (630) always retains RANS decoder state between fragments.

B. Generalized RANS Encoding/Decoding Techniques.

FIGS. 7a and 7b show an example technique (700) for RANS encoding and example technique (750) for RANS decoding, respectively. The example technique (700) for RANS encoding can be performed, for example, by an encoding tool that implements a RANS encoder as described with reference to FIG. 5 or other RANS encoder. The example technique (750) for RANS decoding can be performed, for example, by a decoding tool that implements a RANS decoder as described with reference to FIG. 6 or other RANS decoder.

With reference to FIG. 7a, the encoding tool encodes (720) input symbols using a RANS encoder, thereby generating encoded data for at least part of a bitstream. Typically, the input symbols are for residual data for media (e.g., video, image, audio, texture for graphics) but alternatively the input symbols can be for some other type of data. The RANS encoder implements one or more of the innovations described herein. For example, the RANS encoder implements operations as described with reference to FIG. 10a, FIG. 11a, FIG. 12a, and/or FIG. 13a. Alternatively, the RANS encoder implements other and/or additional operations for RANS encoding.

The encoding tool outputs (730) the encoded data for the at least part of the bitstream. The encoded data can include syntax elements that indicate configuration parameters, as described with reference to FIG. 11a, FIG. 12a, and/or FIG. 13a. Alternatively, the encoded data can include syntax elements that indicate other and/or additional configuration parameters.

The example technique (700) can be performed as a method by an encoding tool. A computer system that includes a RANS encoder and encoded data buffer can be configured to perform the example technique (700). One or more computer-readable media can have stored thereon computer-executable instructions for causing one or more processors, when programmed thereby, to perform the example technique (700). Further, one or more computer-readable media may have stored thereon encoded data produced by the example technique (700).

With reference to FIG. 7b, the decoding tool receives (760) encoded data for at least part of a bitstream. The encoded data can be stored, for example, in an encoded data buffer that is configured to store the encoded data. The encoded data can include syntax elements that indicate configuration parameters, as described with reference to FIG. 11b, FIG. 12b, and/or FIG. 13b. Alternatively, the encoded data can include syntax elements that indicate other and/or additional configuration parameters.

The decoding tool decodes (770) the encoded data for the at least part of the bitstream using a RANS decoder, thereby generating output symbols. Typically, the output symbols are for residual data for media (e.g., video, image, audio, texture for graphics) but alternatively the output symbols can be for some other type of data. The RANS decoder implements one or more of the innovations described herein. For example, the RANS decoder implements operations as described with reference to FIGS. 9a-9d, FIG. 10b, FIG. 11b, FIG. 12b, and/or FIG. 13b. Alternatively, the RANS decoder implements other and/or additional operations for RANS decoding.

The example technique (750) can be performed as a method by a decoding tool. A computer system that includes an encoded data buffer and a RANS decoder can be configured to perform the example technique (750). One or more computer-readable media can have stored thereon computer-executable instructions for causing one or more processors, when programmed thereby, to perform the example technique (750). Further, one or more computer-readable media may have stored thereon encoded data organized for decoding according to the example technique (750).

C. Examples of RANS Decoding with a Two-Phase Structure.

This section describes two-phase implementations of RANS decoding that are computationally simple and fast. In special-purpose hardware, the two-phase implementations can be realized in compact configurations of components. In terms of compression efficiency, the two-phase implementations benefit from the compression efficiency of RANS encoding. In particular, when implemented with fragment-adaptive selection of static probability models and adjustable symbol widths, the two-phase implementations of RANS decoding provide excellent overall performance in many scenarios.

FIG. 8 shows phases of an example two-phase structure (800) for RANS decoding according to some examples described herein. In the approach shown in FIG. 8, RANS decoding operations are divided into two phases. In one phase (phase 0), a RANS decoder consumes input encoded data. In the other phase (phase 1), the RANS decoder generates output symbols. In some example implementations, each phase happens in a separate clock cycle. In alternative example implementations, the two phases happen in the same clock cycle. The phases shown in the two-phase structure (800) are logical phases. Decoding operations are iteratively performed in phase 0 processing, then phase 1 processing, then phase 0 processing, then phase 1 processing, and so on.

The output buffer (810) is configured to store an output symbol from a previous iteration, if there is a valid output symbol from the previous iteration. The register (820) is configured to store state information, which is shown as RANS state P1 as phase 0 begins. In some example implementations, the decoder state is a 32-bit value. Alternatively, the decoder state can have some other number of bits.

In phase 0, the RANS decoder selectively updates the RANS decoder state, potentially consuming encoded data in the RANS decoder state. The RANS decoder determines whether there is an output symbol from the previous iteration (valid output symbol) in the output buffer (810). If so, the RANS decoder determines (830) forward probability information for the output symbol (e.g., using one or more lookup tables) and updates (840) the RANS decoder state using the forward probability information. Thus, if the output buffer (810) stores an output symbol from a previous iteration (valid output symbol), the RANS decoder state is updated using the forward probability information for that output symbol, producing RANS state P0. Otherwise (no valid output symbol), RANS decoder state is unchanged in phase 0 (that is, RANS state P0 is set to RANS state P1). In particular, if the state x (that is, RANS state P1) is updated in phase 0, the new state x (that is, RANS state P0) is calculated using operations equivalent to the following, which are explained in section V:

$$x = f_s^*(x >> n) + (x \& \text{mask}) - c_s$$

An example of such operations is explained in section VI.M. This consumes encoded data as the encoded data is shifted out of the state. In some iterations, however, the RANS decoder state is not updated, and encoded data is not consumed.

After phase 0 processing, the register (820) stores the selectively updated RANS decoder state, which is designated RANS state P0.

As part of phase 1 processing, the RANS decoder selectively merges (860) a portion (e.g., byte) of encoded data from the input buffer (850) into the RANS decoder state. If the RANS decoder state (shown as RANS state P0 as phase 1 begins) is below a threshold amount, the RANS decoder shifts the RANS decoder state and adds the portion of encoded data from the input buffer (850). Otherwise, the RANS decoder state is unchanged in phase 1 (that is, RANS state P1 is set to RANS state P0). Thus, in some iterations, no encoded data is merged into the RANS decoder state. In any case, after phase 1 processing, the register (820) stores the RANS decoder state (shown as RANS state P1 as phase 1 ends).

In some example implementation, the RANS decoder state is a 32-bit value, and the 32-bit value is compared to a threshold. For example, the threshold is $2^{24}$. If the RANS decoder state is less than the threshold, the RANS decoder state is shifted to the left by 8 bits, and a byte of encoded data is added to the RANS decoder state. That is, the state x is updated using operations equivalent to the following.

$$x = x << 8 + \text{encoded\_data\_byte}.$$

An example of such operations is explained in section VI.M.

According to the example two-phase structure (800) shown in FIG. 8, at most one portion of encoded data is added to the RANS decoder state per iteration of phase 1 processing. If a portion of encoded data is added to the RANS decoder state, a new portion of encoded data can be read into the input buffer (e.g., as part of phase 0 processing in the next iteration). To merge multiple portions of encoded data into the RANS decoder state, the portions are added in successive iterations of phase 1 processing, until the RANS decoder state is no longer less than the threshold, at which point a new output symbol can be generated.

Still as part of phase 1 processing, the RANS decoder selectively generates an output symbol from the RANS decoder state. The RANS decoder determines whether the RANS decoder state (RANS state P1, after the selective merger of encoded data) is sufficient to generate an output symbol. If so, the RANS decoder determines (870) inverse probability information (e.g., using one or more lookup tables) and generates an output symbol. The RANS decoder evaluates some section of the state of the RANS decoder, which indicates rolling probabilities for different values of the output symbol, in order to find the output symbol. On the other hand, if the RANS decoder state (RANS state P1, after the selective merger of encoded data) is not sufficient to generate an output symbol, no output symbol is generated. Thus, in some iterations, no output symbols are generated.

When an output symbol is generated, the output symbol is stored in the output buffer (810). Processing continues in another iteration of phase 0 processing.

Overall, the sequence of RANS decoding operations with the two-phase structure is different than prior approaches in several respects. With the two-phase structure, input encoded data is consumed at a limited rate (e.g., at most one byte at a time), while additional encoded data is needed in the RANS decoder state. Also, selective merging operations to merge at most one byte of encoded data are interleaved with operations to selectively generate at most one output symbol and operations to selectively update the RANS decoder state. The stages for selective updating RANS decoder state, selective merging encoded data into RANS decoder state, and selectively generating an output symbol are discrete, predictable, and structured, which makes them well-suited for hardware implementations.

D. Examples of RANS Decoding with Two-Phase Structure.

FIG. 9a shows an example technique (900) for RANS decoding with a two-phase structure. The example technique (900) can be performed, for example, by a decoding tool that implements a RANS decoder as described with reference to FIG. 6 or other RANS decoder, as part of the decoding stage (770) shown in FIG. 7b. In any case, the RANS decoder is configured for perform various operations for RANS decoding with a two-phase structure. The two phases are logical phases, whose operations can be performed in different clock cycles or in the same clock cycle. FIGS. 9b-9d show details of operations that can be performed for operations shown more generally in FIG. 9a.

The decoding tool can initialize the RANS decoder by reading one or more syntax elements from a header for at least part of a bitstream (e.g., for a fragment) and configuring the RANS decoder based at least in part on the syntax element(s). For example, the syntax element(s) can include a syntax element that indicates an adjustment to symbol width for the encoded data for the at least part of the bitstream, in which case the decoding tool configures the RANS decoder to perform RANS decoding at the adjusted symbol width. Or, as another example, the syntax element(s) can include a selection of a static probability model from among multiple available static probability models, in which case the decoding tool configures the RANS decoder to perform RANS decoding using the selected static probability model. Or, as another example, the syntax element(s) can include a syntax element that indicates whether or not the state of the RANS decoder is to be flushed and re-initialized for decoding of the encoded data for the at least part of the bitstream, in which case the RANS decoder selectively flushes and reloads the state of the RANS decoder. To reload the state of the RANS decoder, the RANS decoder can retrieve initial state information for the at least part of the bitstream and load an initial state, as the state of the RANS decoder, based at least in part on initial state information. Alternatively, the decoding tool can configure the RANS decoder in other ways. In some example implementations, the RANS decoder is initialized as part of iterations of processing with a two-phase structure, with configuration operations happening in one or both of the phases for some iterations. Alternatively, the RANS decoder can be initialized with separate operations, before iterations of processing with the two-phase structure begin.

As part of a first phase (phase 0 in some examples described herein), the RANS decoder selectively updates (910) the state of the RANS decoder using probability information for an output symbol from a previous iteration. In some example implementations, as shown in the example (911) of FIG. 9b, the RANS decoder determines (912) whether an output symbol from the previous iteration was generated. If so, the RANS decoder determines (914) probability information for the output symbol from the previous iteration, and adjusts (916) the state of the RANS decoder using the probability information. Adjusting the state of the RANS decoder consumes at least some of the state of the RANS decoder (and hence consumes some of the encoded data). For example, the probability information used during phase 0 processing is forward probability information. The RANS decoder can determine the probability information for the output symbol from the previous iteration by performing lookup operations in one or more lookup tables (e.g., using a symbol width and/or selected static probability model as indexes to the lookup table(s)), or in some other way. When the state of the RANS decoder is updated in the first phase, a value for the state x is calculated using operations equivalent to the following, which are explained in section V:

$$x = f_s^*(x>>n) + (x\ \&\ \text{mask}) - c_s.$$

Section VI.M describes one example of such operations. In that example, the probability information for the output symbol from the previous iteration includes a sub-range size fwd_f and a cumulative sub-range threshold fwd_cf. To adjust the state x of the RANS decoder, the RANS decoder performs adjustments equivalent to:

$$x = \text{fwd\_f} \times x[\text{upper}] + x[\text{lower}] - \text{fwd\_cf},$$

where x represents the state of the RANS decoder after the adjusting, x[upper] represents an upper portion of the state of the RANS decoder before the adjusting, and x[lower] represents a lower portion of the state of the RANS decoder before the adjusting.

On the other hand, if the RANS decoder determines that no output symbol from the previous iteration was generated (that is, no valid output symbol was generated), the RANS decoder skips the adjusting the state of the RANS decoder. In this case, the state of the RANS decoder is unchanged (e.g., RANS state P0 is set to RANS state P1 in FIG. 8).

Alternatively, the RANS decoder performs other operations to selectively update (910) the state of the RANS decoder using probability information for an output symbol from a previous iteration.

As part of a second phase (phase 1 in some examples described herein), the RANS decoder selectively merges (920) a portion (e.g., byte) of encoded data from an input buffer into the state of the RANS decoder. The input buffer can be configured to store one byte of the encoded data at a time or some other amount of encoded data.

In some example implementations, as shown in the example (921) of FIG. 9c, the RANS decoder determines (922) whether the state of the RANS decoder satisfies a threshold. For example, the RANS decoder compares the state of the RANS decoder to the threshold. The state of the RANS decoder satisfies the threshold if the state of the RANS decoder is less than the threshold.

If the state of the RANS decoder satisfies the threshold, the RANS decoder combines (924) the portion of the encoded data and the state of the RANS decoder. For example, the RANS decoder shifts the state of the RANS decoder by a given number of bits, and adds the portion of the encoded data, which has the given number of bits. In some example implementations, the state x of the RANS decoder is tracked as a 32-bit value, and the state x is updated using operations equivalent to the following.

$$x = x<<8 + \text{encoded\_data\_byte}.$$

Section VI.M describes an example of such operations.

On the other hand, if the state of the RANS decoder does not satisfy the threshold, the RANS decoder skips combining the portion of the encoded data and the state of the RANS decoder. In this case, no input encoded data is merged into the state of the RANS decoder for the current iteration.

Alternatively, the RANS decoder performs other operations to selectively merge (920) a portion of the encoded data from the input buffer into the state of the RANS decoder.

As part of the second phase, the RANS decoder also selectively generates (930) an output symbol for a current iteration using the state of the RANS decoder. For example, the output symbol is for residual data for media. Alternatively, the output symbol is for some other type of data.

In some example implementations, as shown in the example (931) of FIG. 9d, the RANS decoder determines (932) whether the state of the RANS decoder includes sufficient information to generate the output symbol for the current iteration.

If so, the RANS decoder determines (934) inverse probability information. For example, the RANS decoder performs lookup operations in one or more lookup tables. The RANS decoder then finds (936) the output symbol for the current iteration using the inverse probability information and the state of the RANS decoder. For example, the RANS decoder determines a sub-range of the state of the RANS decoder that is associated with the output symbol for the current iteration. Section VI.M describes an example of such operations.

On the other hand, if the state of the RANS decoder does not include sufficient information to generate an output symbol for the current iteration, the RANS decoder skips finding the output symbol for the current iteration. In this case, no output symbol is generated for the current iteration.

Alternatively, the RANS decoder performs other operations to selectively generate (930) an output symbol for the current iteration using the state of the RANS decoder.

With reference to FIG. 9a, the RANS decoder checks (940) whether to continue and, if so, continues processing in the first phase. In this way, the RANS decoder iteratively performs processing for the first phase and processing for the second phase. Thus, the RANS decoder repeats the selective updating (910), selective merging (920), and selective generating (930) in successive iterations, until there are no more output symbols to decode in the encoded data for the at least part of the bitstream.

As part of the first phase, the RANS decoder can perform other operations (not shown). For example, the RANS decoder can selectively re-fill the input buffer from the encoded data buffer, adding a new portion (e.g., byte) of encoded data. Or, as another example, the RANS decoder can selectively write the output symbol from the previous iteration to a symbol vector buffer.

In some example implementations, the RANS decoder is implemented with special-purpose hardware. The special-purpose hardware includes the input buffer, an output buffer, and a state register. The output buffer is configured to store the output symbol from the previous iteration, if any, until replacement with the output symbol for the current iteration, if any. The state register is configured to store a value that represents the state of the RANS decoder. The special-purpose hardware further includes logic (coupled to the output buffer and to the state register) configured to perform the selective updating (910) operations, logic (coupled to the state register and the input buffer) configured to perform the selective merging (920) operations, and logic (coupled to the state register and the output buffer) configured to perform the selective generating (930) operations. Alternatively, the RANS decoder can be implemented using other components.

E. Examples of RANS Encoding/Decoding with Adaptive Symbol Widths.

In some previous approaches, a RANS encoder and RANS decoder process symbols having a single, pre-defined symbol width. Such a RANS encoder and RANS decoder are unable to process symbols having different symbol widths.

This section describes examples of a RANS encoder and RANS decoder with a configurable symbol width. In particular, in some example implementations, an input parameter to a hardware-based RANS encoder or hardware-based RANS decoder indicates a symbol width to use for an encoding/decoding session. Having a configurable symbol width allows the RANS encoder/decoder to work with symbols having any symbol width within a range of different symbol widths.

FIG. 10a shows an example technique (1000) for RANS encoding with adaptive symbol width. The example technique (1000) can be performed, for example, by an encoding tool that implements a RANS encoder as described with reference to FIG. 5 or other RANS encoder, as part of the encoding stage (720) shown in FIG. 7a.

To start, as part of encoding input symbols using a RANS encoder, the encoding tool selects (1010) a symbol width from among multiple available symbol widths. For example, the multiple available symbol widths include 1 bit, 2 bits, 3 bits, 4 bits, 5 bits, 6 bits, 7 bits, 8 bits, 9 bits, 10 bits, 11 bits, and 12 bits. Alternatively, the multiple available symbol widths include other and/or additional symbol widths.

The encoding tool configures (1020) the RANS encoder to perform RANS encoding at the selected symbol width. In particular, the encoding tool selects a set of pre-defined lookup tables having probability information for the selected symbol width. For example, the set of pre-defined lookup tables includes one or more pre-defined lookup tables with forward probability information for the selected symbol width and one or more pre-defined lookup tables with inverse probability information for the selected symbol width. The set of pre-defined lookup tables can incorporate a static probability model, for encoded data, selected from among multiple available static probability models for different sets of pre-defined lookup tables. Alternatively, the pre-defined lookup tables can include probability information for only a single static probability model for the selected symbol width, or the RANS encoder can use a dynamic probability model for the selected symbol width.

The encoding tool performs (1030) the RANS encoding at the selected symbol width. As part of the RANS encoding, the encoding tool can selectively determine initial state information for a RANS decoder (e.g., for a fragment). In this case, the encoded data output by the RANS encoder includes the initial state information.

FIG. 10b shows an example technique (1050) for RANS decoding with adaptive symbol width. The example technique (1050) can be performed, for example, by a decoding tool that implements a RANS decoder as described with reference to FIG. 6 or other RANS decoder, as part of the decoding stage (770) shown in FIG. 7b.

To start, as part of decoding encoded data using a RANS decoder, the decoding tool selects (1060) a symbol width from among multiple available symbol widths. For example, the multiple available symbol widths include 1 bit, 2 bits, 3 bits, 4 bits, 5 bits, 6 bits, 7 bits, 8 bits, 9 bits, 10 bits, 11 bits, and 12 bits. Alternatively, the multiple available symbol widths include other and/or additional symbol widths.

The decoding tool configures (1070) the RANS decoder to perform RANS decoding at the selected symbol width. In particular, the decoding tool selects a set of pre-defined lookup tables having probability information for output symbols of the selected symbol width. For example, the set of pre-defined lookup tables includes one or more pre-defined lookup tables with forward probability information for the selected symbol width and one or more pre-defined lookup tables with inverse probability information for the selected symbol width. The set of pre-defined lookup tables can incorporate a static probability model, for encoded data, selected from among multiple available static probability models for different sets of pre-defined lookup tables. Alternatively, the pre-defined lookup tables can include probability information for only a single static probability model for the selected symbol width, or the RANS decoder can use a dynamic probability model for the selected symbol width.

The decoding tool performs (1080) the RANS decoding at the selected symbol width. The RANS decoding can include operations that use a two-phase structure, as described with reference to FIGS. 9a-9d. Alternatively, the RANS decoding can use other operations that implement RANS decoding. As part of the RANS decoding, the decoding tool can receive initial state information for the RANS decoder (e.g., for a fragment) and set the RANS decoder state according. In this case, the encoded data received by the RANS decoder includes the initial state information.

For the examples described with reference to FIGS. 10a and 10b, a header in the bitstream can include a syntax element that indicates the selected symbol width. Depending on which features of fragment-adaptive RANS encoding are used, the header in the bitstream can also include (a) a syntax element that indicates whether or not state of the RANS decoder is to be flushed/re-initialized for decoding, (b) a syntax element that indicates an adjustment to the selected symbol width, (c) a syntax element that indicates a selection of a static probability model, and/or (d) one or more other syntax elements that indicate configuration parameters.

F. Examples of Selectively Flushing RANS Decoder State Between Fragments.

When a RANS decoder finishes generating output symbols from encoded data for a fragment, the state of the RANS decoder may still contain useful state information. That useful state information is lost if the RANS decoder flushes and re-initializes the RANS decoder state for decoding of another fragment.

This section describes various aspects of selective flushing of RANS decoder state between fragments. A RANS encoder can decide whether RANS decoder state should be retained or flushed/re-initialized for decoding of a new fragment. For example, for a fragment (or the first p symbols of the fragment, where p is a number such as 1, 3, 5, 10, or 15 that depends on implementation), the RANS encoder can evaluate compression efficiency with the RANS decoder state retained versus compression efficiency with RANS decoder state flushed/re-initialized. In doing so, the RANS encoder can account for the overhead cost of signaling state information if the RANS decoder state is flushed/re-initialized. Alternatively, the RANS encoder can perform other operations to decide whether RANS decoder state should be retained or flushed/re-initialized for decoding of a new fragment.

The RANS encoder sets a syntax element that indicates whether RANS decoder state for a fragment should be retained or flushed/re-initialized. In some example implementations, the syntax element is a 1-bit flag in a header for the fragment. If the RANS decoder state is flushed/re-initialized, the RANS encoder also determines and signals state information for the fragment. In some example implementations, the state information is signaled as the first few bytes (e.g., 4 bytes) of encoded data for the fragment. Thus, retaining RANS decoder state from a previous fragment saves encoded data.

A RANS decoder receives and parses the syntax element that indicates whether RANS decoder state for a fragment should be retained or flushed/re-initialized. If RANS decoder state is retained, the RANS decoder uses the final RANS decoder state from the previous fragment as the initial RANS decoder state for the new fragment. Otherwise, the RANS decoder flushes (sets to zero) the RANS decoder state and re-initializes it by loading state information signaled for the new fragment (e.g., as part of encoded data for the fragment).

G. Examples of RANS Encoding/Decoding with Selective Flushing of RANS Decoder State Between Fragments.

FIG. 11a shows an example technique (1100) for RANS encoding with selective flushing of RANS decoder state between fragments. The example technique (1100) can be performed, for example, by an encoding tool that implements a RANS encoder as described with reference to FIG. 5 or other RANS encoder, as part of the encoding stage (720) shown in FIG. 7a.

To start, as part of encoding input symbols using a RANS encoder, the encoding tool determines (1110) whether or not state of a RANS decoder is to be flushed and re-initialized for decoding of encoded data for at least part of the bitstream (in FIG. 11a, for a fragment). The encoding tool sets (1120) a syntax element that indicates whether or not the state of the RANS decoder is to be flushed/re-initialized for decoding of the encoded data for the at least part of the bitstream.

The encoding tool checks (1130) whether the RANS decoder state is to be flushed/reinitialized. If so, the encoding tool determines (1132) initial state information for the encoded data for the at least part of the bitstream. In this case, the bitstream includes (e.g., as part of the encoded data) the initial state information. For example, the initial state information is a 32-bit value. Otherwise, the bitstream lacks initial state information for the encoded data for the at least part of the bitstream. The encoding tool performs (1140) RANS encoding.

The encoding tool can repeat the technique (1100) on a fragment-by-fragment basis. In FIG. 11a, the encoding tool checks (1142) whether to continue for the next fragment and, if so, determines (1110) whether or not state of a RANS decoder is to be flushed/re-initialized for decoding of encoded data for the next fragment. In this case, each of the fragments includes its own header having a syntax element that indicates whether or not the state of the RANS decoder is to be flushed/re-initialized for decoding of encoded data for that fragment.

FIG. 11b shows an example technique (1150) for RANS decoding with selective flushing of RANS decoder state between fragments. The example technique (1150) can be performed, for example, by a decoding tool that implements a RANS decoder as described with reference to FIG. 6 or other RANS decoder, as part of the decoding stage (770) shown in FIG. 7b.

To start, as part of decoding encoded data using a RANS decoder, the decoding tool reads (1160) a syntax element. The syntax element indicates whether or not state of a RANS decoder is to be flushed/re-initialized for decoding of the encoded data for at least part of the bitstream (in FIG. 11b, for a fragment).

Based at least in part on the syntax element, the decoding tool determines (1170) whether or not the state of the RANS decoder is to be flushed/re-initialized for decoding of the encoded data for the at least part of the bitstream.

The decoding tool checks (1180) whether the RANS decoder state is to be flushed/reinitialized. If so, the decoding tool retrieves (1182) initial state information for the encoded data for the at least part of the bitstream, flushes the state of the RANS decoder, and loads (1184) an initial state, as the state of the RANS decoder, based at least in part on the initial state information. In this case, the bitstream includes (e.g., as part of the encoded data) the initial state information for the encoded data for the at least part of the bitstream. For example, the initial state information is a 32-bit value. Otherwise, the bitstream lacks initial state information for the encoded data for the at least part of the bitstream.

The decoding tool performs (1190) RANS decoding of the encoded data for the at least part of the bitstream. The RANS decoding can include operations that use a two-phase structure, as described with reference to FIGS. 9a-9d. (In some example implementations, the first four bytes of encoded data for a fragment can be used to re-fill RANS decoder state (stages 1182, 1184), as four iterations through phase 1 processing when there is not enough RANS decoder state to generate an output symbol.) Alternatively, the RANS decoding can use other operations that implement RANS decoding.

The decoding tool can repeat the technique (1150) on a fragment-by-fragment basis. In FIG. 11*b*, the decoding tool checks (1192) whether to continue for the next fragment and, if so, reads (1160) a syntax element for the next fragment. In this case, each of the fragments includes its own header having a syntax element that indicates whether or not the state of the RANS decoder is to be flushed/re-initialized for decoding of encoded data for that fragment.

For the examples described with reference to FIGS. 11*a* and 11*b*, a header in the bitstream includes the syntax element that indicates whether or not the state of the RANS decoder is to be flushed/re-initialized for decoding of the encoded data for the at least part of the bitstream. Depending on which features of fragment-adaptive RANS encoding/decoding are used, the header in the bitstream can also include (a) a syntax element that indicates an adjustment to the selected symbol width, (b) a syntax element that indicates a selection of a static probability model from among multiple available static probability models, and/or (c) one or more other syntax elements that indicate configuration parameters.

H. Examples of Switching Between Multiple Static Probability Models for Fragments.

In some previous approaches, a RANS encoder and RANS decoder using a single static probability model or a single dynamic probability model. When a single static probability model is used, compression efficiency suffers if the distribution of values for symbols deviates from the expected distribution reflected in the single static probability model. Using a dynamic probability model helps compression efficiency even if the distribution of values for symbols deviates from an expected distribution, but updating the dynamic probability model can be computationally costly, especially for hardware implementations of RANS decoding.

This section describes various aspects of switching static probability models for fragments of symbols during RANS encoding/decoding. A RANS encoder and RANS decoder store values for multiple static probability models. Different static probability models can differ in terms of expected distribution of values of symbols. In some example implementations, values for static probability models are organized as one or more lookup tables, indexed by identifier of static probability model. Alternatively, a static probability model can be represented in some other way (e.g., a formula or equation). A static probability model can be a piece-wise linear approximation of a curve for a cumulative probability function for values of symbols. The curve monotonically increases. For some static probability models, the curve is flatter. For other static probability models, the curve is steeper for common values (e.g., zero, low values). Section VI.M describes examples of static probability models.

A RANS encoder selects one of the static probability models to use for a fragment of symbols, signaling a syntax element that indicates the selected static probability model. In some example implementations, there are 16 static probability models, and the selected static probability model is signaled with a 4-bit fixed length value. Alternatively, the RANS encoder and RANS decoder can use more or fewer static probability models.

In general, the symbols of a fragment are encoded/decoded using the same static probability model. The RANS encoder selects one of the static probability models depending on the distribution of values for the symbols of the fragment. The selection process depends on implementation. For example, the RANS encoder can evaluate v input symbols (where v is 1, 10, 20, 100, or some other number of input symbols) to determine which static probability model provides the highest compression efficiency for the v input symbols, and what the relative benefit of switching to that static probability model would be. If switching to a new static probability model involves starting a new fragment, the RANS encoder considers the signaling overhead (header bytes) for the switch. (Although the RANS encoder could potentially switch for very short fragments of symbols, the overhead costs would be high.) The RANS encoder can decide whether the improvement in compression efficiency for a switch to another static probability model (for another fragment) justifies the overhead cost of switching fragments. In this way, the RANS encoder can consider which static probability models to use when determining where to introduce fragment boundaries, with associated switches in static probability models.

Compared to using a single static probability model, switching between multiple static probability models can help RANS encoding/decoding handle streams of input symbols that have different probability distributions (e.g., more zeros than expected; fewer zeros than expected). Although storing values for multiple static probability models can be expensive in terms of storage, static probability models can be switched using simple and efficient signaling. Sending a syntax element to select one of the multiple static probability models uses less bitrate than sending a new static probability model, and it is simpler (and faster) than updating a dynamic probability model.

I. Examples of RANS Encoding/Decoding with Switching Static Probability Models Between Fragments.

FIG. 12*a* shows an example technique (1200) for RANS encoding with switching of static probability models between fragments. The example technique (1200) can be performed, for example, by an encoding tool that implements a RANS encoder as described with reference to FIG. 5 or other RANS encoder, as part of the encoding stage (720) shown in FIG. 7*a*.

To start, as part of encoding input symbols using a RANS encoder, the encoding tool selects (1210), for encoded data for at least part of a bitstream, one of multiple available static probability models. For example, the multiple available static probability models include static probability models for which residual data values are successively more likely to be zero. The static probability models are predefined, and a given static probability model does not dynamically change during encoding/decoding. The static probability models can be represented in values of predefined lookup tables with probability information for the static probability models, respectively. Alternatively, the static probability models can be represented in some other way.

When it selects the static probability model, the encoding tool can consider any of various factors. For example, the encoding tool can select the static probability model based at least in part on evaluation of probability distribution of values of the input symbols. Or, as another example, the encoding tool can select the static probability model based at least in part on estimation of which of the multiple available static probability models results in lowest bitrate for the encoded data for the at least part of the bitstream. Or, as another example, the encoding tool can select the static probability model based at least in part on encoding with each the multiple available static probability models to assess which one results in lowest bitrate for the encoded data for the at least part of the bitstream. Alternatively, the encoding tool can select the static probability model in some other way.

The encoding tool sets (1220) a syntax element that indicates the selected static probability model. For example, the syntax element is an n-bit value, which indicates one of $2^n$ static probability models.

The encoding tool configures (1230) the RANS encoder to use the selected static probability mode. Then, the encoding tool performs (1232) RANS encoding using the selected static probability model.

The encoding tool can repeat the technique (1200) on a fragment-by-fragment basis. In FIG. 12*a*, the encoding tool checks (1240) whether to continue for the next fragment and, if so, selects (1210), for the next fragment, one of the multiple available static probability models. In this case, each of the fragments includes its own header having a syntax element that indicates a selected static probability model for that fragment.

FIG. 12*b* shows an example technique (1250) for RANS decoding with switching of static probability models between fragments. The example technique (1250) can be performed, for example, by a decoding tool that implements a RANS decoder as described with reference to FIG. 6 or other RANS decoder, as part of the decoding stage (770) shown in FIG. 7*b*.

To start, as part of decoding encoded data using a RANS decoder, the decoding tool reads (1260) a syntax element that indicates a selection of a static probability model, for encoded data for at least part of a bitstream, from among multiple available static probability models. For example, the syntax element is an n-bit value, which indicates one of $2^n$ static probability models.

Based at least in part on the syntax element, the decoder tool selects (1270), for the encoded data for the at least part of the bitstream, one of the multiple available static probability models. For example, the multiple available static probability models include static probability models for which residual data values are successively more likely to be zero. The static probability models are pre-defined, and a given static probability model does not dynamically change during encoding/decoding. The static probability models can be represented in values of pre-defined lookup tables with probability information for the static probability models, respectively. Alternatively, the static probability models can be represented in some other way.

The decoding tool configures (1280) the RANS encoder to use the selected static probability mode. Then, the decoding tool performs (1282) RANS decoding of the encoded data using the selected static probability model. The RANS decoding can include operations that use a two-phase structure, as described with reference to FIGS. 9*a*-9*d*. Alternatively, the RANS decoding can use other operations that implement RANS decoding.

The decoding tool can repeat the technique (1250) on a fragment-by-fragment basis. In FIG. 12*b*, the decoding tool checks (1290) whether to continue for the next fragment and, if so, reads (1260) a syntax element that indicates a selection of a static probability model for the next fragment. In this case, each of the fragments includes its own header having a syntax element that indicates a selection of a static probability model for that fragment.

For the examples described with reference to FIGS. 12*a* and 12*b*, a header in the bitstream includes the syntax element that indicates the selected static probability model for the encoded data for the at least part of the bitstream. Depending on which features of fragment-adaptive RANS encoding/decoding are used, the header in the bitstream can also include (a) a syntax element that indicates whether or not state of the RANS decoder is to be flushed/re-initialized for decoding, (b) a syntax element that indicates an adjustment to the selected symbol width, and/or (c) one or more other syntax elements that indicate configuration parameters.

J. Examples of Adjusting Symbol Widths for Different Fragments.

When a default symbol width is set for symbols of a stream, values of symbols vary within the stream. Long series of values may be much less than the highest possible value for the stream (considering the default symbol width).

This section describes various aspects of adjustment of symbol width during RANS encoding/decoding. A RANS encoder and RANS decoder can adjust symbol width (relative to a default symbol width) on a fragment-by-fragment basis, which can improve compression efficiency because higher values (which are possible with the default symbol width but not with the adjusted symbol width) need not be considered for sub-ranges in probability values or RANS decoder state.

The RANS encoder decides whether to adjust the symbol width for a fragment. In general, the RANS encoder can decide to adjust (decrease) the symbol width for a fragment after evaluating the symbols of the fragment. For example, if the default symbol width is 8 bits (so that the range of possible values is 0 . . . 255), but the highest value among the symbols of the fragment is 61, the symbol width can be decrease by 2 bits (so that the range of values for the symbols is 0 . . . 63). More generally, for a default symbol width d and adjustment z, the RANS encoder can find the largest value of z such that $2^{d-z}$ is greater than the highest value among the symbols of the fragment.

The RANS encoder signals the adjustment to symbol width for the fragment. For example, a syntax element in a header for the fragment indicates the adjustment to symbol width for the fragment. In some example implementations, the syntax element is a 2-bit value, which can indicate an adjustment of 0 bits, −1 bit, −2 bits, or −3 bits relative to a default symbol width. Alternatively, the adjustment can have some other range in bits. The RANS encoder adjusts symbol width accordingly, configures the RANS encoder for RANS encoding at the (adjusted) symbol width, and performs RANS encoding at the adjusted symbol width.

The RANS decoder receives the syntax element that indicates the adjustment to symbol width. The RANS decoder then adjusts the default symbol width accordingly, configures the RANS decoder for RANS decoding at the (adjusted) symbol width, and performs RANS decoding at the adjusted symbol width.

K. Examples of RANS Encoding/Decoding with Adjustable Symbol Width Between Fragments.

FIG. 13*a* shows an example technique (1300) for RANS encoding with adjustment of symbol widths between fragments. The example technique (1300) can be performed, for example, by an encoding tool that implements a RANS encoder as described with reference to FIG. 5 or other RANS encoder, as part of the encoding stage (720) shown in FIG. 7*a*.

To start, as part of encoding input symbols using a RANS encoder, the encoding tool determines (1310) an adjustment to symbol width for encoded data for at least part of a bitstream. For example, the encoding tool identifies a highest value among the input symbols and, depending on the highest value among the input symbols, determines the adjustment to symbol width.

The encoding tool sets (1320) a syntax element that indicates the adjustment to symbol width. For example, the syntax element is an n-bit value, which indicates a decrease by an amount in the range of 0 to $2^n-1$ bits from the symbol width.

The encoding tool checks (1330) whether symbol width is to be adjusted and, if so, adjusts (1332) the symbol width. The encoding tool configures (1340) the RANS encoder to perform RANS encoding at the adjusted symbol width. For example, the encoding tool selects a set of pre-defined lookup tables having probability information for the adjusted symbol width and/or performs other operations to configure the RANS encoder. The encoding tool then performs (1342) RANS encoding at the adjusted symbol width.

The encoding tool can repeat the technique (1300) on a fragment-by-fragment basis. In FIG. 13a, the encoding tool checks (1344) whether to continue for the next fragment and, if so, determines (1310), for the next fragment, an adjustment to symbol width for the encoded data for that fragment. In this case, each of the fragments includes its own header having a syntax element that indicates an adjustment to symbol width for the encoded data for that fragment. In some example implementations, a default symbol width is set for a bitstream, and an adjusted symbol width applies for a given fragment, thereby narrowing effective symbol width for that fragment for the RANS encoder/decoder.

FIG. 13b shows an example technique (1350) for RANS decoding with adjustment of symbol widths between fragments. The example technique (1350) can be performed, for example, by a decoding tool that implements a RANS decoder as described with reference to FIG. 6 or other RANS decoder, as part of the decoding stage (770) shown in FIG. 7b.

To start, as part of decoding encoded data using a RANS decoder, the decoding tool reads (1360) a syntax element that indicates an adjustment to symbol width for encoded data for at least part of a bitstream. For example, the syntax element is an n-bit value, which indicates a decrease by an amount in the range of 0 to 2n−1 bits from the symbol width. Based at least in part on the syntax element, the decoder tool determines (1370) an adjustment to symbol width for the encoded data for the at least part of the bitstream.

The decoding tool checks (1380) whether symbol width is to be adjusted and, if so, adjusts (1382) the symbol width. The decoding tool configures (1390) the RANS decoder to perform RANS decoding at the adjusted symbol width. For example, the decoding tool selects a set of pre-defined lookup tables having probability information for the adjusted symbol width and/or performs other operations to configure the RANS decoder. The decoding tool then performs (1392) RANS decoding at the adjusted symbol width. The RANS decoding can include operations that use a two-phase structure, as described with reference to FIGS. 9a-9d. Alternatively, the RANS decoding can use other operations that implement RANS decoding.

The decoding tool can repeat the technique (1350) on a fragment-by-fragment basis. In FIG. 13b, the decoding tool checks (1394) whether to continue for the next fragment and, if so, reads (1360) a syntax element that indicates an adjustment to symbol width for the next fragment. In this case, each of the fragments includes its own header having a syntax element that indicates an adjustment to symbol width for the encoded data for that fragment. In some example implementations, a default symbol width is set for a bitstream, and an adjusted symbol width applies for a given fragment, thereby narrowing effective symbol width for that fragment for the RANS decoder.

For the examples described with reference to FIGS. 13a and 13b, a header in the bitstream includes the syntax element that indicates the adjustment to symbol width for the encoded data for the at least part of the bitstream. Depending on which features of fragment-adaptive RANS encoding/decoding are used, the header in the bitstream can also include (a) a syntax element that indicates whether or not state of the RANS decoder is to be flushed/re-initialized for decoding, (b) a syntax element that indicates a selection of a static probability model, and/or (c) one or more other syntax elements that indicate configuration parameters.

L. Example Bitstreams.

Figure 14:
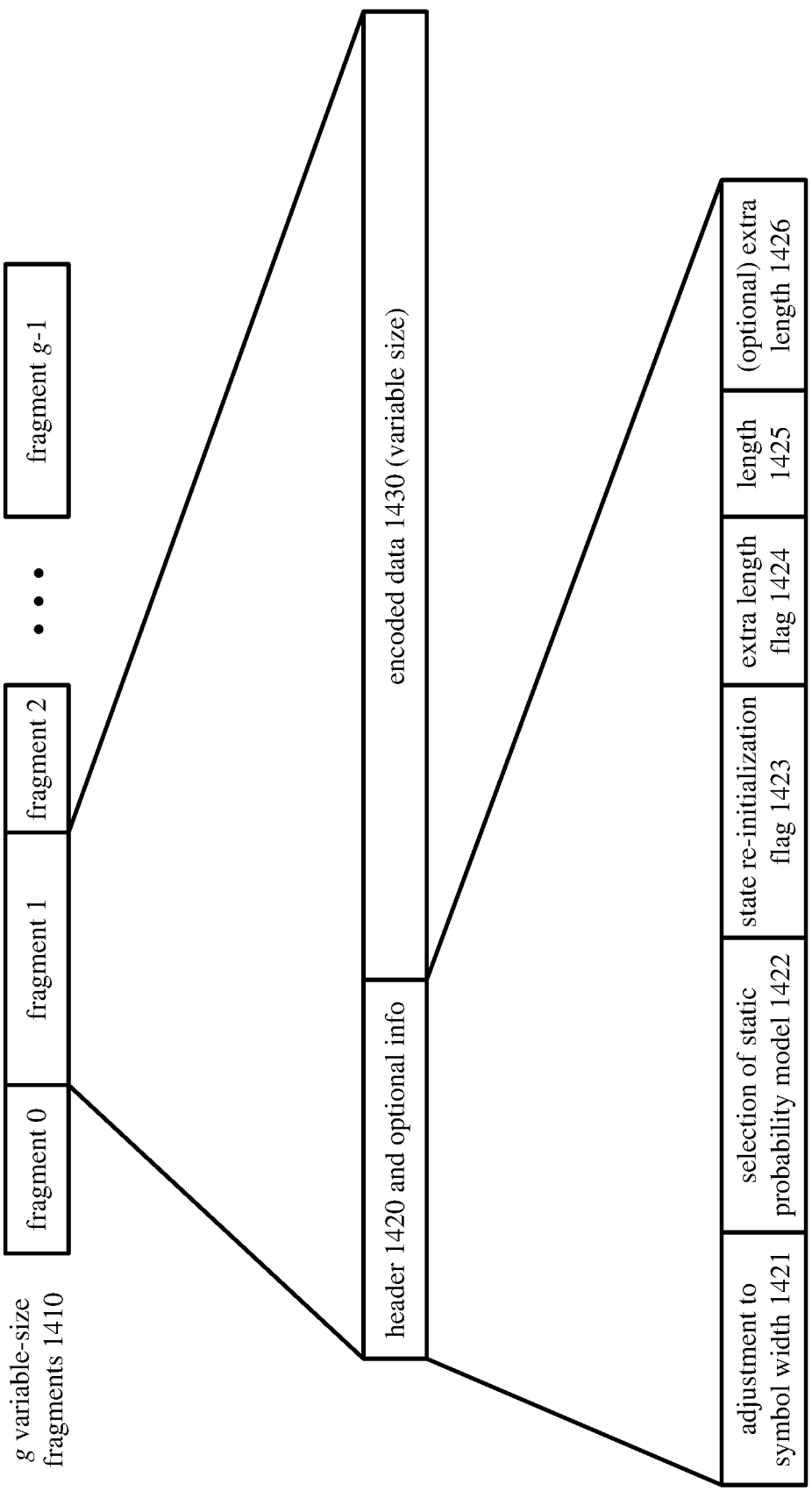
FIG. 14 is a diagram illustrating an example bitstream, according to some examples described herein.

FIG. 14 shows an example bitstream (1400) that includes multiple fragments of encoded data. Specifically, the bitstream (1400) includes g variable-size fragments (1410), which are numbered from fragment 0 to fragment g−1 in FIG. 14.

Each of the fragments (1410) includes a header (1420) and optional information, along with one or more bytes of encoded data (1430). The number of bytes of encoded data (1430) is variable, which in turn makes the fragments (1410) have variable size.

In general, the header (1420) includes fields for configuration parameters and length information. For a fragment, the header (1420) includes a field (1421) with a syntax element indicating an adjustment to symbol width, a field (1422) with a syntax element indicating a selection of a static probability model, and a field (1423) with a state re-initialization flag. The length field (1425) indicates how many bytes of encoded data (1430) are in the payload for the fragment. If the encoded data (1430) includes more bytes than can be indicated by the length field (1425), a field (1424) with an extra length flag indicates the presence of extra length information (1426). In some example implementations, the length field (1425) is one byte, the indicated amount is given by the length field plus 1 (an amount in the range of 1 . . . 257 bytes), and the extra length flag is a one-bit flag. If the encoded data (1430) includes more than 257 bytes, the extra length flag (1424) indicates the presence of a byte of extra length information (1426).

The adjustment to symbol width indicates an adjustment to the default symbol width of the symbols of the fragment. In some example implementations, the syntax element that indicates an adjustment to symbol width is a 2-bit value, which indicates a value in the range of 0 . . . 3 (for a decrease of 0 bits, 1 bit, 2 bits, or 3 bits). If the symbols of the fragment contain no values above certain thresholds (which is a common scenario in heavily compressed streams with high quantization), the RANS encoder/decoder can process symbols of the stream as if they are narrower (have fewer bits) than the default symbol width. For a default symbol width d and an adjustment z, symbols of the fragment are processed as having a symbol width of d−z bits. For example, if the default symbol width d is 6 for symbols of a stream, the range of possible values is 0 . . . 63. If at least one symbol of the fragment has a value of 32 or more, the adjustment z is 0. On the other hand, if the highest value is in the range 16 . . . 31, the adjustment z is −1, and the effective symbol width for RANS encoding/decoding is 5, for a range of values 0 . . . 31. If the highest value is in the range 8 . . . 15, the adjustment z is −2, and the effective symbol width for RANS encoding/decoding is 4, for a range of values 0 . . . 15. Otherwise, since the highest value is less than 8, the adjustment z is −3, and the effective symbol width for RANS encoding/decoding is 3, for a range of values 0 . . . 7.

The selection of a static probability model indicates one of multiple available static probability models. In some example implementations, the syntax element that indicates a selection of a static probability model is a 4-bit value, which indicates one of 16 static probability models. The static probabilities vary in terms of the tightness of the expected distribution of values of symbols around 0. For a first static probability model, all possible values have equal probability. For successive static probability models, the expected frequency of zero-value symbols increases, and probability for other values of symbols decreases. For the last static probability model, zero-value symbols are expected to be very common, and probabilities for most other values of symbols are expected to be zero.

The state re-initialization flag (also called a state flushing flag) controls the flushing of RANS decoder state between fragments. The flag for a fragment indicates whether the RANS decoder should flush (set to zero) and re-initialize its state for decoding of the symbols of the fragment. In some example implementations, the flag is a 1-bit value. If the value of the flag is 1, the first few bytes of the encoded data (1430) are used to load the state of the RANS decoder. If the value of the flag is 0, the RANS decoder state at the end of decoding a fragment is carried over to be the initial RANS decoder state for the next fragment.

M. Example Combined Implementation for RANS Decoding.

FIGS. 15a-15k show code listing fragments (1501-1511) in a hardware description language for a model of an example decoder. The code listing fragments (1501-1511) include code for a decoder module, which generally corresponds to a single instance of a RANS decoder. The code listing (1501-1511) fragments include placeholders for various lookup tables but, for the sake of brevity, values stored in the lookup tables are not explicitly shown. Such values depend on implementation. Also, for the sake of brevity, code is not shown for a feeder module (which writes values from an encoded data buffer to an input buffer) and decoder array module (which coordinates operations of multiple instances of RANS decoder, when output symbols are interleaved in the encoded data).

The code listing fragment (1501) in FIG. 15a includes comments about operations performed in two phases—phase 0 and phase 1—by different modules. The code listing fragments (1501-1502) in FIGS. 15a and 15b then include definitions of input parameters and output parameters for an instance of the decoder module. The input parameters and output parameters include various parameters used for overall control and configuration. In particular, the input parameter alphabet_bits indicates a default symbol width. The input parameter out_target indicates a target number of output symbols to be generated. Other input parameters and output parameters are used to interface with a feeder module. As shown in the code listing fragment (1502) in FIG. 15b, still other input parameters and output parameters are used to interface with a downstream module (e.g., indicating an output symbol in an output buffer and indicating whether the output symbol is a valid output symbol).

Various variables for the instance of the decoder module track configuration settings, which can change from fragment to fragment. As shown in the code listing fragment (1502) in FIG. 15b, the variable eab indicates an adjusted symbol width, which is later set by decreasing the default symbol width (alphabet_bits) by an adjustment indicated by a field in a header for a fragment. The variable current_q indicates a selected static probability model, as indicated by a field in a header for the fragment.

The code listing fragment (1502) in FIG. 15b also includes placeholders for lookup tables used by the decoder module. In general, each lookup table is depicted as a 3D array. For a lookup table, the first dimension of the 3D array is indexed by adjusted symbol width/effective alphabet_bits. The second dimension is indexed by a selected static probability model. The third dimension is indexed by bit position for the adjusted symbol width. Generally, one non-zero value is stored per bit of the symbol width.

The lookup table base_table stores values that correspond to subranges in the range 0 to 65536. For a given symbol width eab and selected static probability model current_q, the lookup table base_table[eab][current_q] stores the values for sub-ranges of the range, or, alternatively, cumulative frequency values for the respective sub-ranges. For example, for base_table[8][12], a lookup table can store the ten values [0, 7575, 14276, 25440, 41008, 56352, 64256, 65344, 65408, 0]. This corresponds to the nine sub-ranges 0 to 7575, 7576 to 14276, 14277 to 25440, 25441 to 41008, 41009 to 56352, 56353 to 64256, 64257 to 65344, 65345 to 65408, 65409 to 65536. The variable base_table_sel1 is a 2D array with probability values for different static probability models, for a given symbol width indicated by the variable eab. The variable base_table_sel2 is a 1D array with probability values for a selected static probability model (current_q), for the given symbol width (eab), as shown in the code listing fragment (1509) of FIG. 15i.

The lookup table freq_table stores values that relate to the values in base_table. For a given symbol width eab and selected static probability model current_q, the lookup table freq_table[eab][current_q] stores values, each indicating a difference compared to a previous value in terms of $\log 2^{p-1}$, for each position p after position 0. Alternatively, the values can be considered widths of the respective sub-ranges. For example, for freq_table[8][12], a lookup table can store the ten values [7575, 6701, 5582, 3892, 1918, 494, 34, 1, 1, 0]. This corresponds to the sub-range widths 7575, 6701×1, 5582×2, 3892×4, 1918×8, 494×16, 34×32, 1×64, and 1×128, for the respective sub-ranges. The variable freq_table_sel1 is a 2D array with values for different static probability models, for a given symbol width indicated by the variable eab. The variable freq_table_sel2 is a 1D array with values for a selected static probability model (current_q), for the given symbol width (eab), as shown in the code listing fragment (1509) of FIG. 15i.

The lookup tables rf_table, rs_table, and rn_table store values for encoded versions of reciprocals of probability values for different static probability models, for different symbol widths. By using values from the lookup tables rf_table, rs_table, and rn_table in bit shift operations or addition/subtraction operations, the decoder module can avoid explicit division operations.

In particular, the lookup table rf_table stores reciprocal values, for inverse probability distribution information, which are used when determining an output symbol based on RANS decoder state. The variable rf_table_sel1 is a 2D array with reciprocal values for different static probability models, for a given symbol width indicated by the variable eab. The variable rf_table_sel2 is a 1D array with reciprocal values for a selected static probability model (current_q), for the given symbol width (eab), as shown in the code listing fragment (1509) of FIG. 15i.

The lookup table rs_table stores shift values, associated with inverse probability distribution information, which are used when determining an output symbol based on RANS decoder state. The variable rs_table_sel1 is a 2D array with shift values for different static probability models, for a given symbol width indicated by the variable eab. The variable rs_table_sel2 is a 1D array with shift values for a selected static probability model (current_q), for the given symbol width (eab), as shown in the code listing fragment (1509) of FIG. 15i.

The lookup table rn_table stores offset values, associated with inverse probability distribution information, which are used when determining an output symbol based on RANS decoder state. The variable rn_table_sel1 is a 2D array with offset values for different static probability models, for a given symbol width indicated by the variable eab. The variable rn_table_sel2 is a 1D array with offset values for a selected static probability model (current_q), for the given symbol width (eab), as shown in the code listing fragment (1509) of FIG. 15i.

As shown in the code listing fragment (1503) of FIG. 15c, the decoder module has multiple control states. The multiple control states include an idle control state (DSTATE_IDLE), three control states in which fields of header bytes are processed (DSTATE_HDR0, DSTATE_HDR1, DSTATE_HDR2), a main processing control state (DSTATE_PROCESSING) in which the decoder module reads input encoded data and generates output symbols, and a control state in which the decoder module has finished processing input encoded data but is still generating output symbols (DSTATE_DRAINING).

The code listing fragment (1503) of FIG. 15c also shows definitions for various internal variables used by the decoder module. For example, the variable phase tracks the current phase—phase 0 or phase 1. The variable input_buf stores a byte of encoded data (or, in some cases, byte of a header for a fragment). The variable input_buf_full tracks whether there is a byte in input_buf. The variable sym_buf_full tracks whether the output buffer includes an actual (valid) output symbol from the previous iteration. The variable input_remaining tracks how much encoded data remains to be decoded for the fragment. The variables rans_state_p0 and rans_state_p1 track RANS decoder state across the two phases. The variable hdr3 tracks whether extra length information is present for a fragment. The variable flush_per_frag tracks whether the initial state is flushed and reloaded for the fragment.

The code listing fragments (1503, 1504) in FIGS. 15c and 15d then show variables used, during phase 1, when a portion of encoded data (from the input buffer input_buf) is selectively merged into the RANS decoder state. The variable want_to_feed_rans is used to track whether RANS decoder state will be updated. The variable want_to_feed_rans is set depending on a comparison of RANS decoder state to a threshold (rans_state_p0<'MDU_RANS_LOWER_LIMIT) and whether there is any input encoded data remaining to be decoded. The variable will_feed_rans depends on the variable want_to_feed_rans and whether the input buffer includes a byte of encoded data. The variable rans_state_with_input is set to the RANS decoder state (rans_state_p0) if the RANS decoder state will not be updated. In this case, the RANS decoder state is unchanged. Otherwise, if the RANS decoder state is updated, the variable rans_state_with_input is set to include the lower-order three bytes of the RANS decoder state (rans_state_p0) and a new byte of encoded data. The updated RANS decoder state is tracked as rans_state_with_input. The variable new_input_remaining tracks the amount of input encoded data remaining to be decoded.

The code listing fragments (1503, 1504) in FIGS. 15c and 15d next show variables used, during phase 1, to determine whether to load the input buffer with another byte of encoded data (tracked with need_ib_load, then din_req and din_ready) and check various stall conditions.

The code listing fragment (1504) in FIG. 15d further shows variables set during configuration, based on values from a byte of a header. The variable hdr0_z_field is set from a two-bit value in a byte in the input buffer. This value indicates an adjustment to the default symbol width (alphabet_bits) for a fragment. The variable hdr0_q_field is set from a four-bit value in the byte in the input buffer. This value indicates a selected static probability model for the fragment. The variable eab_unclamped indicates an adjusted symbol width for the fragment, which is based on the default symbol width (alphabet_bits) and adjustment (hdr_z_field). The variable eab_unclamped indicates the adjusted symbol width after clamping to be no more than 9 bits.

The code listing fragments (1504, 1505) in FIGS. 15d and 15e next show variables set when the decoder module selectively generates an output symbol using inverse probability information and the RANS decoder state. Specifically, the variable new_sym indicates a potential output symbol, and the variable sym_valid indicates whether the output symbol is valid.

The variables inv_seg, inv_base_x, and dist_x are set based on the RANS decoder state (in the variable cf_in), base table values (base_table_sel2), an adjusted symbol width (eab), and offset values (rn_table_sel2). The variable cf_in is set based on the updated RANS decoder state tracked as rans_state_with_input. The array base_table_sel2 is a 1D array with probability values for a selected static probability model, for a given symbol width. The array rn_table_sel2 is a 1D array with offset values for a selected static probability model, for a given symbol width. The values of base_table_sel2 and rn_table_sel2 are set for a selected static probability model (current_q), for the given symbol width (eab), as shown in the code listing (1509) of FIG. 15i.

The variable inv_seg indicates a segment, from 0 to 9, associated with an output symbol. The variable inv_base_x indicates a base amount, which generally depends on the segment. The variable dist_x indicates an adjusted state value based on cf_in, an entry looked up in base_table_sel2 for the segment, and shift value looked upon in rn_table_sel2 for the segment.

The variable new_sym indicates a potential output symbol, which is set using the values of the variables inv_seg, inv_base_x, and dist_x, along with values looked up in rf_table_sel2 and rs_table_sel2 for the segment (inv_seg), as shown in FIG. 15e. The array rf_table_sel2 is a 1D array with inverse reciprocal values for a selected static probability model, for a given symbol width. The array rs_table_sel2 is a 1D array with shift values for a selected static probability model, for a given symbol width. The values of rf_table_sel2 and rs_table_sel2 are set for a selected static probability model (current_q), for the given symbol width (eab), as shown in the code listing (1509) of FIG. 15i. The variables rf and rs are set by lookup operations in rf_table_sel2 and rs_table_sel2, using inv_seg as an index. The variable add_mul is set by multiplying dist_x by the value looked up in rf_table_sel2. The variable inv_steps is set by shifting the top 17 bits of add_mul by a shift value looked up in rs_table_sel2. The variable new_sym is set by adding the value inv_steps to inv_base_x.

The variable sym_valid indicates whether a new output symbol is valid. The variable next_sym_buf_full tracks whether a valid symbol has been generated, which depends on whether the RANS decoder state (tracked with rans_state_with_input) is greater than a threshold amount ('MDU_RANS_LOWER_LIMIT) and whether there are output symbols remaining to be generated (output_remaining>0). As explained below, the variable sym_buf_full is set to the value of next_sym_buff_full. In phase 0, the variable sym_valid is set to indicate whether the new symbol is valid, based on sym_buf_full. In this way, the decoder selectively generates an output symbol (that is, a valid output symbol) depending on the RANS decoder state. (In some cases, the value of new_sym is calculated but does not indicate an output symbol.)

The variable new_rans_state_p1 indicates an updated RANS decoder state, based on the RANS decoder state with a new byte selectively merged in (rans_state_with_input). The variable new_output_remaining tracks output symbols remaining to be generated, which is decremented if a valid output symbol has been generated.

The code listing fragments (1506, 1507) in FIGS. 15f and 15g show variables set when the decoder module selectively updates RANS decoder state, depending on whether an output symbol has been generated. Some of the variables depend on values looked up in the arrays base_table_sel2 and freq_table_sel2. The array base_table_sel2 is a 1D array with probability values for a selected static probability model, for the given symbol width. The array freq_table_sel2 is a 1D array with frequency values for a selected static probability model, for the given symbol width. The values of base_table_sel2 and freq_table_sel2 are set during configuration, based on values in the header, as described below.

The variables fwd_seg and fwd_segstart are set based on the value of the output symbol (sym) generated in phase 1 of the previous iteration. The variable fwd_seg indicates a segment, from 0 to 9, associated with the output symbol. The variable fwd_segstart is a base amount, which generally depends on the segment. The variable fwd_base is set by a lookup operation in the base table (base_table_sel2), using fwd_seg as an index. The variable fwd_fa is set by a lookup operation in the frequency table (freq_table_sel2), using fwd_seg as an index. The variable new_rans_state_p0, which indicates an updated RANS decoder state, is set using the values of variables fwd_f, fwd_p, and fwd_cf, along with 16 bits from the RANS decoder state from phase 1 (rans_state_p1[31:16]). The variables fwd_f, fwd_p, and fwd_cf are calculated as shown in the code listing fragment (1507) in FIG. 15g.

The code listing fragment (1507) in FIG. 15g shows operations performed when the decoder module is initialized (when the variable nrst is 0). The control state of the decoder module is set to DSTATE_IDLE, and the phase is set to phase 1. State variables (rans_state_p0 and rans_state_p1), the variable that tracks remaining bytes of input encoded data to be decoded (input_remaining), and the variable that tracks remaining output symbols to be generated (output_remaining) are set to 0. Other variables indicating an output symbol, whether the output symbol is valid, the adjusted symbol width, the selected static probability model, and values of lookup tables are similarly initialized.

The code listing fragments (1507-1511) in FIGS. 15g-15k next show the main processing loop for the decoder module (when the variable nrst is 1), as the decoder module performs operations for phase 0 or phase 1, and as the decoder module transitions from control state to control state. In particular, the code listing fragments (1507, 1508) in FIGS.

15g and 15h show operations performed as part of phase 0 processing (when the variable phase is 0). The decoder module checks are error overrun condition and, if decoding has not stalled, performs various operations.

If the control state of the decoder module is DSTATE_PROCESSING or DSTATE_DRAINING, the decoder module selectively updates the RANS decoder state. If the variable sym_buf_full indicates an output symbol (valid output symbol) was generated in phase 1 of a previous iteration (see FIGS. 15e and 15j), the decoder module sets the variable rans_state_p0 to the value of the variable new_rans_state_p0 (which is set as shown in FIG. 15g). Otherwise (the variable sym_buf_full indicates an output symbol was not generated in phase 1 of the previous iteration), the decoder module sets the variable rans_state_p0 to the value of the variable rans_state_p1 (that is, the RANS decoder state is unchanged between phase 1 and phase 0).

As part of phase 0 processing, the decoder module next handles input, regardless of control state of the decoder module, as shown in FIG. 15h. Depending on the values of the variables din_valid and din_ready (which is set during previous phase 1 processing; see FIG. 15d), the decoder module selectively re-fills the input buffer (input_buf) using another byte of encoded data (from the variable din) and indicates the input buffer is full (input_buf_full<=1).

Still as part of phase 0 processing, the decoder module handles output, regardless of control state of the decoder module, as shown in FIG. 15h. Depending on the values of the variables sym_valid and sym_ready, which are part of the interface to a downstream module (see FIG. 15a) and (in the case of sym_valid) set during previous phase 1 processing (see FIG. 15e), the decoder module selectively outputs an output symbol (placeholder shown in FIG. 15h) and indicates the output buffer is empty (sym_buf_full<=0).

This completes the iteration of phase 0 processing. As shown in the code listing fragment (1511) in FIG. 15k, the decoder module toggles the variable phase. Here, the variable phase is changed from 0 to 1.

The code listing fragments (1508-1511) in FIGS. 15h-15k show operations performed as part of phase 1 processing (when the variable phase is 1). The operations performed as part of phase 1 processing depends on the control state of the decoder module, as shown in the case statement that depends on ctrl_state.

As shown in the code listing fragment (1508) of FIG. 15h, if the control state of the decoder module is DSTATE_IDLE, the decoder module is in an idle control state. The control state of the decoder module is changed to DSTATE_HDR0 for subsequent processing. Variables that track RANS decoder state (rans_state_p0 and rans_state_p1) are initialized (set to zero). The amount of output symbols remaining to be generated is set to a target amount (out_target), which is an input parameter for the interface to the decoder module. This completes the iteration of phase 1 processing (for the control state DSTATE_IDLE) and, as shown in the code listing fragment (1511) in FIG. 15k, the decoder module toggles the variable phase, changing the variable phase from 1 to 0.

As shown in the code listing fragment (1509) of FIG. 15i, if the control state of the decoder module is DSTATE_HDR0, the decoder module processes the first byte of a header for a fragment. Assuming the input buffer stores the first byte of the header (input_buf_full is 1, as set during previous phase 0 processing when the input buffer is re-filled), the decoder module initializes the amount of bytes of encoded data to be decoded to zero (input_remaining<=0)

and changes the control state of the decoder module to DSTATE_HDR1 for subsequent processing. The decoder module sets the variable current_q, which indicates a selected static probability model for the fragment, based on four bits of the first byte of the header, which are represented with the variable hdr0_q_field (see FIG. 15*d*). The decoder module sets the variable hdr3, which indicates whether the header includes an extra length field, based on another bit in the first byte of the header. The decoder module sets the variable flush_per_flag, which indicates whether the state of the RANS decoder is flushed and re-initialized for the fragment (or maintained from the previous fragment), based on another bit in the first byte of the header. The decoder module sets the variable eab, which indicates an adjusted symbol width for the fragment, based on two bits of the first byte of the header, which are represented with the hdr0_z_field (see FIG. 15*d*) and used to calculate eab_clamped. Finally, the decoder module sets the variable input_buf_full to zero to indicate the byte in the input buffer has been processed. This completes the iteration of phase 1 processing (for the control state DSTATE_HDR0) and, as shown in the code listing fragment (1511) in FIG. 15*k*, the decoder module toggles the variable phase, changing the variable phase from 1 to 0.

As shown in the code listing fragment (1509) of FIG. 15*i*, if the control state of the decoder module is DSTATE_HDR1, the decoder module processes the second byte of the header for the fragment, which indicates the length of encoded data in the fragment. Assuming the input buffer stores the first byte of the header (input_buf_full is 1, as set during previous phase 0 processing when the input buffer is re-filled), the decoder module sets the values of lookup tables for base_table_sel2, freq_table_sel2, rf_table_sel2, rs_table_sel2, and rn_table_sel2 based on the selected static probability model (current_q) and adjusted symbol width eab (see FIG. 15*b*). The decoder module next sets the amount of bytes of encoded data to be decoded (input_remaining). If the variable hdr3 indicates the header includes an extra length field, the decoder modules sets the amount of bytes of encoded data to be decoded (input_remaining) to the value of the second byte of the header (in input_buf), and changes the control state of the decoder module to DSTATE_HDR2 for subsequent processing. Otherwise (the variable hdr3 indicates the header does not include an extra length field), the decoder module sets the amount of bytes of encoded data to be decoded (input_remaining) to the value of the second byte of the header plus 1, and changes the control state of the decoder module to DSTATE_PROCESSING for subsequent processing. The decoder module also sets the variable input_buf_full to zero to indicate the byte in the input buffer has been processed. This completes the iteration of phase 1 processing (for the control state DSTATE_HDR1) and, as shown in the code listing fragment (1511) in FIG. 15*k*, the decoder module toggles the variable phase, changing the variable phase from 1 to 0.

As shown in the code listing fragment (1509) of FIG. 15*i*, if the control state of the decoder module is DSTATE_HDR2, the decoder module processes the third byte of the header for the fragment, which indicates the extra length of encoded data in the fragment. Assuming the input buffer stores the first byte of the header (input_buf_full is 1, as set during previous phase 0 processing when the input buffer is re-filled), the decoder module sets the amount of bytes of encoded data to be decoded (input_remaining) using the value of the third byte of the header and the value set for input_remaining when processing the second byte of the header. The decoder module also changes the control state of the decoder module to DSTATE_PROCESSING for subsequent processing. The decoder module sets the variable input_buf_full to zero to indicate the byte in the input buffer has been processed. This completes the iteration of phase 1 processing (for the control state DSTATE_HDR2) and, as shown in the code listing fragment (1511) in FIG. 15*k*, the decoder module toggles the variable phase, changing the variable phase from 1 to 0.

As shown in the code listing fragment (1510) of FIG. 15*j*, if the control state of the decoder module is DSTATE_PROCESSING, the decoder module sets the state of the RANS decoder (rans_state_p1) to an updated RANS decoder state (new_rans_state_p1), based on the RANS decoder state with a new byte selectively merged into it, as explained with reference to FIGS. 15*c* and 15*e*. The decoder module updates the amount of bytes of input encoded data remaining to be decoded (input_remaining) using the variable new_input_remaining, which is set as shown in FIG. 15*c*. The decoder module also updates the amount of output symbols remaining to be generated (output_remaining) using the variable new_output_remaining, which is set as shown in FIG. 15*e*. The decoder module selectively sets the variable input_buf_full to zero, depending on whether the byte of encoded data in the input buffer has been merged into the decoder state. The decoder module selectively generates an output symbol (sym) for the current iteration, setting the variable sym to new_sym and setting the variable sym_buf_full to next_sym_buf_full, where new_sym and next_sym_buf_full as set as shown in FIG. 15*e*.

So long as there is at least some encoded data remaining to be decoded, the control state of the decoder module remains DSTATE_PROCESSING. On the other hand, if there is no input encoded data remaining to be decoded (new_input_remaining is 0), the decoder module performs other operations. If there is at least one more output symbol to be generated (new_output_remaining>0), the decoder module checks the state of the RANS decoder. If the state of the RANS decoder is not sufficient to continue decoding (new_rans_state_p1=='MDU_RANS_LOWER_LIMIT), the decoder module initiates a switch to decoding another fragment, changing the control state of the decoder module to DSTATE_HDR0 and selectively flushing the state of the RANS decoder (depending on the value of the variable flush_per_frag). Otherwise (there is at least one more output symbol to be generated, and the state of the RANS decoder is sufficient to continue decoding), the decoder module changes the control state of the decoder module to DSTATE_DRAINING. If there are no more output symbols to be generated, the decoder module changes the control state of the decoder module to DSTATE_IDLE and sets a variable done to 1.

This completes the iteration of phase 1 processing (for the control state DSTATE_PROCESSING). As shown in the code listing fragment (1511) in FIG. 15*k*, the decoder module toggles the variable phase, changing the variable phase from 1 to 0.

As shown in the code listing fragment (1510) of FIG. 15*j*, if the control state of the decoder module is DSTATE_DRAINING, the decoder module sets the state of the RANS decoder (rans_state_p1) to an updated RANS decoder state (new_rans_state_p1), based on the RANS decoder state with a new byte selectively merged into it, as explained with reference to FIGS. 15*c* and 15*e*. The decoder module updates the amount of output symbols remaining to be generated (output_remaining) using the variable new_output_remaining, which is set as shown in FIG. 15*e*. The decoder module selectively generates an output symbol (sym) for the current iteration, setting the variable sym to new_sym and setting the variable sym_buf_full to next_sym_buf_full, where new_sym and next_sym_buf_full as set as shown in FIG. 15e.

So long as the state of the RANS decoder is sufficient to continue decoding, the control state of the decoder module remains DSTATE_DRAINING. On the other hand, if the state of the RANS decoder is not sufficient to continue decoding (new_rans_state_p1<='MDU_RANS_LOWER_LIMIT), the decoder module performs other operations. If there is at least one more output symbol to be generated (new_output_remaining>0), the decoder module initiates a switch to decoding another fragment, changing the control state of the decoder module to DSTATE_HDR0 and selectively flushing the state of the RANS decoder (depending on the value of the variable flush_per_frag). Otherwise (there are no more output symbols to be generated), the decoder module changes the control state of the decoder module to DSTATE_IDLE and sets a variable done to 1.

This completes the iteration of phase 1 processing (for the control state DSTATE_DRAINING). As shown in the code listing fragment (1511) in FIG. 15k, the decoder module toggles the variable phase, changing the variable phase from 1 to 0.

Finally, as shown in the code listing fragment (1511) in FIG. 15k, for any other value of ctrl_state, the decoder module changes the control state of the decoder module to DSTATE_IDLE for subsequent processing. This completes the iteration of phase 1 processing (for the default control state) and, as shown in the code listing fragment (1511) in FIG. 15k, the decoder module toggles the variable phase, changing the variable phase from 1 to 0.

VII. Additional Features.

The following table shows additional features of some of the innovations described herein.

| | RANS Encoder/Decoder Configurable to Work with Multiple Symbol Widths |
|---|---|
| A1 | In a computer system, a method comprising: encoding input symbols using a range asymmetric number system ("RANS") encoder, thereby generating encoded data for at least part of a bitstream, wherein the encoding includes: selecting a symbol width from among multiple available symbol widths; configuring the RANS encoder to perform RANS encoding at the selected symbol width, including selecting a set of pre-defined lookup tables having probability information for the selected symbol width; and performing the RANS encoding at the selected symbol width; and outputting the encoded data for the at least part of the bitstream. |
| A2 | The method of claim A1, wherein the input symbols are for residual data for media, and wherein the multiple available symbol widths are selected from the group consisting of 1 bit, 2 bits, 3 bits, 4 bits, 5 bits, 6 bits, 7 bits, 8 bits, 9 bits, 10 bits, 11 bits, and 12 bits. |
| A3 | The method of claim A1, wherein the set of pre-defined lookup tables includes one or more pre-defined lookup tables with forward probability information for the selected symbol width and one or more pre-defined lookup tables with inverse probability information for the selected symbol width. |
| A4 | The method of claim A1, wherein the set of pre-defined lookup tables incorporates a static probability model, for the encoded data for the at least part of the bitstream, selected from among multiple available static probability models for different sets of pre-defined lookup tables. |
| A5 | The method of claim A1, wherein the performing the RANS encoding includes determining initial state information for a RANS decoder, wherein the encoded data for the at least part of the bitstream includes the initial state information. |
| A6 | The method of claim A1, wherein a header in the at least part of the bitstream includes a syntax element that indicates the selected symbol width. |
| A7 | The method of claim A1, wherein a header in the at least part of the bitstream includes: a syntax element that indicates whether or not state of a RANS decoder is to be flushed/re-initialized for decoding of the encoded data for the at least part of the bitstream; a syntax element that indicates an adjustment to the selected symbol width for the encoded data for the at least part of the bitstream; and/or a syntax element that indicates a selection of a static probability model, for the encoded data for the at least part of the bitstream, from among multiple available static probability models. |
| A8 | A computer system comprising a range asymmetric number system ("RANS") encoder and an encoded data buffer, the computer system being configured to perform the method of any one of claims A1 to A7. |
| A9 | One or more computer-readable media having stored thereon computer-executable instructions for causing one or more processors, when programmed thereby, to perform the method of any one of claims A1 to A7. |
| A10 | One or more computer-readable media having stored thereon encoded data produced by the method of any one of claims A1 to A7. |
| A11 | In a computer system, a method comprising: receiving encoded data for at least part of a bitstream; and decoding the encoded data for the at least part of the bitstream using a range asymmetric number system ("RANS") decoder, thereby generating output symbols, wherein the decoding includes: selecting a symbol width from among multiple available symbol widths; configuring the RANS decoder to perform RANS decoding at the selected symbol width, including selecting a set of pre-defined lookup tables having probability information for output symbols of the selected symbol width; and performing the RANS decoding at the selected symbol width. |

| | |
|---|---|
| A12 | The method of claim A11, wherein the multiple available symbol widths are selected from the group consisting of 1 bit, 2 bits, 3 bits, 4 bits, 5 bits, 6 bits, 7 bits, 8 bits, 9 bits, 10 bits, 11 bits, and 12 bits. |
| A13 | The method of claim A11, wherein the set of pre-defined lookup tables includes one or more pre-defined lookup tables with forward probability information for the selected symbol width and one or more pre-defined lookup tables with inverse probability information for the selected symbol width. |
| A14 | The method of claim A11, wherein the set of pre-defined lookup tables incorporates a static probability model, for the encoded data for the at least part of the bitstream, selected from among multiple available static probability models for different sets of pre-defined lookup tables. |
| A15 | The method of claim A11, wherein the performing the RANS decoding includes:<br>as part of a first phase, selectively updating state of the RANS decoder using probability information for an output symbol from a previous iteration;<br>as part of a second phase, selectively merging a portion of encoded data, for the at least part of the bitstream, from an input buffer into the state of the RANS decoder; and<br>as part of the second phase, selectively generating an output symbol for a current iteration using the state of the RANS decoder. |
| A16 | The method of claim A11, wherein a header in the at least part of the bitstream includes a syntax element that indicates the selected symbol width. |
| A17 | The method of claim A11, wherein a header in the least part of the bitstream includes:<br>a syntax element that indicates whether or not state of the RANS decoder is to be flushed/re-initialized for decoding of the encoded data for the at least part of the bitstream;<br>a syntax element that indicates an adjustment to the selected symbol width for the encoded data for the at least part of the bitstream; and/or<br>a syntax element that indicates a selection of a static probability model, for the encoded data for the at least part of the bitstream, from among multiple available static probability models. |
| A18 | A computer system comprising an encoded data buffer and a range asymmetric number system ("RANS") decoder, the computer system being configured to perform the method of any one of claims A11 to A17. |
| A19 | One or more computer-readable media having stored thereon computer-executable instructions for causing one or more processors, when programmed thereby, to perform the method of any one of claims A11 to A17. |
| A20 | One or more computer-readable media having stored thereon encoded data organized for decoding according to the method of any one of claims A11 to A17. |

RANS Encoder/Decoder with Selective Flushing of Initial State for Fragments

| | |
|---|---|
| B1 | In a computer system, a method comprising:<br>encoding input symbols using a range asymmetric number system ("RANS") encoder, thereby generating encoded data for at least part of a bitstream, including:<br>determining whether or not state of a RANS decoder is to be flushed and re-initialized for decoding of the encoded data for the at least part of the bitstream;<br>setting a syntax element that indicates whether or not the state of the RANS decoder is to be flushed and re-initialized for decoding of the encoded data for the at least part of the bitstream; and<br>performing RANS encoding; and<br>outputting the encoded data for the at least part of the bitstream, wherein a header in the at least part of the bitstream includes the syntax element that indicates whether or not the state of the RANS decoder is to be flushed and re-initialized for decoding of the encoded data for the at least part of the bitstream. |
| B2 | The method of claim B1, wherein:<br>if the syntax element indicates the state of the RANS decoder is to be flushed and re-initialized for decoding of the encoded data for the at least part of the bitstream, the bitstream further includes initial state information for the encoded data for the at least part of the bitstream; and<br>if the syntax element indicates the state of the RANS decoder is not to be flushed and re-initialized for decoding of the encoded data for the at least part of the bitstream, the bitstream lacks the initial state information for the encoded data for the at least part of the bitstream. |
| B3 | The method of claim B2, wherein the initial state information is a 32-bit value. |
| B4 | The method of claim B1, wherein the header is for one of multiple fragments, each of the multiple fragments including its own header having a syntax element that indicates whether or not the state of the RANS decoder is to be flushed and re-initialized for decoding of encoded data for that fragment, and wherein the encoding using the RANS encoder is performed on a fragment-by-fragment basis. |
| B5 | The method of claim B1, wherein the encoding further includes:<br>if the state of the RANS decoder is to be flushed and re-initialized for decoding of the encoded data for the at least part of the bitstream, determining initial state information for the encoded data for the at least part of the bitstream. |

| | |
|---|---|
| B6 | The method of claim B1, wherein the input symbols are for residual data for media. |
| B7 | The method of claim B1, wherein the header in the at least part of the bitstream further includes:<br>a syntax element that indicates an adjustment to symbol width for the encoded data for the at least part of the bitstream; and/or<br>a syntax element that indicates a selection of a static probability model, for the encoded data for the at least part of the bitstream, from among multiple available static probability models. |
| B8 | A computer system comprising a range asymmetric number system ("RANS") encoder and an encoded data buffer, the computer system being configured to perform the method of any one of claims B1 to B7. |
| B9 | One or more computer-readable media having stored thereon computer-executable instructions for causing one or more processors, when programmed thereby, to perform the method of any one of claims B1 to B7. |
| B10 | One or more computer-readable media having stored thereon encoded data produced by the method of any one of claims B1 to B7. |
| B11 | In a computer system, a method comprising:<br>receiving encoded data for at least part of a bitstream, wherein a header in the at least part of the bitstream includes a syntax element that indicates whether or not state of a range asymmetric number system ("RANS") decoder is to be flushed and re-initialized for decoding of the encoded data for the at least part of the bitstream; and<br>decoding the encoded data using the RANS decoder, thereby generating output symbols, including:<br>reading the syntax element; and<br>based at least in part on the syntax element, determining whether or not the state of the RANS decoder is to be flushed and re-initialized for decoding of the encoded data for the at least part of the bitstream; and<br>performing RANS decoding of the encoded data. |
| B12 | The method of claim B11, wherein:<br>if the syntax element indicates the state of the RANS decoder is to be flushed and re-initialized for decoding of the encoded data for the at least part of the bitstream, the bitstream further includes initial state information for the encoded data for the at least part of the bitstream; and<br>if the syntax element indicates the state of the RANS decoder is not to be flushed and re-initialized for decoding of the encoded data for the at least part of the bitstream, the bitstream lacks the initial state information for the encoded data for the at least part of the bitstream. |
| B13 | The method of claim B12, wherein the initial state information is a 32-bit value. |
| B14 | The method of claim B11, wherein the header is for one of multiple fragments, each of the multiple fragments including its own header having a syntax element that indicates whether or not the state of the RANS decoder is to be flushed and re-initialized for decoding of encoded data for that fragment, and wherein the decoding using the RANS decoder is performed on a fragment-by-fragment basis. |
| B15 | The method of claim B11, wherein the decoding includes, if the state of the RANS decoder is to be flushed and re-initialized for decoding of the encoded data for the at least part of the bitstream:<br>retrieving initial state information for the encoded data for the at least part of the bitstream; and<br>loading an initial state, as the state of the RANS decoder, based at least in part on the initial state information. |
| B16 | The method of claim B1, wherein the performing the RANS decoding includes:<br>as part of a first phase, selectively updating state of the RANS decoder using probability information for an output symbol from a previous iteration;<br>as part of a second phase, selectively merging a portion of encoded data, for at least part of a bitstream, from an input buffer into the state of the RANS decoder; and<br>as part of the second phase, selectively generating an output symbol for a current iteration using the state of the RANS decoder. |
| B17 | The method of claim B11, wherein the output symbols are for residual data for media, and wherein the header in the at least part of the bitstream further includes:<br>a syntax element that indicates an adjustment to symbol width for the encoded data for the at least part of the bitstream; and/or<br>a syntax element that indicates a selection of a static probability model, for the encoded data for the at least part of the bitstream, from among multiple available static probability models. |
| B18 | A computer system comprising an encoded data buffer and a range asymmetric number system ("RANS") decoder, the computer system being configured to perform the method of any one of claims B11 to B17. |
| B19 | One or more computer-readable media having stored thereon computer-executable instructions for causing one or more processors, when programmed thereby, to perform the method of any one of claims B11 to B17. |
| B20 | One or more computer-readable media having stored thereon encoded data organized for decoding according to the method of any one of claims B11 to B17. |
| | RANS Encoder/Decoder with Switching Between Static Probability Models |
| C1 | In a computer system, a method comprising:<br>encoding input symbols using a range asymmetric number system ("RANS") encoder, thereby generating encoded data for at least part of a bitstream, including:<br>selecting, for the encoded data for the at least part of the bitstream, one of multiple available static probability models; and | setting a syntax element that indicates the selected static probability model;
configuring the RANS encoder to perform RANS encoding using the selected static probability model; and
performing RANS encoding using the selected static probability model; and
outputting the encoded data for the at least part of the bitstream, wherein a header in the at least part of the bitstream includes the syntax element that indicates the selected static probability model for the encoded data for the at least part of the bitstream.

C2    The method of claim C1, wherein the syntax element is an n-bit value, which indicates one of $2^n$ static probability models.

C3    The method of claim C1, wherein the input symbols are for residual data for media, and wherein the multiple available static probability models include static probability models for which residual data values are successively more likely to be zero.

C4    The method of claim C1, wherein the selecting one of the multiple available static probability models is based at least in part on:
evaluation of probability distribution of values of the input symbols;
estimation of which of the multiple available static probability models results in lowest bitrate for the encoded data for the at least part of the bitstream; or
encoding with each the multiple available static probability models to assess which one results in lowest bitrate for the encoded data for the at least part of the bitstream.

C5    The method of claim C1, wherein the header is for one of multiple fragments, each of the multiple fragments including its own header having a syntax element that indicates a static probability model, for encoded data for that fragment, selected from among the multiple available static probability models, and wherein the encoding using the RANS encoder is performed on a fragment-by-fragment basis.

C6    The method of claim C1, wherein the multiple available static probability models are represented in values of pre-defined lookup tables with probability information for the multiple available static probability models, respectively.

C7    The method of claim C1, wherein the header further includes:
a syntax element that indicates whether or not state of a RANS decoder is to be flushed and re-initialized for decoding of the encoded data for the at least part of the bitstream; and/or
a syntax element that indicates an adjustment to symbol width for the encoded data for the at least part of the bitstream.

C8    A computer system comprising a range asymmetric number system ("RANS") encoder and an encoded data buffer, the computer system being configured to perform the method of any one of claims C1 to C7.

C9    One or more computer-readable media having stored thereon computer-executable instructions for causing one or more processors, when programmed thereby, to perform the method of any one of claims C1 to C7.

C10    One or more computer-readable media having stored thereon encoded data produced by the method of any one of claims C1 to C7.

C11    In a computer system, a method comprising:
receiving encoded data for at least part of a bitstream, wherein a header in the at least part of the bitstream includes a syntax element that indicates a selection of a static probability model, for the encoded data for the at least part of the bitstream, from among multiple available static probability models; and
decoding the encoded data using a range asymmetric number system ("RANS") decoder, thereby generating output symbols, including:
reading the syntax element;
selecting one of the multiple available static probability models based at least in part on the syntax element;
configuring the RANS decoder to perform RANS decoding using the selected static probability model; and
performing RANS decoding of the encoded data using the selected static probability model.

C12    The method of claim C11, wherein the syntax element is an n-bit value, which indicates one of $2^n$ static probability models.

C13    The method of claim C11, wherein the output symbols are for residual data for media, and wherein the multiple available static probability models include static probability models for which residual data values are successively more likely to be zero.

C14    The method of claim C11, wherein the decoding the encoded data using the RANS decoder includes:
as part of a first phase, selectively updating state of the RANS decoder using probability information for an output symbol from a previous iteration;
as part of a second phase, selectively merging a portion of encoded data, for at least part of a bitstream, from an input buffer into the state of the RANS decoder; and
as part of the second phase, selectively generating an output symbol for a current iteration using the state of the RANS decoder.

C15    The method of claim C11, wherein the header is for one of multiple fragments, each of the multiple fragments including its own header having a syntax element that indicates a selection of a static probability model, for encoded data for that fragment, from among the multiple available static probability models, and wherein the decoding using the RANS decoder is performed on a fragment-by-fragment basis.

| | |
|---|---|
| C16 | The method of claim C11, wherein the multiple available static probability models are represented in values of pre-defined lookup tables with probability information for the multiple available static probability models, respectively. |
| C17 | The method of claim C11, wherein the header further includes:<br>a syntax element that indicates whether or not state of the RANS decoder is to be flushed and re-initialized for decoding of the encoded data for the at least part of the bitstream; and/or<br>a syntax element that indicates an adjustment to symbol width for the encoded data for the at least part of the bitstream. |
| C18 | A computer system comprising an encoded data buffer and a range asymmetric number system ("RANS") decoder, the computer system being configured to perform the method of any one of claims C11 to C17. |
| C19 | One or more computer-readable media having stored thereon computer-executable instructions for causing one or more processors, when programmed thereby, to perform the method of any one of claims C11 to C17. |
| C20 | One or more computer-readable media having stored thereon encoded data organized for decoding according to the method of any one of claims C11 to C17. |

RANS Encoder/Decoder with Selective Narrowing of Symbol Width for Fragments

| | |
|---|---|
| D1 | In a computer system, a method comprising:<br>encoding input symbols using a range asymmetric number system ("RANS") encoder, thereby generating encoded data for at least part of a bitstream, including:<br>determining an adjustment to symbol width for the encoded data for the at least part of the bitstream;<br>setting a syntax element that indicates the adjustment to symbol width;<br>configuring the RANS encoder to perform RANS encoding at the adjusted symbol width; and<br>performing the RANS encoding at the adjusted symbol width; and<br>outputting the encoded data for the at least part of the bitstream, wherein a header in the at least part of the bitstream includes the syntax element that indicates the adjustment to symbol width for the encoded data for the at least part of the bitstream. |
| D2 | The method of claim D1, wherein the syntax element is an n-bit value, which indicates a decrease by an amount in the range of 0 to $2^n-1$ bits from the symbol width. |
| D3 | The method of claim D2, wherein the symbol width is set for the bitstream, and wherein the adjustment applies for one of multiple fragments of the bitstream, thereby narrowing effective symbol width for that fragment for the RANS encoder and a corresponding RANS decoder. |
| D4 | The method of claim D1, wherein the header is for one of multiple fragments, each of the multiple fragments including its own header having a syntax element that indicates an adjustment to symbol width for the encoded data for that fragment, and wherein the encoding using the RANS encoder is performed on a fragment-by-fragment basis. |
| D5 | The method of claim D1, wherein the encoding includes:<br>identifying a highest value among the input symbols;<br>depending on the highest value among the input symbols, determining the adjustment to symbol width. |
| D6 | The method of claim D1, wherein the configuring the RANS encoder includes selecting a set of pre-defined lookup tables having probability information for the adjusted symbol width. |
| D7 | The method of claim D1, wherein the header further includes:<br>a syntax element that indicates whether or not state of a RANS decoder is to be flushed and re-initialized for decoding of the encoded data for the at least part of the bitstream; and/or<br>a syntax element that indicates a selection of a static probability model, for the encoded data for the at least part of the bitstream, from among multiple available static probability models. |
| D8 | A computer system comprising a range asymmetric number system ("RANS") encoder and an encoded data buffer, the computer system being configured to perform the method of any one of claims D1 to D7. |
| D9 | One or more computer-readable media having stored thereon computer-executable instructions for causing one or more processors, when programmed thereby, to perform the method of any one of claims D1 to D7. |
| D10 | One or more computer-readable media having stored thereon encoded data produced by the method of any one of claims D1 to D7. |
| D11 | In a computer system, a method comprising:<br>receiving encoded data for at least part of a bitstream, wherein a header in the at least part of the bitstream includes a syntax element that indicates an adjustment to symbol width for the encoded data for the at least part of the bitstream; and<br>decoding the encoded data using a range asymmetric number system ("RANS") decoder, thereby generating output symbols, including:<br>reading the syntax element;<br>based at least in part on the syntax element, determining the adjustment to symbol width;<br>configuring the RANS decoder to perform RANS decoding at the adjusted symbol width; and<br>performing the RANS decoding at the adjusted symbol width. |
| D12 | The method of claim D11, wherein the syntax element is an n-bit value, which indicates a decrease by an amount in the range of 0 to $2^n-1$ bits from the symbol width. |

| | |
|---|---|
| D13 | The method of claim D12, wherein the symbol width is set for the bitstream, and wherein the adjustment applies for one of multiple fragments of the bitstream, thereby narrowing effective symbol width for that fragment for the RANS decoder. |
| D14 | The method of claim D11, wherein the header is for one of multiple fragments, each of the multiple fragments including its own header having a syntax element that indicates an adjustment to symbol width for the encoded data for that fragment, and wherein the decoding using the RANS decoder is performed on a fragment-by-fragment basis. |
| D15 | The method of claim D11, wherein the decoding the encoded data using the RANS decoder includes:<br>as part of a first phase, selectively updating state of the RANS decoder using probability information for an output symbol from a previous iteration;<br>as part of a second phase, selectively merging a portion of encoded data, for at least part of a bitstream, from an input buffer into the state of the RANS decoder; and<br>as part of the second phase, selectively generating an output symbol for a current iteration using the state of the RANS decoder. |
| D16 | The method of claim D11, wherein the configuring the RANS decoder includes selecting a set of pre-defined lookup tables having probability information for the adjusted symbol width. |
| D17 | The method of claim D11, wherein the header further includes:<br>a syntax element that indicates whether or not state of the RANS decoder is to be flushed and re-initialized for decoding of the encoded data for the at least part of the bitstream; and/or<br>a syntax element that indicates a selection of a static probability model, for the encoded data for the at least part of the bitstream, from among multiple available static probability models. |
| D18 | A computer system comprising an encoded data buffer and a range asymmetric number system ("RANS") decoder, the computer system being configured to perform the method of any one of claims D11 to D17. |
| D19 | One or more computer-readable media having stored thereon computer-executable instructions for causing one or more processors, when programmed thereby, to perform the method of any one of claims D11 to D17. |
| D20 | One or more computer-readable media having stored thereon encoded data organized for decoding according to the method of any one of claims D11 to D17. |

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A computer system comprising:
an encoded data buffer configured to store encoded data from a bitstream; and
a range asymmetric number system ("RANS") decoder configured to perform operations using a two-phase structure for RANS decoding operations, the operations comprising:
during a first phase of the two-phase structure, selectively updating, depending on a determination of whether or not an output symbol from a previous iteration was generated, state of the RANS decoder using probability information for the output symbol from the previous iteration, the state of the RANS decoder being tracked using a value;
during a second phase of the two-phase structure, selectively merging a portion of the encoded data from an input buffer into the state of the RANS decoder; and
during the second phase of the two-phase structure, selectively generating, depending on a determination of whether or not the state of the RANS decoder includes sufficient information to generate an output symbol for a current iteration, the output symbol for the current iteration using the state of the RANS decoder, the state of the RANS decoder including sufficient information to generate the output symbol for the current iteration if the state of the RANS decoder is greater than a threshold.

2. The computer system of claim 1, wherein the encoded data is in a fragment of the bitstream, wherein the operations further comprise initializing the RANS decoder, and wherein the initializing the RANS decoder includes:
reading one or more syntax elements from a header in the fragment of the bitstream; and
configuring the RANS decoder using the one or more syntax elements.

3. The computer system of claim 2, wherein the initializing the RANS decoder further includes:
retrieving initial state information; and
loading an initial state, as the state of the RANS decoder, using the initial state information.

4. The computer system of claim 2, wherein the one or more syntax elements include:
a syntax element that indicates whether or not the state of the RANS decoder is to be flushed and re-initialized for decoding of the encoded data;
a syntax element that indicates an adjustment to symbol width for the encoded data; and/or
a syntax element that indicates a selection of a static probability model, for the encoded data, from among multiple available static probability models.

5. The computer system of claim 1, wherein the output symbols are for residual data for media, wherein the first phase and the second phase are logical phases, wherein the first phase and the second phase are performed in different clock cycles or in the same clock cycle, and wherein the output symbols are from a single data stream or multiple different data streams.

6. The computer system of claim 1, wherein the selectively updating the state of the RANS decoder includes:
determining whether the output symbol from the previous iteration was generated;

if so:
   determining the probability information for the output symbol from the previous iteration; and
   adjusting the state of the RANS decoder using the probability information, thereby consuming at least some of the state of the RANS decoder; and
otherwise, skipping the adjusting the state of the RANS decoder.

7. The computer system of claim 6, wherein the determining the probability information for the output symbol from the previous iteration includes performing one or more lookup operations in one or more lookup tables.

8. The computer system of claim 6, wherein the probability information includes a sub-range size fwd_f for the output symbol from the previous iteration and a cumulative sub-range threshold fwd_cf for the output symbol from the previous iteration, and wherein the adjusting the state of the RANS decoder includes performing adjustments mathematically equivalent to:

$$x = \text{fwd\_f} \times x[\text{upper}] + x[\text{lower}] - \text{fwd\_cf},$$

wherein x represents the state of the RANS decoder after the adjusting, x[upper] represents an upper portion of the state of the RANS decoder before the adjusting, and x[lower] represents a lower portion of the state of the RANS decoder before the adjusting.

9. The computer system of claim 1, wherein the selectively merging the portion of the encoded data includes:
   determining whether the state of the RANS decoder satisfies the threshold;
   if so, combining the portion of the encoded data and the state of the RANS decoder; and
   otherwise, skipping the combining the portion of the encoded data and the state of the RANS decoder.

10. The computer system of claim 9, wherein the combining the portion of the encoded data and the state of the RANS decoder includes:
   shifting the state of the RANS decoder by a given number of bits; and
   adding the portion of the encoded data, which has the given number of bits.

11. The computer system of claim 9, wherein the determining whether the state of the RANS decoder satisfies the threshold include comparing the state of the RANS decoder to the threshold, and wherein the state of the RANS decoder satisfies the threshold if the state of the RANS decoder is less than the threshold.

12. The computer system of claim 1, wherein the input buffer is configured to store one byte of the encoded data at a time, wherein the portion of the encoded data from the input buffer is one byte, and wherein the value that tracks the state of the RANS decoder is a 32-bit value.

13. The computer system of claim 1, wherein the probability information used to selectively update the state of the RANS decoder is forward probability information, and wherein the selectively generating the output symbol for the current iteration includes:
   determining whether the state of the RANS decoder includes sufficient information to generate the output symbol for the current iteration;
   if so, determining inverse probability information and finding the output symbol for the current iteration using the inverse probability information and the state of the RANS decoder; and
   otherwise, skipping the finding the output symbol for the current iteration.

14. The computer system of claim 13, wherein the determining the inverse probability information includes performing one or more lookup operations in one or more lookup tables, and wherein the selectively generating the output symbol for the current iteration further depends on a count of output symbols remaining to be generated being greater than zero.

15. The computer system of claim 13, wherein the finding the output symbol for the current iteration includes determining a sub-range of the state of the RANS decoder that is associated with the output symbol for the current iteration.

16. The computer system of claim 1, wherein the operations further comprise repeating the selectively updating, the selectively merging, and the selectively generating in successive iterations, until there are no more output symbols to decode in the encoded data.

17. The computer system of claim 1, wherein the RANS decoder is implemented with special-purpose hardware including:
   the input buffer;
   an output buffer configured to store the output symbol from the previous iteration, if any, until replacement with the output symbol for the current iteration, if any;
   a state register configured to store the value that tracks the state of the RANS decoder;
   logic, coupled to the output buffer and to the state register, configured to perform the selectively updating;
   logic, coupled to the state register and the input buffer, configured to perform the selectively merging; and
   logic, coupled to the state register and the output buffer, configured to perform the selectively generating.

18. The computer system of claim 1, wherein the operations further include, during the first phase:
   selectively re-filling the input buffer from the encoded data buffer; and/or
   selectively writing the output symbol from the previous iteration to a symbol vector buffer.

19. In a computer system, a method comprising:
   receiving encoded data from a bitstream;
   decoding the encoded data using a range asymmetric number system ("RANS") decoder, including:
      during a first phase of a two-phase structure for RANS decoding operations, selectively updating, depending on a determination of whether or not an output symbol from a previous iteration was generated, state of the RANS decoder using probability information for the output symbol from the previous iteration, the state of the RANS decoder being tracked using a value;
      during a second phase of the two-phase structure, selectively merging a portion of the encoded data from an input buffer into the state of the RANS decoder; and
      during the second phase of the two-phase structure, selectively generating, depending on a determination of whether or not the state of the RANS decoder includes sufficient information to generate an output symbol for a current iteration, the output symbol for the current iteration using the state of the RANS decoder, the state of the RANS decoder including sufficient information to generate the output symbol for the current iteration if the state of the RANS decoder is greater than a threshold.

20. One or more computer-readable media storing computer-executable instructions for causing one or more processors, when programmed thereby, to cause a range asymmetric number system ("RANS") decoder to perform operations, the operations comprising:

during a first phase of a two-phase structure for RANS decoding operations, selectively updating, depending on a determination of whether or not an output symbol from a previous iteration was generated, state of the RANS decoder using probability information for the output symbol from the previous iteration, the state of the RANS decoder being tracked using a value;

during a second phase of the two-phase structure, selectively merging a portion of encoded data from an input buffer into the state of the RANS decoder; and during the second phase of the two-phase structure, selectively generating, depending on a determination of whether or not the state of the RANS decoder includes sufficient information to generate an output symbol for a current iteration, the output symbol for the current iteration using the state of the RANS decoder, the state of the RANS decoder including sufficient information to generate the output symbol for the current iteration if the state of the RANS decoder is greater than a threshold.

21. The one or more computer-readable media of claim 20, wherein the encoded data is in a fragment of a bitstream, wherein the operations further comprise initializing the RANS decoder, and wherein the initializing the RANS decoder includes:

reading one or more syntax elements from a header in the fragment of the bitstream; and configuring the RANS decoder using the one or more syntax elements.

22. The one or more computer-readable media of claim 20, wherein the selectively updating the state of the RANS decoder includes:

determining whether the output symbol from the previous iteration was generated;

if so:
determining the probability information for the output symbol from the previous iteration; and
adjusting the state of the RANS decoder using the probability information, thereby consuming at least some of the state of the RANS decoder; and otherwise, skipping the adjusting the state of the RANS decoder.

23. The one or more computer-readable media of claim 20, wherein the selectively merging the portion of the encoded data includes:

determining whether the state of the RANS decoder satisfies the threshold;

if so, combining the portion of the encoded data and the state of the RANS decoder; and otherwise, skipping the combining the portion of the encoded data and the state of the RANS decoder.

24. The one or more computer-readable media of claim 20, wherein the probability information used to selectively update the state of the RANS decoder is forward probability information, and wherein the selectively generating the output symbol for the current iteration includes:

determining whether the state of the RANS decoder includes sufficient information to generate the output symbol for the current iteration;

if so, determining inverse probability information and finding the output symbol for the current iteration using the inverse probability information and the state of the RANS decoder; and otherwise, skipping the finding the output symbol for the current iteration.

25. The method of claim 19, further comprising initializing the RANS decoder, wherein the encoded data is in a fragment of the bitstream, and wherein the initializing the RANS decoder includes:

reading one or more syntax elements from a header in the fragment of the bitstream; and configuring the RANS decoder using the one or more syntax elements.

26. The method of claim 19, wherein the selectively updating the state of the RANS decoder includes:

determining whether the output symbol from the previous iteration was generated;

if so:
determining the probability information for the output symbol from the previous iteration; and
adjusting the state of the RANS decoder using the probability information, thereby consuming at least some of the state of the RANS decoder; and otherwise, skipping the adjusting the state of the RANS decoder.

27. The method of claim 19, wherein the selectively merging the portion of the encoded data includes:

determining whether the state of the RANS decoder satisfies the threshold;

if so, combining the portion of the encoded data and the state of the RANS decoder; and otherwise, skipping the combining the portion of the encoded data and the state of the RANS decoder.

28. The method of claim 19, wherein the probability information used to selectively update the state of the RANS decoder is forward probability information, and wherein the selectively generating the output symbol for the current iteration includes:

determining whether the state of the RANS decoder includes sufficient information to generate the output symbol for the current iteration;

if so, determining inverse probability information and finding the output symbol for the current iteration using the inverse probability information and the state of the RANS decoder; and otherwise, skipping the finding the output symbol for the current iteration.

* * * * *